United States Patent
Noda et al.

(10) Patent No.: US 6,414,530 B2
(45) Date of Patent: Jul. 2, 2002

(54) SEMICONDUCTOR INTEGRATED CIRCUIT DEVICE, SEMICONDUCTOR MEMORY SYSTEM AND CLOCK SYNCHRONOUS CIRCUIT

(75) Inventors: Hiromasa Noda, Tokyo; Masakazu Aoki, Tokorozawa; Hitoshi Tanaka, Ohme; Hideyuki Aoki, Takasaki, all of (JP)

(73) Assignees: Hitachi, Ltd., Tokyo; Hitachi ULSI Systems Co., Ltd., Kodaira, both of (JP)

(*) Notice: Subject to any disclaimer, the term of this patent is extended or adjusted under 35 U.S.C. 154(b) by 0 days.

(21) Appl. No.: 09/832,019

(22) Filed: Apr. 11, 2001

Related U.S. Application Data

(62) Division of application No. 09/109,181, filed on Jul. 2, 1998, now Pat. No. 6,222,406.

(30) Foreign Application Priority Data

Jul. 4, 1997 (JP) ............................................. 9-194849

(51) Int. Cl.[7] .............................................. H03K 11/26
(52) U.S. Cl. ...................................... 327/269; 327/270
(58) Field of Search ................................ 327/293, 295, 327/269, 270, 271, 272, 144, 152, 153, 161

(56) References Cited

U.S. PATENT DOCUMENTS

| | | | |
|---|---|---|---|
| 4,689,503 A | 8/1987 | Suzuki et al. | 326/103 |
| 4,719,365 A | 1/1988 | Misono | 327/270 |
| 4,985,639 A | 1/1991 | Renfrow et al. | 327/16 |
| 5,278,522 A | 1/1994 | Atriss et al. | 331/57 |
| 5,475,690 A | 12/1995 | Burns et al. | 370/105.3 |
| 5,959,480 A | 9/1999 | Shoji | 327/161 |
| 5,966,037 A | 10/1999 | Truong et al. | 327/239 |
| 5,986,949 A | * 11/1999 | Toda | 365/194 |
| 6,054,884 A | * 4/2000 | Lye | 327/269 |

FOREIGN PATENT DOCUMENTS

JP  8-237091  9/1996

* cited by examiner

Primary Examiner—Tuan T. Lam
(74) Attorney, Agent, or Firm—Antonelli, Terry, Stout & Kraus, LLP

(57) ABSTRACT

A lattice-like delay circuit is configured wherein a plurality of logic gate circuits which are respectively provided with impedance elements for respectively coupling two input signals inputted to first and second input terminals and respectively form output signals obtained by inverting the input signals inputted to the first and second signals, are used so as to be disposed in lattice form in a first signal transfer direction and a second signal transfer direction. Input clock signals are successively delayed in the first signal transfer direction and thereafter inputted to the respective logic gate circuits extending from the first to the last as seen in the first signal transfer direction. Output signals are obtained from output terminals of logic gate circuits placed in at least a plural-numbered stage as seen in the second signal transfer direction and arranged in the first signal transfer direction.

16 Claims, 35 Drawing Sheets

SEMICONDUCTOR INTEGRATED CIRCUIT DEVICE, SEMICONDUCTOR MEMORY SYSTEM AND CLOCK SYNCHRONOUS CIRCUIT

CROSS-REFERENCE TO RELATED APPLICATION

This application is a divisional of application Ser. No. 09/109,181, filed on Jul. 2, 1998, now U.S. Pat. No. 6,222, 406, the entire disclosure of which is hereby incorporated by reference.

BACKGROUND OF THE INVENTION

The present invention relates to a semiconductor integrated circuit device and a semiconductor memory system, and particularly to a technique effective for use in devices which need minute or micro and highly-accurately controlled delay signals. This invention also relates to a clock synchronous circuit having quick response and high accuracy and a technique effective for use in a semiconductor integrated circuit device such as a synchronous DRAM (Dynamic Random Access Memory) equipped with the clock synchronous circuit.

The following array oscillator disclosed by ISSCC has been known as an example of a circuit for obtaining a time resolution of a few 10 psec (picoseconds). This type of array oscillator is known as one wherein the same ring oscillators are arranged in large numbers in a column direction and connected in ring form using one inputs with each individual stages as two inputs, and the outputs of the respective stages are respectively supplied to other inputs of adjoining stages, and they are also connected in ring form even in a row direction. Such an oscillator has been described in ISSCC 93/ANALOG TECHNIQUES/PAPER TA7.5, pp. 118–119, 1993 and ISSCC/SESSION 18/MEMORIES WITH SPECIAL ARCHITECTURES/PAPER FP18.5, pp308–309, 1995, and Japanese Published Unexamined Patent Application No. Hei 8-78951.

A clock synchronous circuit excluding a feedback loop like a synchronous mirror delay (SMD) is characterized in that the time (lock time) necessary for synchronization is short as is the case of 2 to 3 cycles. According to this feature, the lock time can be shortened by measuring the cycle of an input clock as the number of stages of delay circuits or coarse delays. The time resolution of this measuring circuit is determined depending on a delay time per stage corresponding to a component of each delay circuit. The time resolution is normally on the order of a delay time corresponding to two stages of CMOS inverters Japanese Published Unexamined Patent Application No. Hei 8-237091 is known as an example of a clock synchronous circuit using such an SMD.

SUMMARY OF THE INVENTION

In order to speed up a semiconductor memory such as a dynamic RAM (Random Access Memory) or the like, memory access times as seen from a memory controller for generally controlling plural RAMs are made uniform by making uniform signal transfer delays on a substrate mounted between such RAMs and the memory controller, in other words, in anticipation of the signal propagation delays on the mounted substrate, increasing delay times thereinside when such signal delays are small and decreasing delays thereinside when such signal delays are large, whereby it is possible to easily ensure the time (window) required to allow data capturing occupied in a cycle time and speed up a memory cycle time If semiconductor memories are implemented on a mounting substrate having signal wires or interconnections whose each characteristic impedance is 50Ω, at 1 centimeter (cm) intervals, a signal propagation delay time encountered between each individual semiconductor memories becomes about 50 psec. It is therefore necessary to provide delay circuits each having a high-precision time resolution of a few 10 psec inside the respective semiconductor memories with a view toward making uniform the signal transfer delays between the memory controller and the respective semiconductor memories as described above.

The inventors or the like of the present application have discussed the utilization of the above-described array oscillator to implement the delay circuits each having the above-mentioned high-precision time resolution In the array oscillator, however, delay signals having delays equal to each other by the number of respective stages are to be formed for the number of logic stages lying in a row direction. However, in a circuit formed on an actually-available semiconductor substrate, each signal delay encountered in the row direction will not be recognized to have satisfactory linearity, and the signal delay will become fast in one logic stage or slow in another logic stage. Thus, it has been found that even if the principle of the above-described array oscillator is used as it is, the above-mentioned micro and uniform signal delay like a few 10 psec cannot be obtained.

It has been recognized by the inventors that a problem arises in that if it is assumed that minute and uniform signal delays are obtained and logic circuits are disposed on a semiconductor substrate in lattice form along row and column directions, then signal paths for taking out output signals cannot be provided evenly in the cases: where delay signals are respectively outputted from logic circuits disposed inside the lattice form and where delay signals are respectively outputted from logic circuits disposed outside the lattice form.

Since the array oscillator is made up of ring oscillators, a start-up time between its deactivated state and stabilization of its operation is relatively long. It has been thus evident from the discussions of the present inventors that a problem arises in that the formation of a desired signal at high speed falls into difficulties.

A first object of this invention is to provide a semiconductor integrated circuit device provided with a circuit for forming signals each having minute and high-accuracy time resolution. A second object of this invention is to provide a semiconductor integrated circuit device having a delay circuit disposed on a semiconductor substrate with efficiency and capable of forming delay signals each having micro and high-accuracy time resolution. A third object of this invention is to provide a semiconductor memory system capable of implementing the input and output of data at high speed.

A fourth object of this invention is to provide a semiconductor integrated circuit device provided with a circuit for forming signals each having small and high-accuracy time resolution at high speed.

A summary of a typical one of the inventions disclosed according to the first through fourth objects of the inventions of the present application will be described in brief as follows:

There is provided a semiconductor integrated circuit device comprising:

at least one delay circuit including,
M signal lines for receiving a first input signal to successively-delayed M (M=2, 3, 4, . . . )th input signals therein; and M logic gate circuit groups extending from a first logic gate circuit group corresponding to the first input signal to an Mth logic gate circuit group corresponding to the Mth input signal, and wherein each individual logic gate circuit groups have N logic gate circuits extending from a first logic gate circuit to an N (N=3, 4, 5, . . . )th logic gate circuit, each logic gate circuit having a first input terminal, a second input terminal and an output terminal, coupling elements are provided between the first and second input terminals of the logic gate circuits respectively, the first to Nth logic gate circuits in each logic gate circuit group are tandem-connected to the output terminals through the first input terminals respectively, the M signal lines are connected to the first input terminals of the first logic gate circuits in their corresponding logic gate circuit groups, first input terminals of L (L=1, 2, 3, . . . )th logic gate circuits in each of the first logic gate circuit group to M−1th logic gate circuit group are connected to second input terminals of Lth logic gate circuits in the next logic gate circuit group, first input terminals of predetermined logic gate circuits in the Mth logic gate circuit group are connected to second input terminals of predetermined logic gate circuits in the first logic gate circuit group, and successively-delayed output signals are respectively obtained from the output terminals of a plurality of the Nth logic gate circuits A summary of another typical one of the inventions disclosed in association with the first to fourth objects of the inventions of the present application will be described in brief as follows:

There is provided a semiconductor integrated circuit device comprising:

at least one delay circuit including,
a plurality of logic gate circuits which are respectively provided with impedance elements for respectively coupling two input signals inputted to first and second input terminals, each impedance element being provided between the first and second input terminals, and respectively form output signals according to the input signals supplied to the first and second input terminals,
the plurality of logic gate circuits being capable of being disposed in lattice form in a first signal transfer direction and a second signal transfer direction, and wherein the first input terminal of a logic gate circuit KL provided as a Kth other than the first as seen in the first signal transfer direction and disposed in an Lth stage as seen in the second signal transfer direction is supplied with a signal outputted from a logic gate circuit provided as the same Kth as seen in the first signal transfer direction and defined as an L−1th stage as seen in the second signal transfer direction or an input clock signal in the case of the first-stage logic gate circuit, and the second input terminal of the logic gate circuit KL is supplied with an input signal supplied to a first input terminal of a logic gate circuit provided as the immediately preceding K−1th as seen in the first signal transfer direction and defined as the same Lth stage as seen in the second signal transfer direction;

a second input terminal of a logic gate circuit provided as the first as seen in the first signal transfer direction and defined as an Lth as seen in the second signal transfer direction is supplied with an input signal supplied to a first input terminal of a logic gate circuit defined as the final stage as seen in the first signal transfer direction, the input signal being in phase with an input signal supplied to a first input terminal of a logic gate circuit at a stage preceding the final stage as seen in the second signal transfer direction;

the first and second input terminals of the logic gate circuits defined as the first stage as seen in the second signal transfer direction and provided as the first as seen in the first signal transfer direction are respectively supplied with a clock signal through a corresponding input circuit constituting a buffer, and the input clock signals supplied to the first input terminals of the respective logic gate circuits extending from the second to the last as seen in the first signal transfer direction are delayed in order in the first signal transfer direction by the corresponding input circuit constituting the buffer; and output signals are respectively obtained from output terminals of a plurality of logic gate circuits placed in at least a plural-numbered stage as seen in the second signal transfer direction and arranged in the first signal transfer direction.

A summary of a further typical one of the inventions disclosed in association with the first to fourth objects of the inventions of the present application will be described in brief as follows:

There is provided a semiconductor integrated circuit-device comprising:

a first circuit including a plurality of unit circuits for respectively forming a first input clock signal to successively-delayed M (M=2, 3, 4, . . . )th input clock signals in response to a reference clock signal, the first circuit forming the first to Mth input clock signals within one cycle of the reference clock signal in association with successively different characteristics of circuit elements respectively included in the plurality of unit circuits; and a second circuit for receiving the first to Mth input clock signals therein and obtaining a plurality of output clock signals successively delayed with delay amounts uniform than respective delay amounts of the first to Mth input clock signals;

wherein the second circuit is a delay circuit having a plurality of logic gate circuits corresponding to M rows and N columns (where N=3, 4, . . . ) and wired so that signals are transmitted in row and column directions of the plurality of logic gate circuits.

A fifth object of this invention is to provide a high-accuracy and quick-response clock synchronous circuit and a semiconductor integrated circuit device using the clock synchronous circuit. A sixth object of this invention is to provide a clock synchronous circuit capable of implementing on-standby less power consumption and high-speed reset with high accuracy and a semiconductor integrated circuit device using the clock synchronous circuit. A seventh object of this invention is to provide a clock synchronous circuit capable of realizing fast response with high accuracy without an increase in circuit scale and a semiconductor integrated circuit device using the clock synchronous circuit. Other objects of this invention or the above and other objects and novel features of this invention will become apparent from the following description of the present specification and the accompanying drawings.

A summary of a typical one of the inventions disclosed in correspondence with the fifth through seventh objects of the inventions of the present application will be described in brief as follows:

A lattice-like delay circuit is configured wherein a first delay circuit or coarse delay for propagating a clock pulse with relatively low time resolution, a first edge detector and a first multiplexer are used to form or create a clock signal delayed by one clock in association with the relatively low time resolution, a second coarse delay having relatively high time resolution, a second edge detector and a second multiplexer are used to correct an error of the first coarse delay, included in the above signal, and a plurality of logic gate means each of which is provided with impedance means for making coupling between two input signals inputted between first and second input terminals as a second delay circuit having high time resolution as the above second coarse delay and each of which produces an output signal obtained by inverting the input signals, are used so as to be placed in lattice form in first and second signal transfer directions. The lattice-like delay circuit is used wherein the respective logic gate means extending from the first to the last as seen in the first signal transfer direction are respectively successively supplied with input clock signals with their delays as seen in the first signal transfer direction, and output signals are obtained from output terminals of the plurality of logic gate means placed in at least the final stage or the immediately preceding stage as seen in the second signal transfer direction and arranged in the first signal transfer direction. The lattice-like delay circuit referred to above is installed in a semiconductor integrated circuit device such as a synchronous DRAM or the like.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

Preferred embodiments of the present invention will hereinafter be described in detail with reference to the accompanying drawings.

Figure 1:
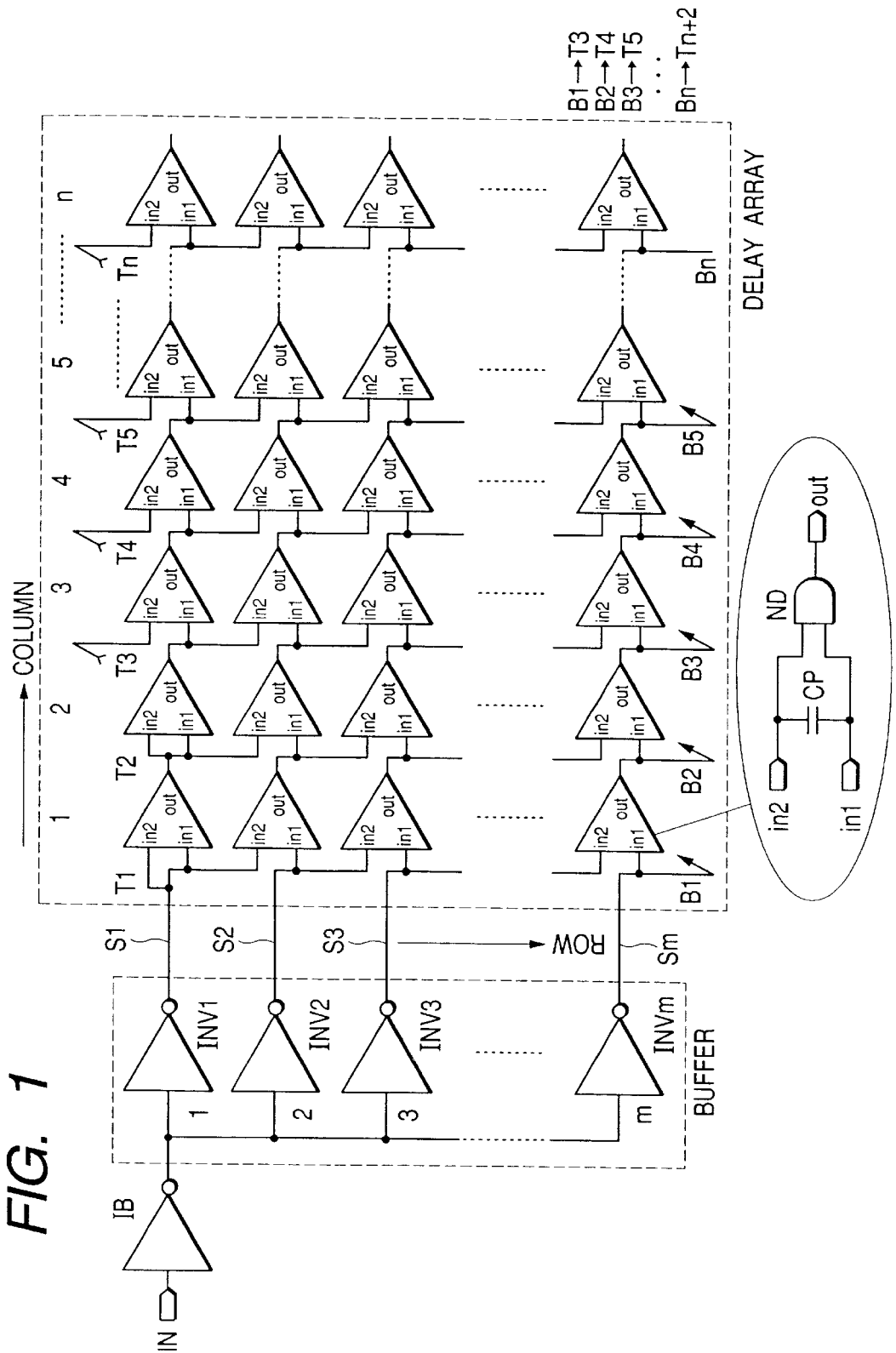
FIG. 1 is a circuit diagram showing one embodiment of a lattice-like delay circuit according to the present invention.

FIG. 1 is a circuit diagram showing one embodiment of a grid- or lattice-like delay circuit according to the present invention. Respective circuit elements in the same drawing are formed on a single semiconductor substrate like monocrystal silicon together with circuit elements constructive of a dynamic RAM or the like requiring the same by the known semiconductor integrated circuit manufacturing technology.

One of logic gate means used as delay elements arranged in grid or lattice form comprises a NAND gate or NAND gate circuit ND and a coupling capacitor CP provided between two inputs in1 and in2 of the NAND gate ND as typically shown as an illustrative example. Although the capacitance value of the coupling capacitor CP is not limited in particular, the coupling capacitor CP is a capacitance element having a relative large capacitance value of about 1 pF as for a semiconductor integrated circuit.

The logic gate means used as the delay elements are arranged in lattice form so as to take m stages in a Row direction corresponding to a first signal transfer direction and n stages in a Column direction corresponding to a second signal transfer direction. A description will be made of a first row in the first signal transfer direction. Of the logic gate means comprised of n stages, which have been arranged in the column direction corresponding to the second signal transfer direction, two input terminals in1 and in2 of the logic gate means corresponding to the first stage are used in common and supplied with a signal outputted from an inverter INV1 of a buffer. A signal outputted from the first stage is supplied to first and second input terminals in1 and in2 of the second stage, which are commonly used in the same manner as described above. A signal outputted from the second stage is supplied to a first input terminal in1 of the third stage. Signals outputted from the pre-stages are respectively supplied to first input terminals in1 of the fourth to nth stages subsequently in the same manner as described above.

A description will be made of a second row lying in the first signal transfer direction. Of the logic gate means comprised of n stages arranged in the column direction corresponding to the second signal transfer direction, a first input terminal in1 of the logic gate means corresponding to a first stage is supplied with a signal outputted from an inverter INV2 of the buffer and a first input terminal in1 of a second stage is supplied with a signal outputted from the first stage. A signal outputted from the second stage is supplied to a first input terminal in1 of a third stage. Subsequently, signals outputted from pre-stages are supplied to first input terminals in1 of a fourth to nth stages respectively. Second input terminals in2 of the respective logic gate means of the first to nth stages are respectively supplied with the signals to be input to the first input terminals in1 of the respective logic gate means of the first stage corresponding to the immediately preceding first as seen in the first signal transfer direction to the nth stage.

Even respective mth rows corresponding to a third to a final stages in the first signal transfer direction are treated in a manner similar to the above second. Namely, first input terminals in1 of first-stage logic gate means of the logic gate means comprised of n stages arranged in the column direction corresponding to the second signal transfer direction are respectively supplied with signals outputted from inverters INV3 through INVm of the buffer. In the mth rows corresponding to the third to final stages, a signal outputted from the first stage is supplied to a first input terminal in1 of a second stage and a signal outputted from the second stage is supplied to a first input terminal in1 of a third stage. Subsequently, signals outputted from pre-stages are respectively supplied to first input terminals min of the fourth to nth stages in the same manner as described above. Second input terminals in2 of the respective logic gate means corresponding to the first to nth stages are respectively supplied with the signals to be input to the first input terminals in1 of the respective logic gate means of the first to nth stages corresponding to the immediately preceding second to m−1th as seen in the first signal transfer direction.

Second input terminals in2 of the logic gate means of the third to nth stages, of the n logic gate means set or defined as the first as seen in the first signal transfer direction and arranged in the second signal transfer direction are supplied with in-phase input signals of those supplied to the first input terminals of the logic gate means of the first to nth stages at the mth corresponding to the final stage as seen in the first signal transfer direction. For example, an input signal B1 supplied to the first input terminal of the logic gate means corresponding to the mth as seen in the first signal transfer direction and defined as the first stage as seen in the second signal transfer direction is defined as an input signal T3 supplied to the second input terminal in2 of the logic gate means defined as the first as seen in the first signal transfer direction and defined as the third stage as seen in the second signal transfer direction. Subsequently, an input signal B2 and an input signal B3 are respectively supplied as an input signal T4 and an input signal T5 in the same manner as described above.

If the nth stage as seen in the second signal transfer direction is supposed to be the final stage, then an input signal Bn−2 lying in the final stage m as seen in the first signal transfer direction and lying in an n−2th as seen in the second signal transfer direction is defined as an input signal Tn supplied to the input terminal in2 of the nth-stage logic gate means corresponding to the first as seen in the first signal transfer direction and corresponding to the final stage as seen in the second signal transfer direction.

This will be generally described as follows: The first input terminal of each logic gate means (K, L) provided as a Kth other than the first as seen in the first signal transfer direction and disposed in an Lth stage as seen in the second signal transfer direction is supplied with a signal outputted from a logic gate means provided as the same Kth as seen in the first signal transfer direction and defined as an L−1th stage as seen in the second signal transfer direction or an input clock signal in the case of the first-stage logic gate means. The second input terminal of the logic gate means (K, L) is supplied with an input signal supplied to a first input terminal of a logic gate means provided as the immediately preceding K−1th as seen in the first signal transfer direction and defined as the same Lth stage as seen in the second transfer direction.

A second input terminal of a logic gate means provided as the first as seen in the first signal transfer direction and defined as an Lth as seen in the second signal transfer direction is supplied with an input signal supplied to a first input terminal of a logic gate means lying in the final stage as seen in the first signal transfer direction, the input signal being in phase with an input signal supplied to a first input terminal of a logic gate means at a stage preceding the final stage as seen in the second signal transfer direction.

The first and second input terminals of the logic gate means defined as the first stage as seen in the second signal transfer direction and provided as the first as seen in the first signal transfer direction are respectively supplied with a clock signal through the corresponding input circuit constituting the buffer. The input clock signals supplied to the first input terminals of the respective logic gate means extending from the second to the last as seen in the first signal transfer direction are delayed in order in the first signal transfer direction by their corresponding input circuits constituting the buffer.

The buffer constitutes an input clock signal delay correcting part. The inverters INV1 through INVm thereof successively delay their output signals. In order to form or produce m clock delayed or delay signals S1 through Sm whose phases are shifted by small amounts each other from one clock input as compared with a clock cycle, for example, inverters INV1 through INVm using MOSFETs whose gate widths become an arithmetic progression, are used. Namely, the input terminals of the inverters INV1 through INVm of the buffer are commonly supplied with an output signal of an input circuit IB for receiving a clock signal supplied from an external terminal although they are not restricted in particular. However, signals successively delayed in correspondence to the first signal transfer direction are created as in the case in which the output signal S2 of the inverter INV2 is delayed from the signal S1 outputted from each inverter INV1 and the output signal S3 of the inverter INV3 is further delayed. Such signals are defined as clock signals inputted to the lattice-like delay circuit. The circuits for creating or producing the successively-delayed signals S1, S2, . . . , Sm are not necessarily limited to or by the above-described embodiment. Predetermined values required upon device fabrication, other than the gate widths, can be changed to modify device characteristics of MOSFETs, for example. Further, circuit elements other than the MOSFETs may be used.

The output signals created by the lattice-like delay circuit are defined as output signals of the logic gate means provided as the nth stage corresponding to the final stage as seen in the second signal transfer direction and provided as the first to the mth as seen in the first signal transfer direction. To obtain output signals being in phase and out of phase with the input clock signal, output signals of the logic gate means lying in an n−1th stage as seen in the second signal transfer direction and provided at the first to the mth as seen in the first signal transfer direction are added. If it is desired to selectively output a plurality of types of delay signals, then plural stages may be selected with those in which minute or small delay intervals are uniform, i.e., the final stage as seen in the second signal transfer direction as the reference, as will be described later.

Figure 2:
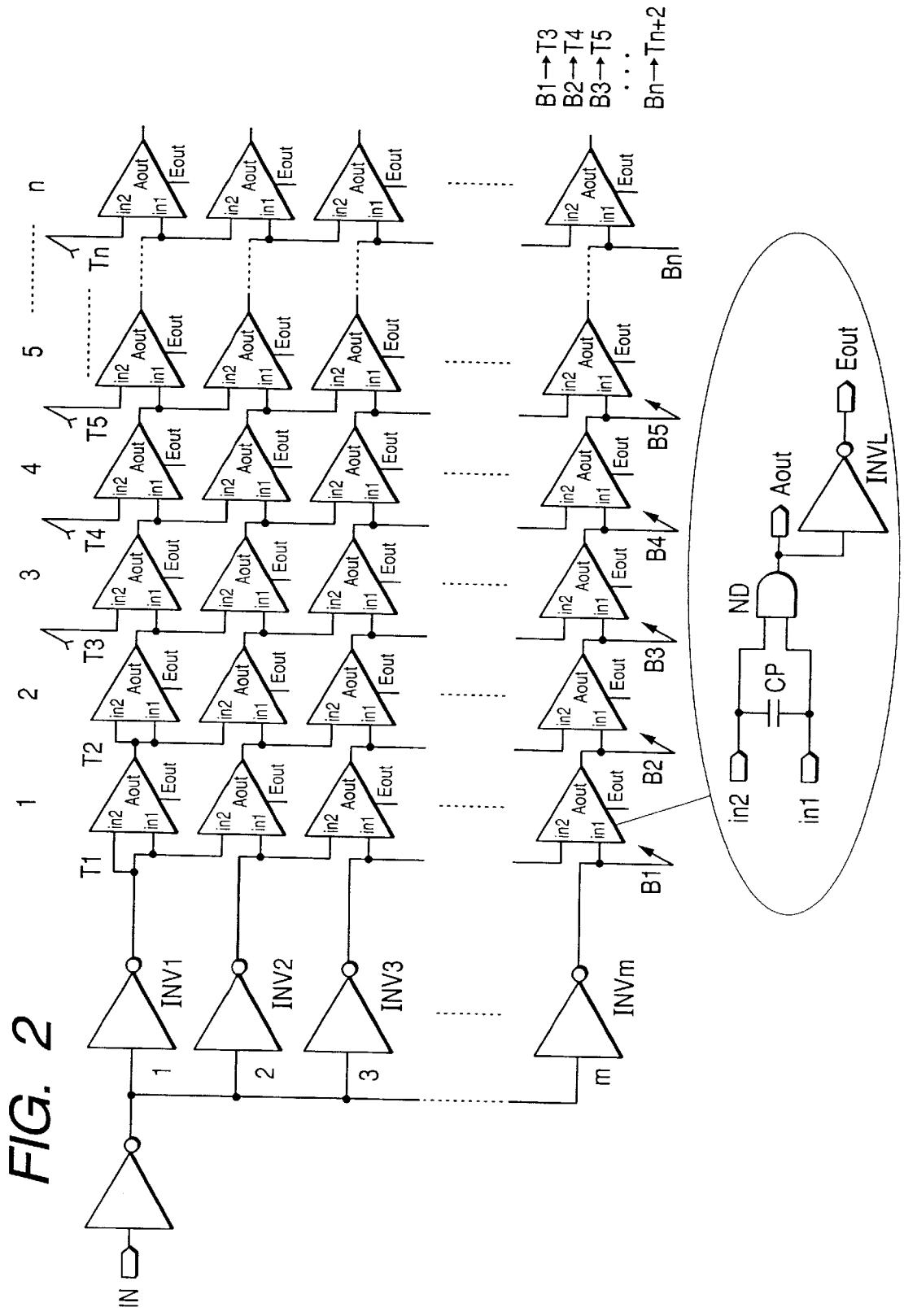
FIG. 2 is a circuit diagram illustrating another embodiment of a lattice-like delay circuit according to the present invention.

FIG. 2 is a circuit diagram of another embodiment of a lattice-like delay circuit according to the present invention. In the present embodiment, each of logic gate means is provided with an output buffer INVL for taking out or extracting an output signal. The logic gate means employed in the present embodiment are similar in other configurations to those employed in the embodiment shown in FIG. 1. If output buffers are added only to specific stages in the lattice-like delay circuit as seen in the second signal transfer direction, then the specific stages differ from one another in output load conditions. Thus, input conditions of the specific stages will vary as seen from the following stage.

Therefore, if only the specific stages in the lattice-like logic gate means are set to the different input conditions, then micro delay signals each having satisfactory precision will not be obtained. In the embodiment illustrated in FIG. 2 to avoid this, all the same output buffers INVL are added to the logic gate means placed in lattice form, irrespective of whether the output signals should be taken out from the corresponding logic gate means. Thus, even if output signals are obtained from logic gate means arranged in a first signal transfer direction at arbitrary stages as seen in the second signal transfer direction, micro signal delay times created thereby will not be placed under some influences.

The lattice-like delay circuit shown in FIG. 1 or 2 may be understood as one in which some of the aforementioned array oscillator is cut out and utilized in a word. However, the array oscillator will oscillate at its own most convenient oscillation frequency under boundary conditions in row and column directions. On the other hand, in the lattice-like delay circuit according to the invention of the present application, no oscillating operation occurs because there is no feedback loop in a column direction corresponding to the second signal transfer direction, and the period or cycle of each output clock signal is identical to that of an externally input clock signal. Further, although clock signals successively delayed in the first signal transfer direction, which have been input to respective delay stages,-are shifted in phase each other by small amounts as compared with the clock cycle as seen from the buffer constituting the delay corrector, they are not arranged linearly on the order of a desired number 10 psec.

However, owing to the connection of the delay corrector with the boundary condition in the first signal transfer direction, i.e., Bn and Tn+2, the relationship in phase between the respective delay stages is corrected as clock delay signals pass through delay elements over several stages, whereby the linear phase relationship similar to the above-described array oscillator is obtained.

Further, since the circuit according to the present embodiment no requires the ring oscillator, the startup time between its deactivated state and the stabilization of its operation is relatively short. Thus, the circuit according to the present embodiment is suitable for high-speed operation. Owing to the feature that the startup time is short, the operation of this circuit is stopped when not in use, and a semiconductor chip equipped with the circuit can be reduced in power consumption in this condition.

In the embodiment shown in FIG. 2, only the inputs of the logic gate means used as other delay elements in the array are electrically connected to the logic gate means used as the respective delay elements. Further, the output circuits INVL used so as not to unbalance the phase relationship realized under the boundary condition in the second signal transfer direction corresponding to the delay-stage direction due to the difference in addition are provided. Output signals indicative of the linear phase relationship (small amounts of delay) are obtained through such output circuits INVL.

Figure 3A:
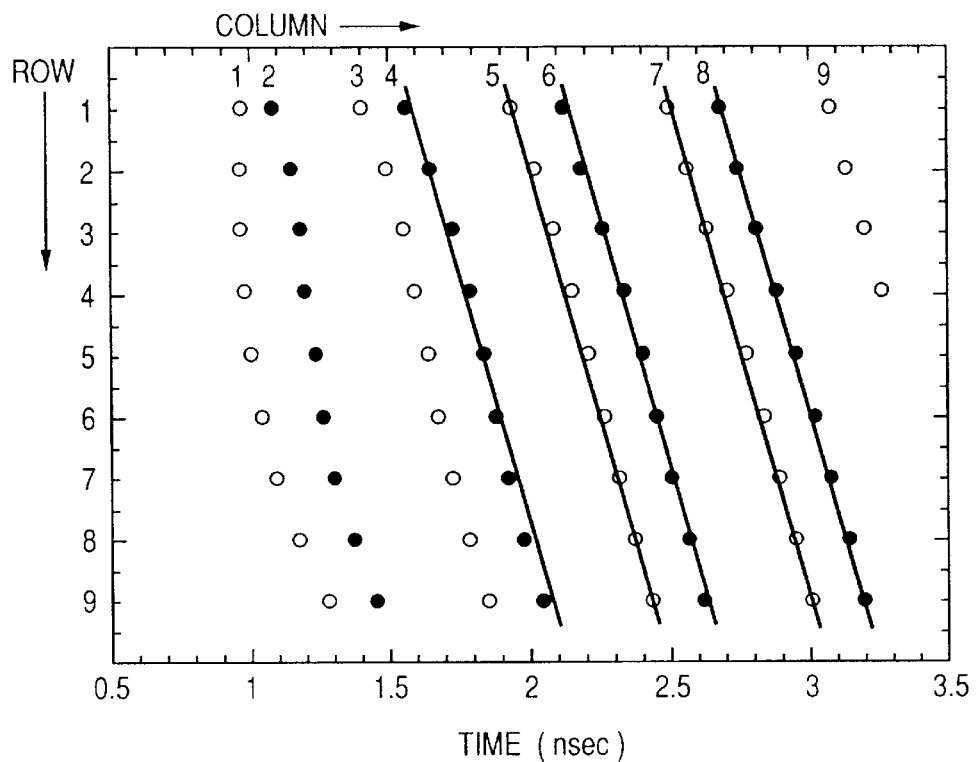
FIGS. 3A and 3B are respectively characteristic diagrams obtained by computer simulations, for describing the operation of a lattice-like delay circuit according to the present invention.
Figure 3B:
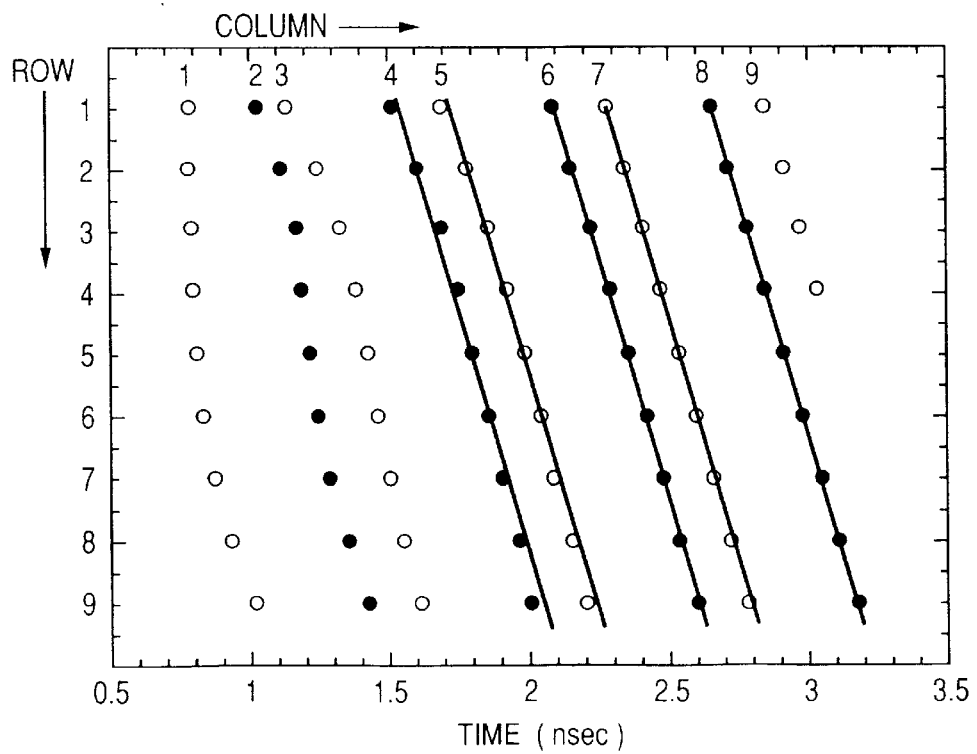

FIGS. 3A and 3B respectively show characteristic diagrams obtained by computer simulations, for describing the operation of the lattice-like delay circuit according to the present invention. FIG. 3A illustrates the propagation of the leading edges at the time that the leading edges are externally inputted and FIG. 3B depicts the propagation of the trailing edges at the time that the trailing edges are externally inputted. In FIGS. 3A and 3B, time bases are taken in their horizontal directions. Further, the propagation of the leading edges (or the trailing edges) at the respective logic gate circuit stages arranged in the row direction is represented by white circles (○), whereas the propagation of the trailing edges (or the leading edges) thereat is represented by black circles (●). The origin of the time base is equal to the leading edge or trailing edge of the external clock input. The input clock has a pulse-width duty of 50% and is defined as 200 MHz.

Referring to FIGS. 3A and 3B, the delay signals of the delay corrector become predominant in the first and second stages as seen in the second signal transfer direction and hence the phase differences therebetween are not arranged at equal intervals (linearly). It is however understood that the small amount of delay becomes constant on the stage side subsequent to the fourth stage and the above-described ○ and ● marks are arranged in a straight line. The reason why the edges of respective odd-numbered stages differ from each other in position, is that the delay elements are NAND gate circuits. Since the leading edge is driven by two parallel-connected P channel MOSFETs and the trailing edge is driven by two series-connected N channel MOSFETs, input vs. output timings differ from each other. On the other hand, since outputs produced from even-numbered stages are determined according to the sum of the two different output timings, they are placed substantially in the same positions in both FIGS. 3A and 3B.

Figure 4A:
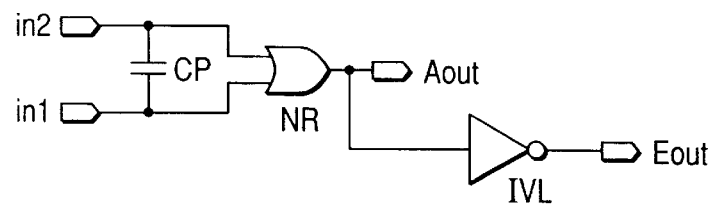
FIGS. 4A, 4B, 4C, 4D and 4E are respectively circuit diagrams illustrating other embodiments of delay elements each employed in a lattice-like delay circuit according to the present invention.

FIGS. 4A, 4B, 4C, 4D and 4E respectively show circuit diagrams of other embodiments of delay elements employed in the above-described lattice-like delay circuit. In FIG. 4A, a NOR gate or gate circuit NR is used as a delay element. Namely, a capacitor CP used as a coupling means is provided between two inputs in1 and in2 of the NOR gate NR. A signal Aout outputted from the NOR gate NR is coupled to an input terminal of an NOR gate circuit used as another delay element in an array on the one side. On the other hand, the signal Aout is coupled to an input terminal of an inverter IVL used as an output buffer for obtaining an output signal.

Figure 4B:
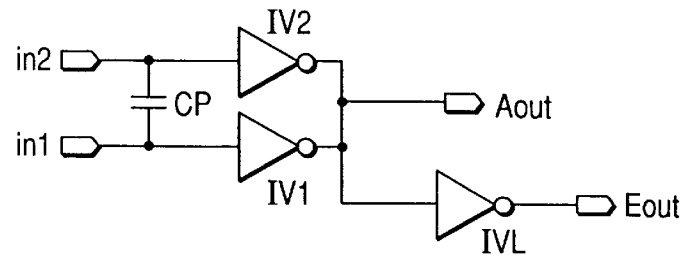

In FIG. 4B, one in which output terminals of two inverters IV1 and IV2 are commonly connected to each other, is used as a delay element. Namely, a capacitor CP is electrically connected between input terminals in1 and in2 of the inverters IV1 and IV2 as a coupling means and output terminals of the inverters IV1 and IV2 are commonly connected to each other to thereby obtain an output signal Aout. On the one side, the output signal Aout is supplied to an input terminal of a NOR gate used as another delay element in an array. On the other hand, the output signal Aout is supplied to an input terminal of an inverter IVL used as an output buffer for obtaining an output signal.

Figure 4C:
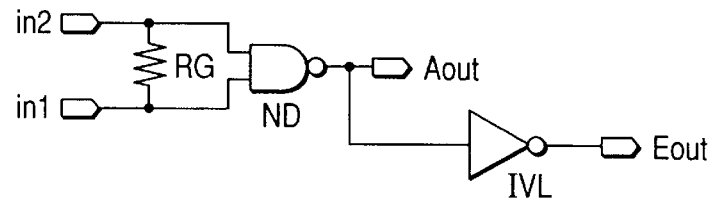

FIG. 4C shows one in which a resistive element RG is used as a coupling means in place of the capacitor while using a NAND gate ND, as a delay element in the same manner as described above. Other configurations are similar to those in the embodiment shown in FIG. 2. Thus, the resistor RG used as the coupling means is applicable even to the circuits shown in FIGS. 4A and 4B. The use of the resistive element allows the coupling element to be formed in a relatively small form.

Figure 4D:
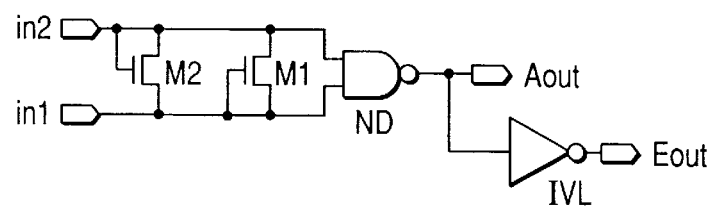

FIG. 4D shows, as a delay element, one in which diode-connected MOSFETs M1 and M2 are used as a coupling means in place of the capacitor while using a NAND gate ND in the same manner as described above. Namely, the diode-cannected MOSFET M1 transmits or carries a signal current directed from input terminals in1 to in2. Reversely, the diode-connected MOSFET M2 feeds a signal current directed from the input terminals in2 to in1. Other configurations are similar to those in the embodiment shown in FIG. 2. The diode-connected MOSFETs M1 and M2 used as the coupling means in this way can be applied even to the circuits shown in FIGS. 4A and 4B. The coupling elements can be formed in the same process as other MOSFETs by using the MOSFETs M1 and M2.

Figure 4E:
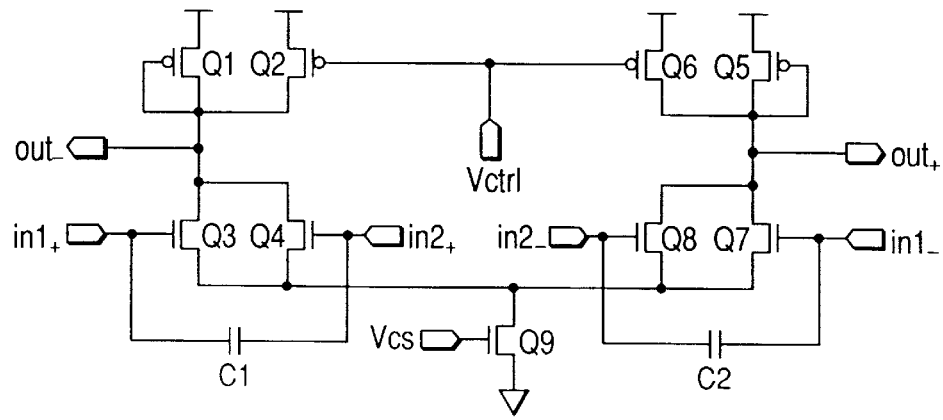

In FIG. 4E, a differential circuit is used as a delay element. Namely, a coupling capacitor C1 is provided with the gates of parallel-connected N channel MOSFETs Q3 and Q4 as positive-phase first input terminals in1+ and in2+. P channel MOSFETs Q1 and Q2 are provided at the commonly-connected drains of the N channel MOSFETs Q3 and Q4 as a load and an inverted output out− is obtained from the commonly-connected drains thereof. With the gates of parallel-connected N channel MOSFETs Q7 and Q8 as antiphase first input terminals in1− and in2−, a coupling capacitor C2 is provided. P channel MOSFETs Q5 and Q6 are provided at the commonly-connected drains of the N channel MOSFETs Q7 and Q8 as a load and a positive-phase output out+ is obtained from the commonly-connected drains thereof. At the sources of differentially-operated MOSFETs Q3 and Q4, and Q7 and Q8, an N channel MOSFET Q9 set so as to allow an operating current to flow is provided. The P channel MOSFETs Q2 and Q6 perform control on a delay time per stage with a current to flow therethrough being controlled by a control voltage Vctrl in a manner similar to the P channel MOSFET Q9.

The coupling capacitors C1 and C2 respectively provided between the gates of the MOSFETs Q3 and Q4 and Q7 and Q8 can be replaced by the resistor or MOS diodes as shown in FIGS. 4C and 4D.

Figure 5A:
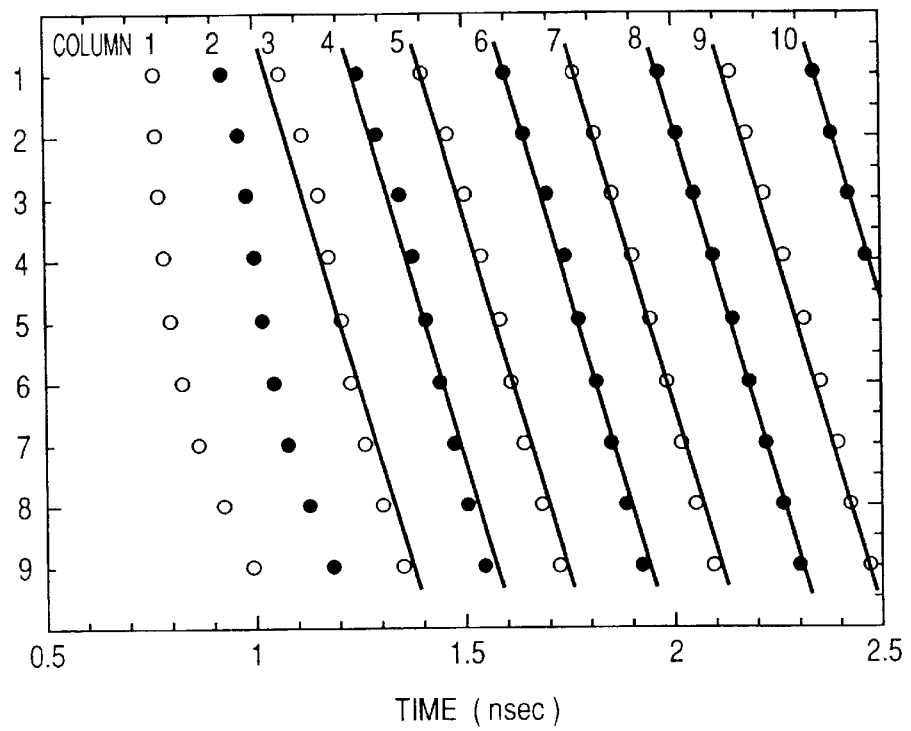
FIGS. 5A and 5B are respectively characteristic diagrams for describing the role of a coupling means employed in a lattice-like delay circuit according to the present invention.
Figure 5B:
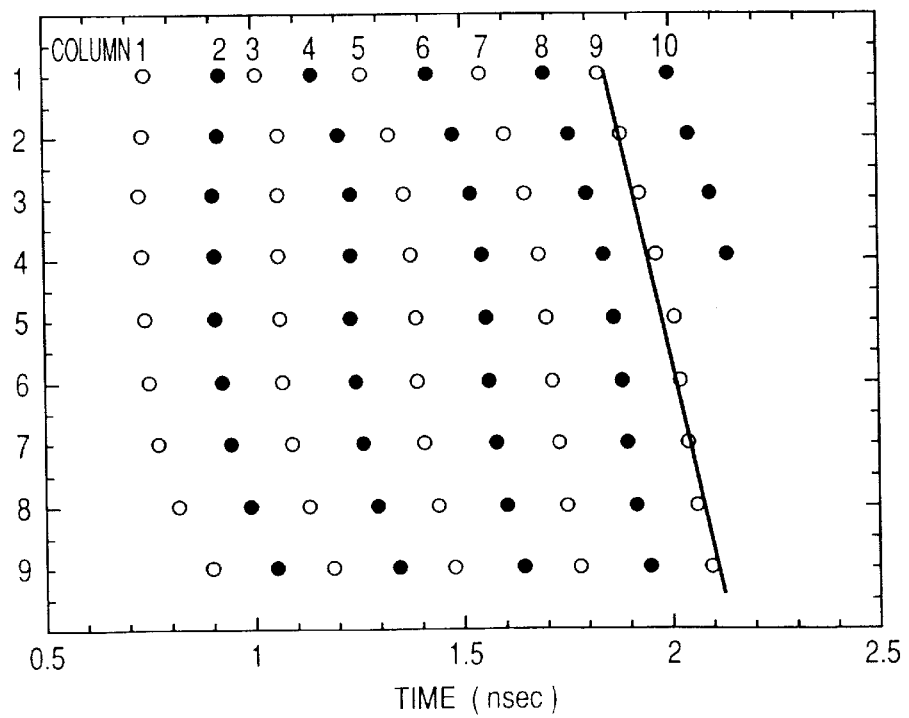

FIGS. 5A and 5B respectively show characteristic diagrams for describing the role of coupling means employed in the lattice-like delay circuit according to the invention of the present application. In the present embodiment, one in which the outputs of the two inverters are rendered common as shown in FIG. 4B, is used as a delay element, and characteristic diagrams obtained by computer simulations while using it are illustrated. FIG. 4A shows an example in which a capacitor having a relatively large capacitance value of about 1 pF is used as a coupling means as in the embodiment shown in FIG. 2. It is understood that although, with an increase in the degree of coupling between the two input signals as described above, delay signals at a delay corrector become predominant in the pre-stages like the first and second stages as seen in the second signal transfer direction and phase differences therebetween are not arranged at equal intervals (linearly), the small amounts of delay become constant on the stage side subsequent to the fourth stage and the above-described ○ and ● marks are arranged in a straight line.

On the other hand, FIG. 5B shows an example in which the capacitance value of the capacitor is reduced so that the degree of coupling between the two input signals is lowered. Decreasing the capacitance value of the input coupling capacitor in this way impairs the linearity of the above-described ○ and ● marks even on the rear stage side as seen in the second signal transfer direction. However, the rear stage side is recognized as has been improved as compared with the pre-stage side after all.

Figure 6:
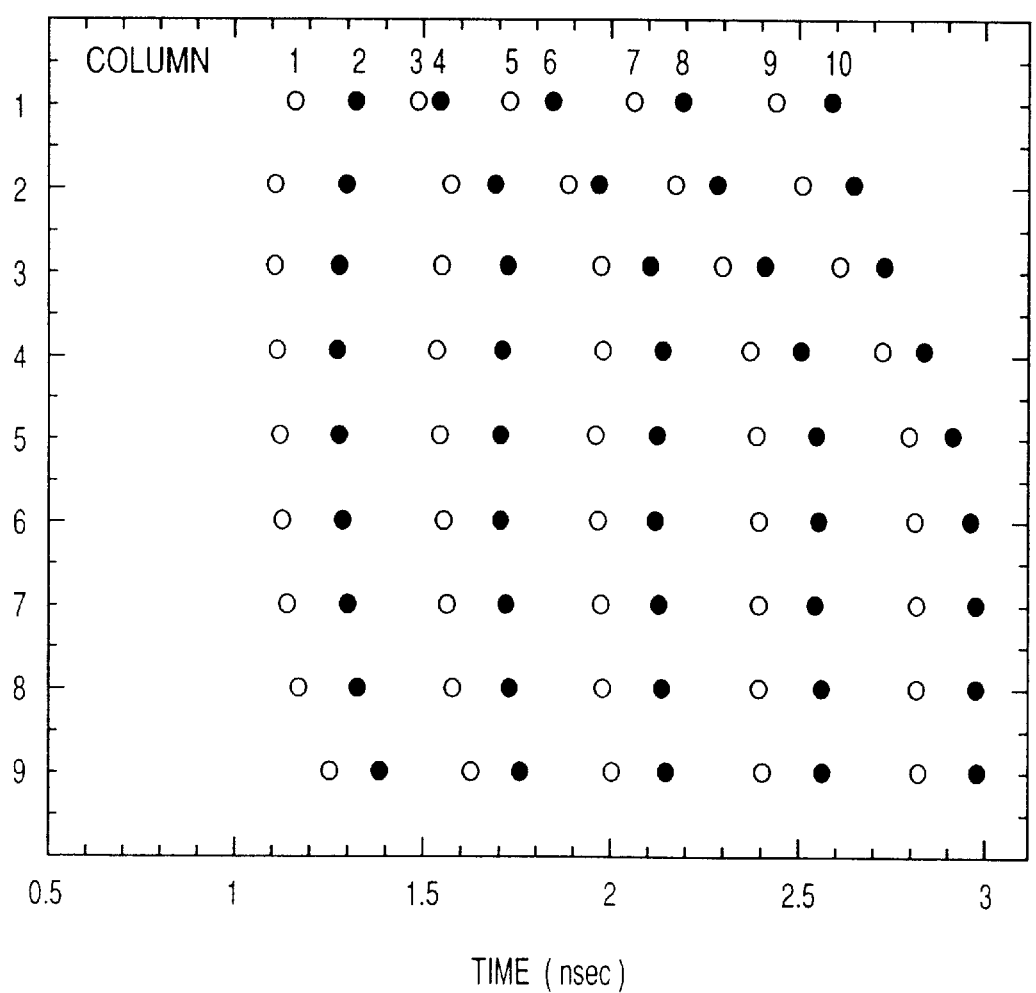
FIG. 6 is a characteristic diagram for describing another role of the coupling means employed in the lattice-like delay circuit according to the present invention.

FIG. 6 is a characteristic diagram obtained by computer simulations where outputs of two inverters are used in common under the same conditions as FIGS. 5A and 5B and the above coupling capacitor is deleted. If the coupling means is deleted in this way, then the second signal transfer direction is set so as to have a predetermined time difference on the rear stage side in like manner. It is however understood that although the delay elements placed substantially over the first to the third are arranged with small amounts of delay differences as seen in the first signal transfer direction in which they are used as variable delay circuits capable of setting desired small amounts of delay, no time differences exist from the fourth or later and they are of no use as the small-amount delay circuits.

It is understood that the tight degree of coupling between the signals successively delayed in the first signal transfer direction and those successively delayed in the second signal transfer direction in the above-described manner plays an important role in improving linearity of small amounts of delay obtained by uniformly dividing delay times corresponding to two stages being in phase as seen in the second signal transfer direction by the number of delay elements placed in the first signal transfer direction. This is because it is considered that although no quantitative circuit analysis is done, two input signals interfere with each other and changes in signals at respective delay elements placed in lattice form are averaged, whereby the above-described small amounts of delay satisfactory in linearity are realized or implemented. As viewed from another angle, each delay element referred to above can be regarded as a sort of inverting amplifier. However, when the two input signals are subjected to coupling and thereafter supplied to the input of the inverting amplifier, the transfer of signals between the respective delay elements placed in lattice form is made uniform as a result of signal amplification at a satisfactory linear portion as seen in its input/output transfer characteristic, whereby the above-described satisfactory linearity is considered to be obtained. Although each coupling element has been provided between the two input terminals to make coupling between-the two input signals in the present embodiment, the present invention is not limited to this method. If an effect similar to that obtained by the provision of the coupling element is obtained by placing two input interconnections or wires in close proximity to each other, for example, the present invention does not necessarily require particular provision of the coupling element.

Since the small amounts of delay are obtained by evenly dividing the delay times corresponding to the two stages being in phase as seen in the second signal transfer direction by the number of the delay elements placed in the first signal transfer direction, this will not reach a conclusion that the two input signals would be completely coupled to each other. Namely, this is because such coupling that the signal delays on the signal paths in the two signal transfer directions will impair other signal delay elements each other will lose the meaning of the provision of the gate circuits or the like in lattice form as the delay elements in the first place.

Figure 7:
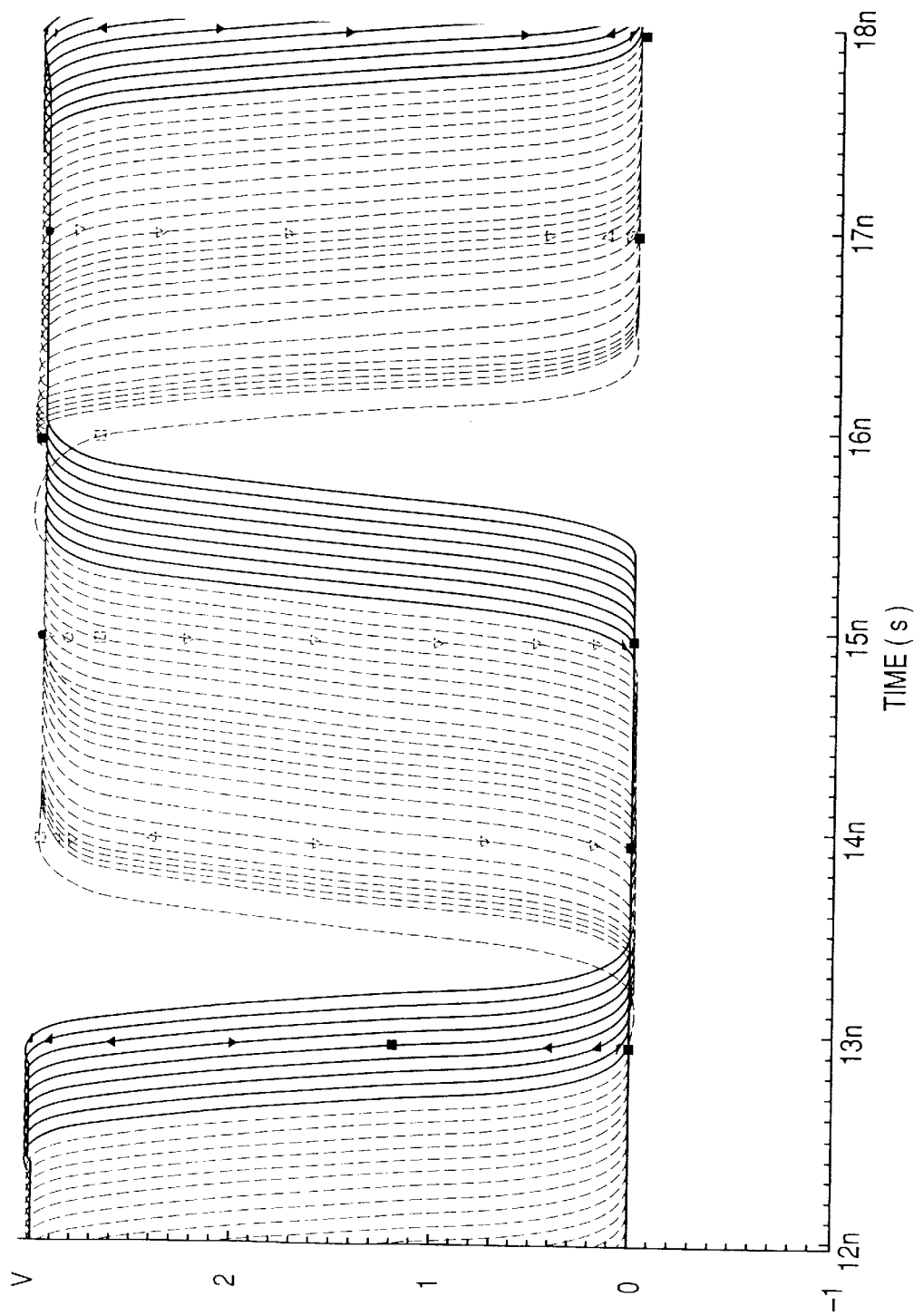
FIG. 7 is a waveform diagram for describing the operation of the lattice-like delay circuit according to the present invention.

FIG. 7 is a waveform chart for describing the operation of the lattice-like delay circuit according to the present invention. It is understood that if, for example, the leading edges of output signals shown in the center of a time base are taken as illustrative examples, then the leading edges of the clock signals rise at intervals of about 50 psec or the like except for the initial several leading edges. It is understood that if the trailing edges of the output signals are taken into consideration, then the falling edges of clock signals on the rear stage side are placed on the front side of the time base at intervals of about 50 psec or the like. It is also understood that the initial clock signal is dispersedly varies in its falling on the rear side of the time base.

Figure 8:
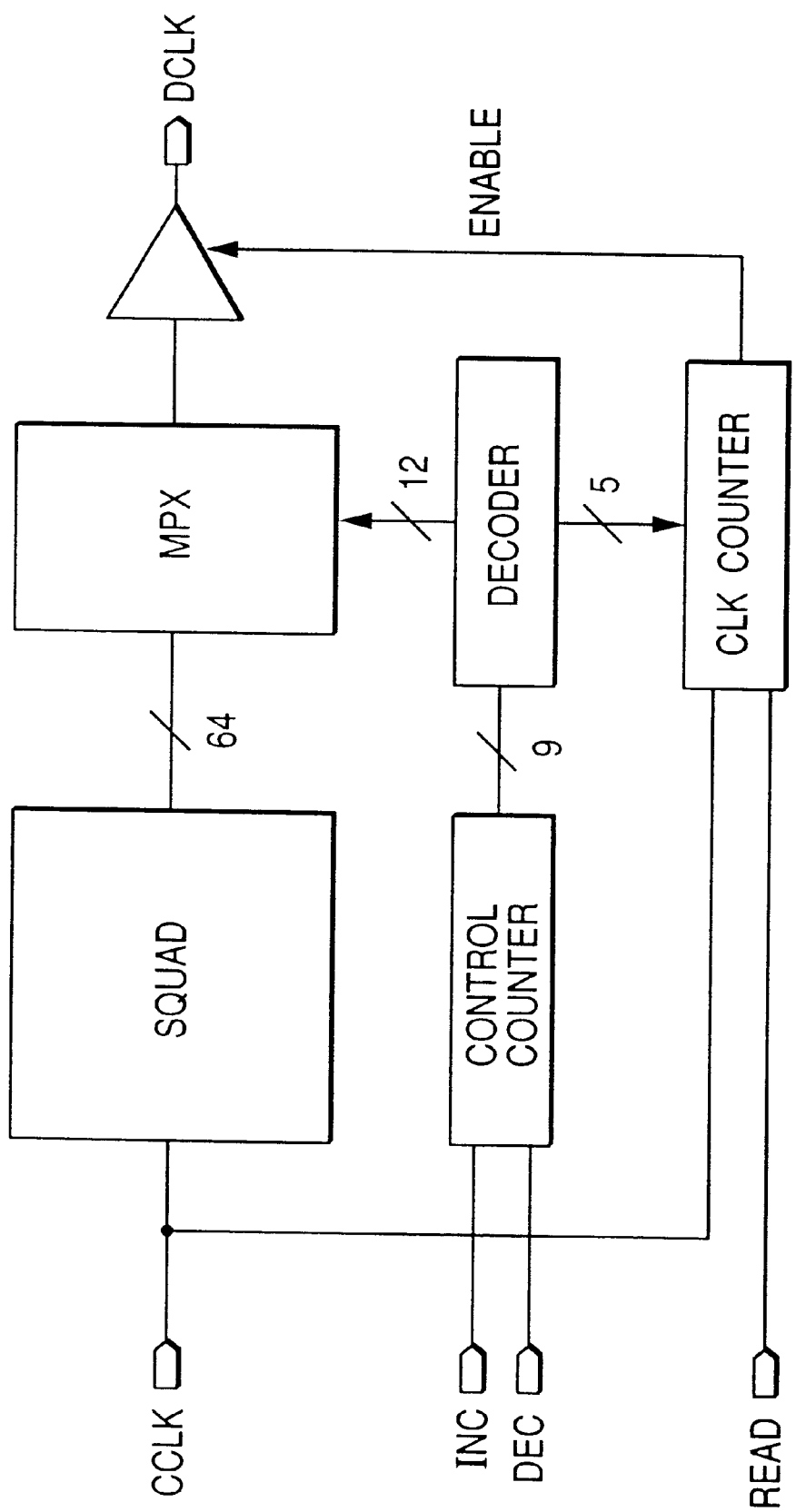
FIG. 8 is a block diagram showing one embodiment of a clock-generator using the lattice-like delay circuit according to the present invention.

FIG. 8 is a block diagram showing one embodiment of a clock generator using the lattice-like delay circuit according to the present invention. The clock generator according to the present embodiment is installed on a semiconductor memory device such as a dynamic RAM and used to make uniform signal transfer delays on a substrate mounted between such plural RAMs and a memory controller for generally controlling the RAMs, in other words, in anticipation of the signal propagation delays on the mounted substrate, increase delay times thereinside when such signal delays are small and decrease delays thereinside when such signal delays are large to thereby make uniform memory access times as seen from the memory controller.

A grid- or lattice-like delay circuit SQUAD is supplied with a clock signal CCLK. The lattice-like delay circuit SQUAD generates 64 types of small or micro delay signals in response to the input clock signal CCLK although not limited in particular. One of the 64 types of delay signals formed or produced from the lattice-like delay circuit (SQUAD) is selected by a multiplexer (MPX) and outputted through an output circuit as an output clock signal DCLK. A control counter (CONTROL COUNTER) is an up/down counter for receiving a +1 increment signal INC and a −1 decrement signal therein, which forms or produces a 9-bit counted output and supplies it to a decoder (DECODER).

The decoder (DECODER) forms a select signal comprised of 12 bits so as to control the multiplexer (MPX), and forms a 5-bit preset signal and inputs it to a clock counter (CLK COUNTER). The clock counter (CLK COUNTER) is activated by a signal READ to count the clock signal CCLK. When a specified clock is input, the clock counter (CLK COUNTER) generates an enable signal (Enable) to activate the output circuit and thereby allows the output circuit to output a clock signal DCLK used as a data strobe delay-controlled by a small amount at its activation.

The unillustrated memory controller outputs a control signal for adjusting or controlling the data strobe signal DCLK to the clock generator. The control counter (CONTROL COUNTER) performs a counting operation such as count-up or count-down in accordance with instructions issued from the memory controller, associates its counted value with timing established to output the DCLK and makes fast or slow timing provided to generate the clock signal DCLK used as the data strobe in units of about 50 psec. Namely, the count-up or count-down is performed so that immediately after power-on, RAM reading instructions are given from the memory controller under the formation of a training period and a signal read from the RAM matches with desired timing, whereby clock timing control is carried out.

Figure 9:
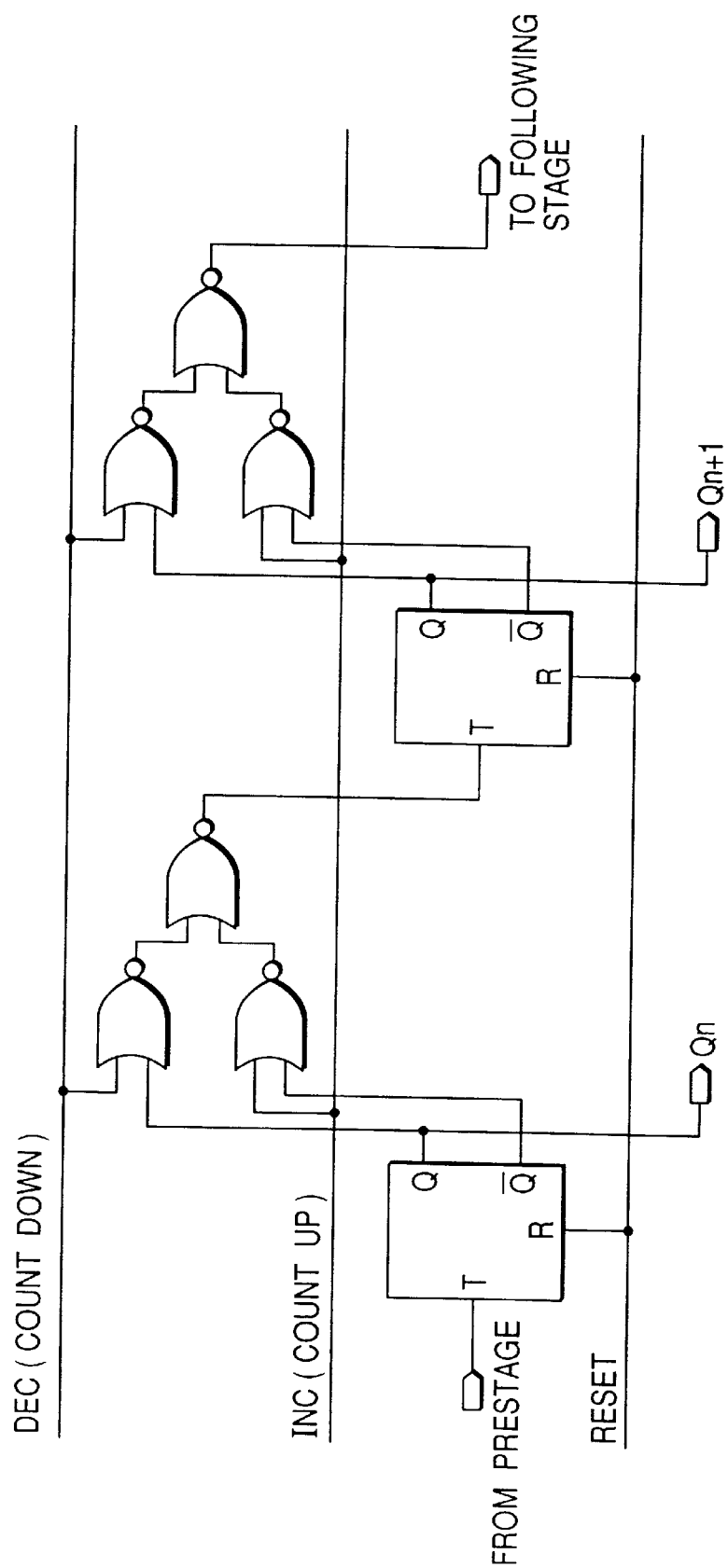
FIG. 9 is a circuit diagram illustrating one embodiment of a control counter shown in FIG. 8.

FIG. 9 is a circuit diagram showing one embodiment of the control counter. T-type flip-flops are connected in tandem and supply a non-inverse output Q thereof or an inverse output /Q to an input terminal T of the following stage circuit through a selection circuit configured by combining NOR gates controlled by a decrement signal DEC for providing instructions for a count-down operation and an increment signal INC for providing instructions for a count-up operation, thereby allowing the control counter to perform the count-up or count-down operation.

Figure 10:
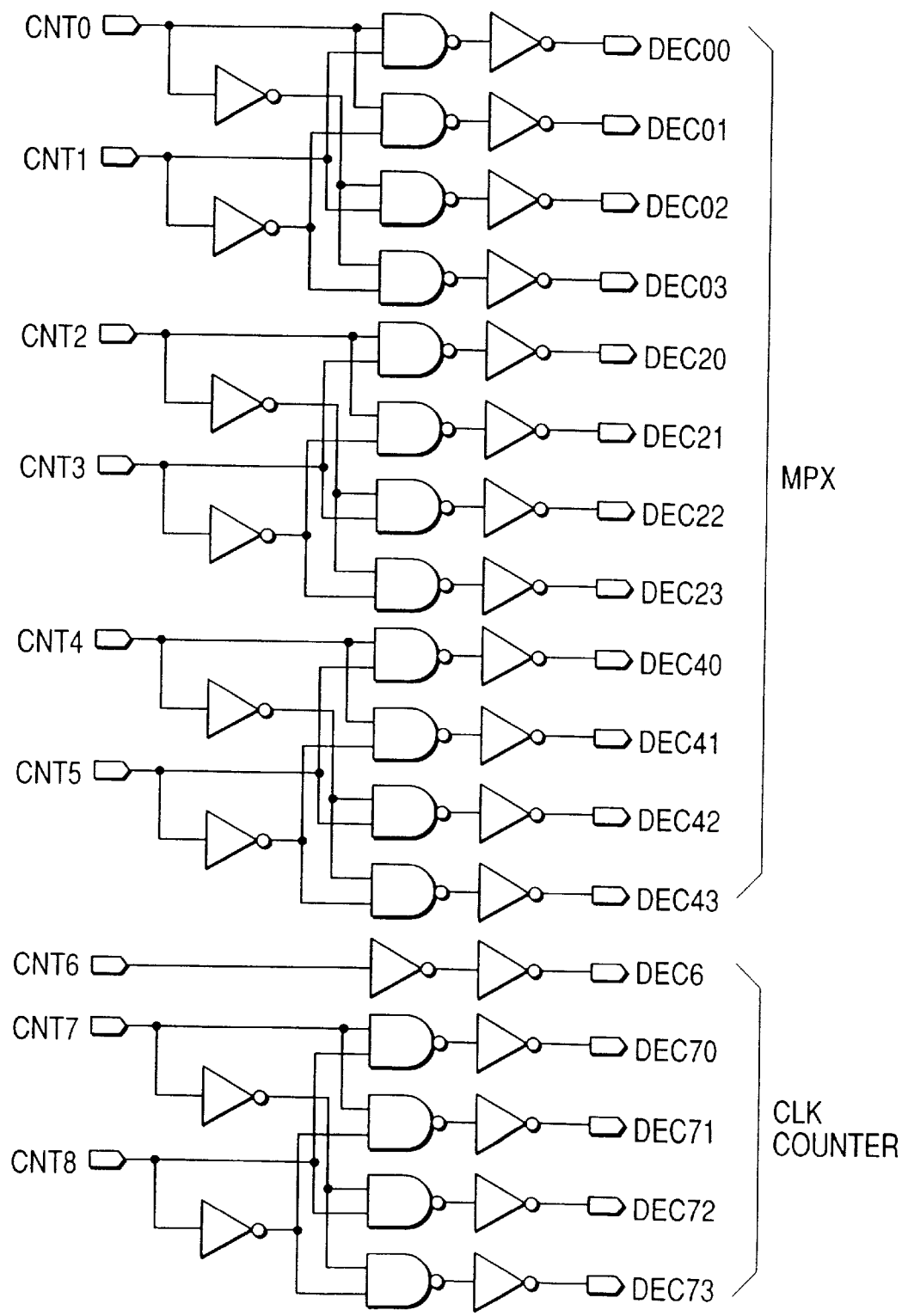
FIG. 10 is a circuit diagram depicting one embodiment of a decoder shown in FIG. 8.

FIG. 10 is a circuit diagram showing one embodiment of the decoder referred to above. Of counted outputs CNT0 through CNT9 created by the control counter, the decoder utilizes the counted outputs CNT0 through CNT5 of the six rightmost bits to form select signals for the multiplexer MPX. Namely, the decoder decodes the low bits CNT0 and CNT1 of the counted outputs CNT0 through CNT5 of the six bits to create DEC00 through DEC03, decodes the two middle bits CNT2 and CNT3 to form DEC20 through DEC23 and decodes-the two leftmost bits CNT4 and CNT5 to create DEC40 through DEC43. These decode signals DEC00 through DEC43 represented as 4×3=12 kinds are used as the select signals for the multiplexer MPX.

The counted output CNT6 of the counted outputs CNT6 through CTN8 of the three leftmost bits, of the counted outputs CNT0 through CNT9 formed by the control counter is outputted as it is and the counted outputs CNT7 and CNT8 of the two leftmost bits thereof are decoded to form DEC70 through DEC73. These decode signals DEC6 and DEC70 through 73 are supplied to the clock counter (CLK COUNTER).

Figure 11:
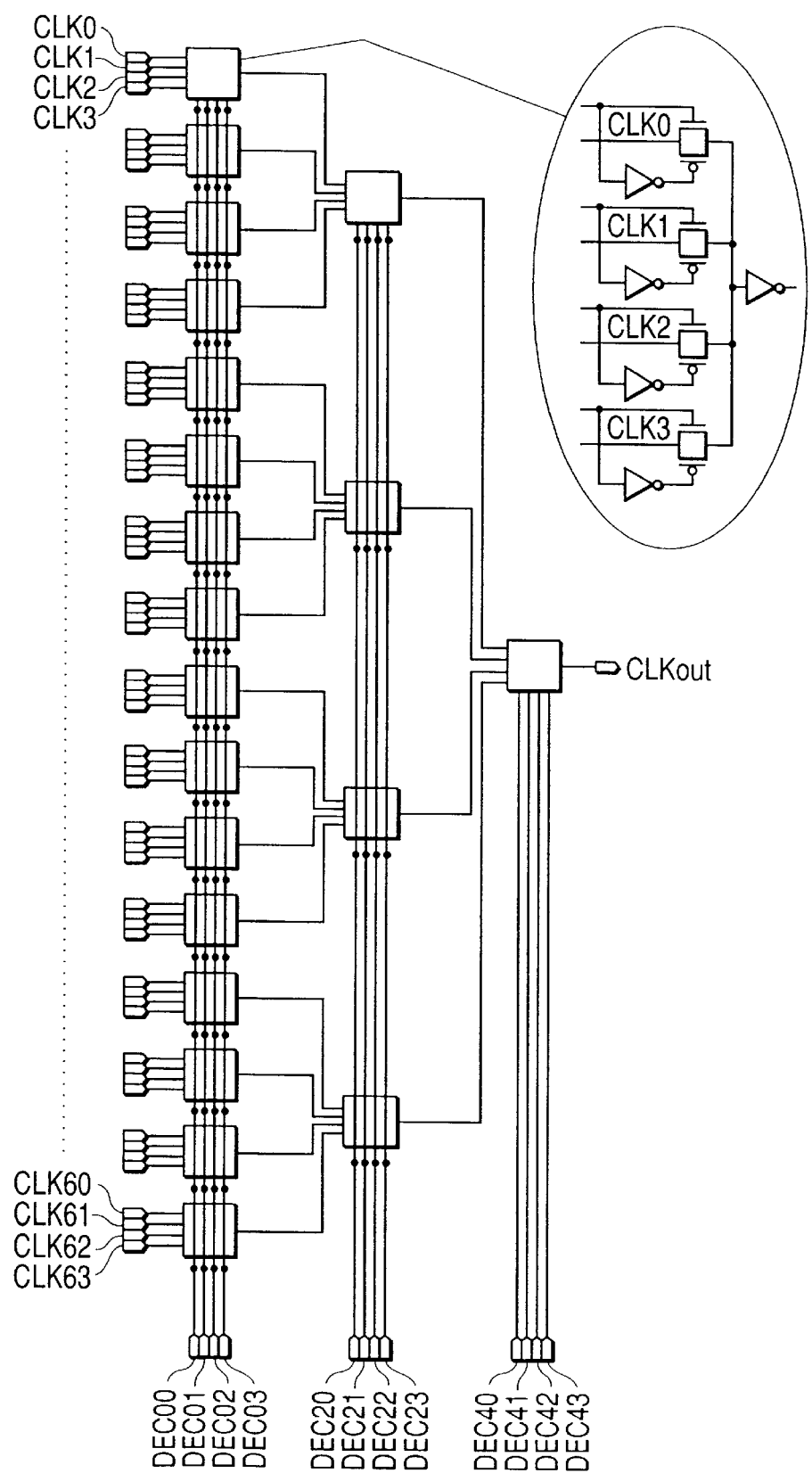
FIG. 11 is a circuit diagram showing one embodiment of a multiplexer shown in FIG. 8.

FIG. 11 is a circuit diagram of one embodiment of the multiplexer MPX. The 64 kinds of delay clock signals CLK0 through CLK63 produced by the above-described lattice-like delay circuit SQUAD are divided into 16 pairs or sets with the four as one set as in the case of CLK0 through CLK3 and thereafter inputted to their corresponding four-input multiplexers. As illustratively shown in the same drawing, each four-input multiplexer comprises a CMOS switch circuit and an output CMOS inverter. The four-input multiplexers corresponding to 16 in total are commonly supplied with the decode outputs DEC00 through DEC03 of the low bits respectively so that one clock signals are selected from each individual multiplexers.

The sixteen clock signals selected from the sixteen multiplexers are divided into four sets or pairs with the four as one set or pair in the same manner as described above and thereafter inputted to their corresponding four-input multiplexers. The four pairs of multiplexers are commonly supplied with the decode outputs DEC20 through DEC23 of the middle bits so that one clock signals are selected from each individual multiplexers. The four clock signals selected from the multiplexers are inputted to a four-input multiplexer similar to the above from which one of the decode outputs DEC40 through DEC43 of the high bits is selected as an output clock signal CLKOUT.

Figure 12:
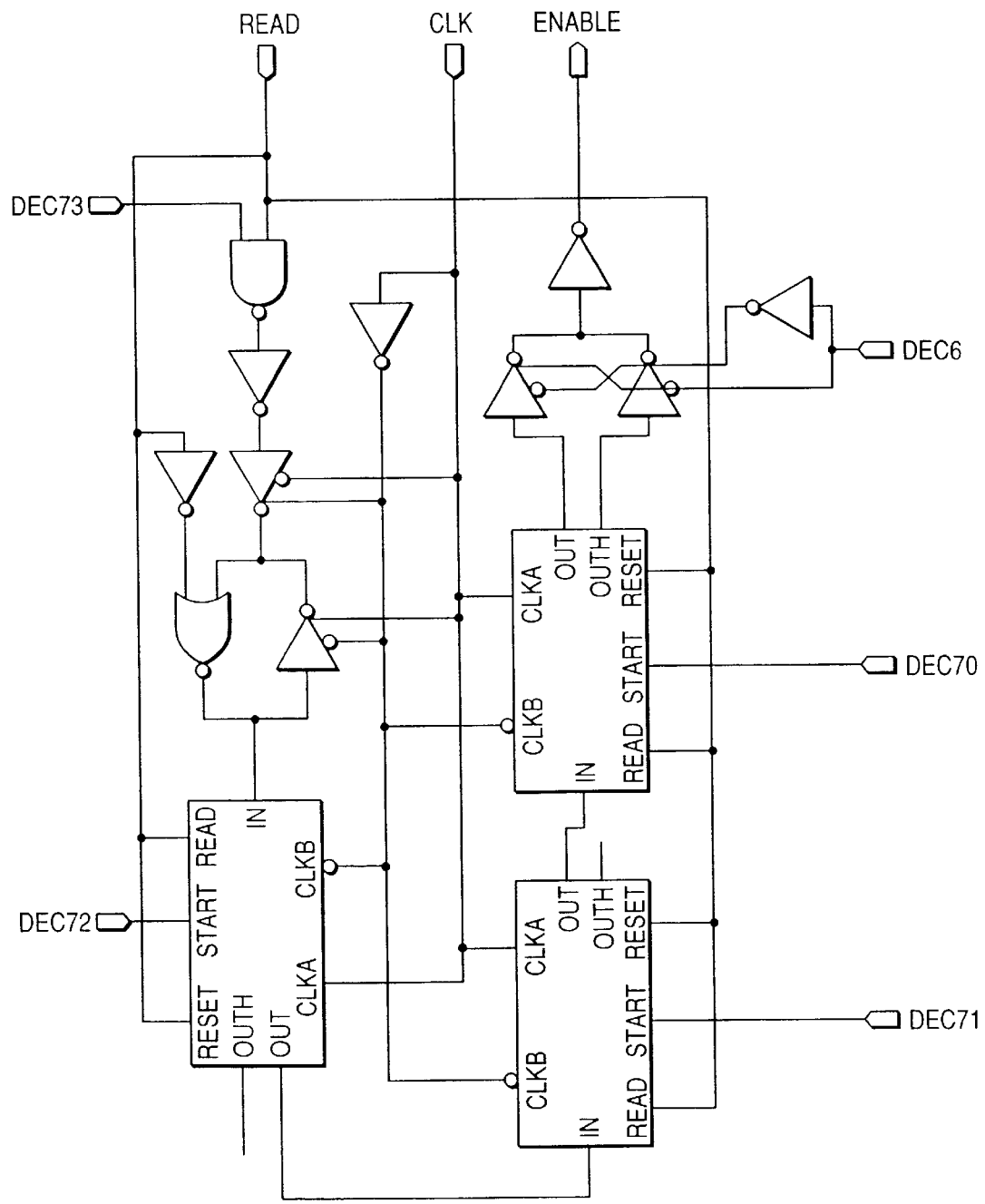
FIG. 12 is a circuit diagram illustrating one embodiment of a clock counter shown in FIG. 8.

FIG. 12 is a circuit diagram showing one embodiment of the clock counter (CLK COUNTER). The clock counter is supplied with the output signals DEC6 and DEC70 through DEC73 of the decoder as counter start values, in other words, initial values. The decode output DEC6 corresponding to the least significant bit of the five bits is used to control the multiplexer provided in the final counted-output stage.

The clock counter activates the output circuit with a delay of a predetermined clock cycle alone to thereby output a clock signal DCLK from the output circuit. Namely, the clock counter shifts a start value as an initial value in response to a count produced by the control counter and delays it by the number of clocks required for its shift operation, thereby forming an enable signal ENABLE. Thus, the RAM outputs data in synchronism with the clock signal DCLK generated with being delayed by the specified number of clocks from a reference clock.

In the present embodiment, each multiplexer is provided in such a manner that the activation signal (ENABLE) can be created with being delayed only 0.5 cycle (half cycle) of the clock CCLK. Only one of output signals (DEC70 through DEC73) of each decoder is brought to a high level H and a DCLK generation signal (READ) is inputted to a shift register using a master slave flip-flop circuit, followed by generation of the activation signal DCLK after a predetermined clock cycle. The multiplexer is realized by controlling a delay signal in the final stage of delay stages based on the four-stage flip-flops corresponding to the output signals (DEC70 through D73) by the counted output CNT6 to thereby output a master-side output OUTH lying before a half cycle or output an output OUT from the slave side of one-cycle delay operation.

When, for example, the external clock of 200 MHz is used as described above, the clock counter effects delay control on it in 2.5 nsec units and the lattice-like delay circuit SQUAD adjusts or controls that interval in about 40 psec units. Therefore, the lattice-like delay circuit SQUAD generates 64 types of delay signals in steps of 40 psec. This is because 40 psec×64 is equal to 2.5 nsec. Each decoder and multiplexer employed in the present embodiment are designed based on such values. A change range for delay control is 22.5 nsec.

Figure 13:
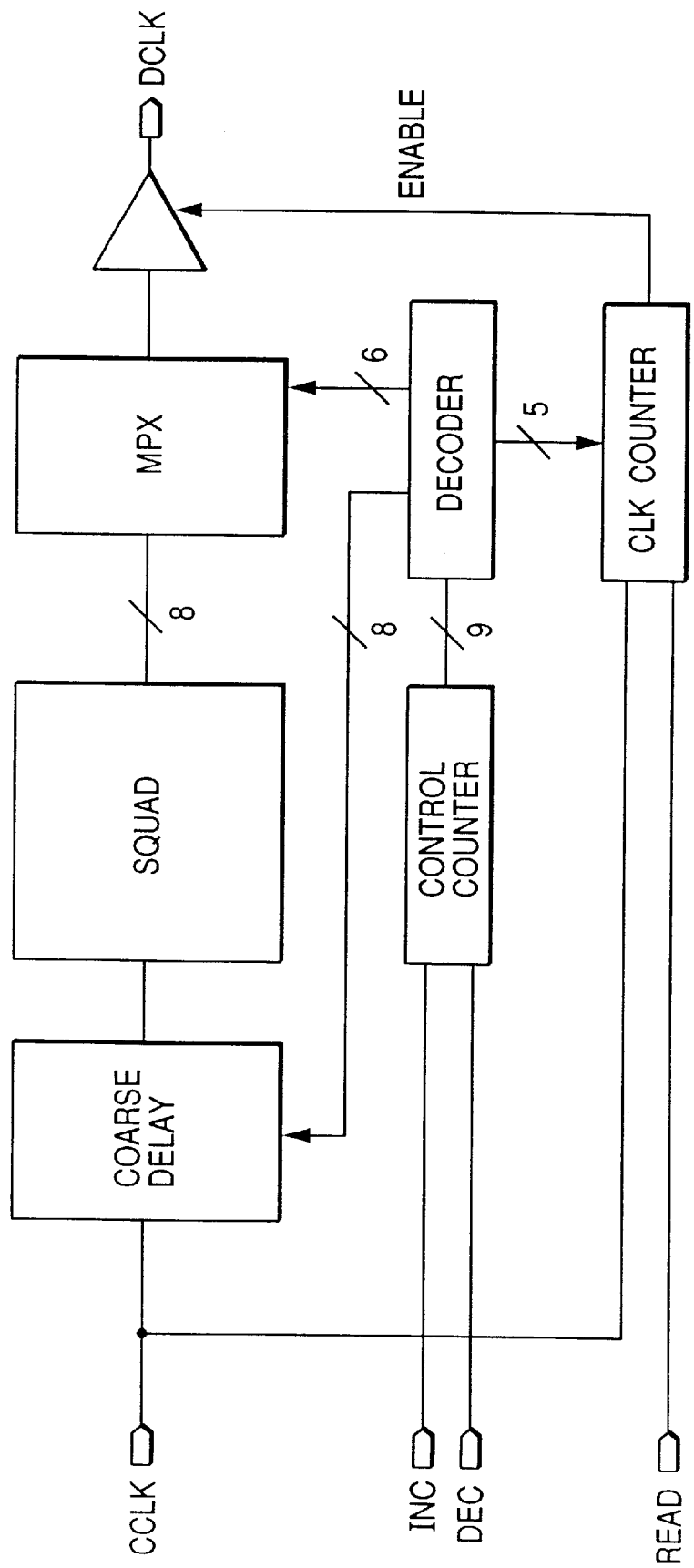
FIG. 13 is a block diagram showing another embodiment of the clock generator using the lattice-like delay circuit according to the present invention.

FIG. 13 is a block diagram showing another embodiment of the clock generator using the above-described lattice-like delay circuit according to the present invention. In the clock generator referred to above, another delay element (COARSE DELAY) is provided in front of the lattice-like delay circuit SQUAD employed in the clock generator described in FIG. 8. The insertion of such a delay element is intended for enlargement of a delay control range.

Figure 14:
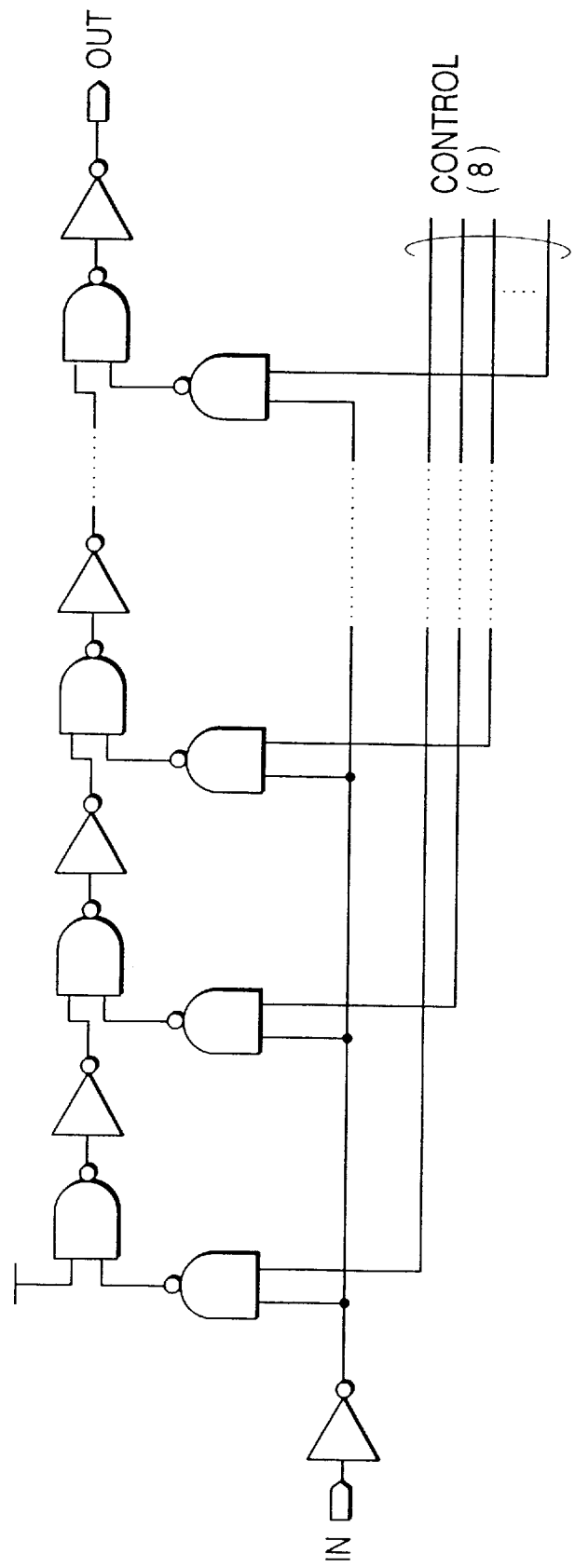
FIG. 14 is a circuit diagram depicting one embodiment of a delay element shown in FIG. 13.

FIG. 14 is a circuit diagram showing one embodiment of the delay element (COARSE DELAY) referred to above. The delay element corresponds to one in which each of delay times of two-input NAND gates and inverters connected in series serves as a unit for controlling a delay time of an output (OUT). Only one of eight control signals outputted from a decoder is brought to a high level so that one NAND gate corresponding to the control signal is gated to supply an input signal IN to one input of the series-connected NAND gate series or column. Namely, the number of stages of the series-connected NAND gates and inverters determines the number of the control units that the input signal IN transfers based on the control signals.

Owing to the provision of the delay element (COARSE DELAY) in the stage preceding the lattice-like delay circuit SQUAD in the embodiment shown in FIG. 13, the lattice-like delay circuit SQUAD may generate eight types of delay signals in steps of about 40 psec when, for example, an external clock of 200 MHz is used Thus, the lattice-like delay circuit SQUAD and the multiplexer MPX can be greatly reduced in circuit size.

Figure 15:
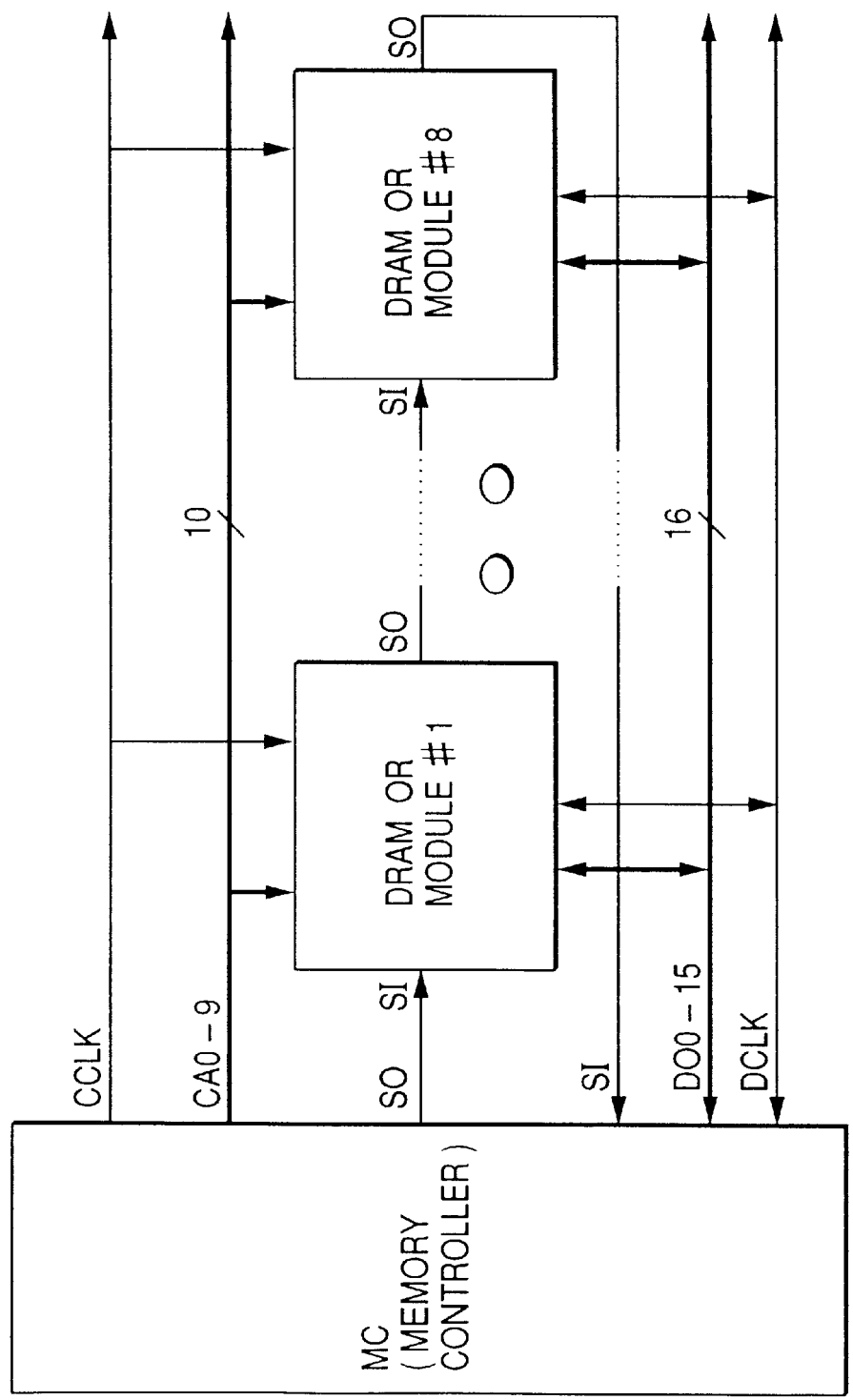
FIG. 15 is a block diagram showing one embodiment of a semiconductor memory system to which the present invention is applied.

FIG. 15 is a block diagram showing one embodiment of a semiconductor memory system to which the present invention is applied. The semiconductor memory system comprises a memory controller MC and a plurality of dynamic RAMs (DRAMs) or memory modules (Modules), which have IDs for specifying themselves respectively. A signal SO is used as a signal for setting each ID.

The memory controller MC performs a training operation immediately after power-on. Namely, the memory controller MC receives commands (CA0 through CA9) in synchronism with a clock signal CCLK to first select the first DRAM and causes the first DRAM to output a DCLK together with data (DO0 through DO15). The memory controller MC effects this operation on the second to eighth DRAMs. In response to these DCLK, the memory controller MC controls the above-described clock generator installed in the respective DRAMs so that they reach a constant delay amount. Thus, when viewed from the memory controller MC, a signal delay on a substrate implemented or packaged between the memory controller MC and each DRAM is accommodated by the above-described timing control. Thus, data can be captured by any DRAM in equal timings and a data-capturable time occupied in a cycle time can be easily ensured. Therefore, the cycle time can be speeded up and the frequency of the clock signal CCLK can be set to a high frequency of about 200 MHz, for example.

Figure 16:
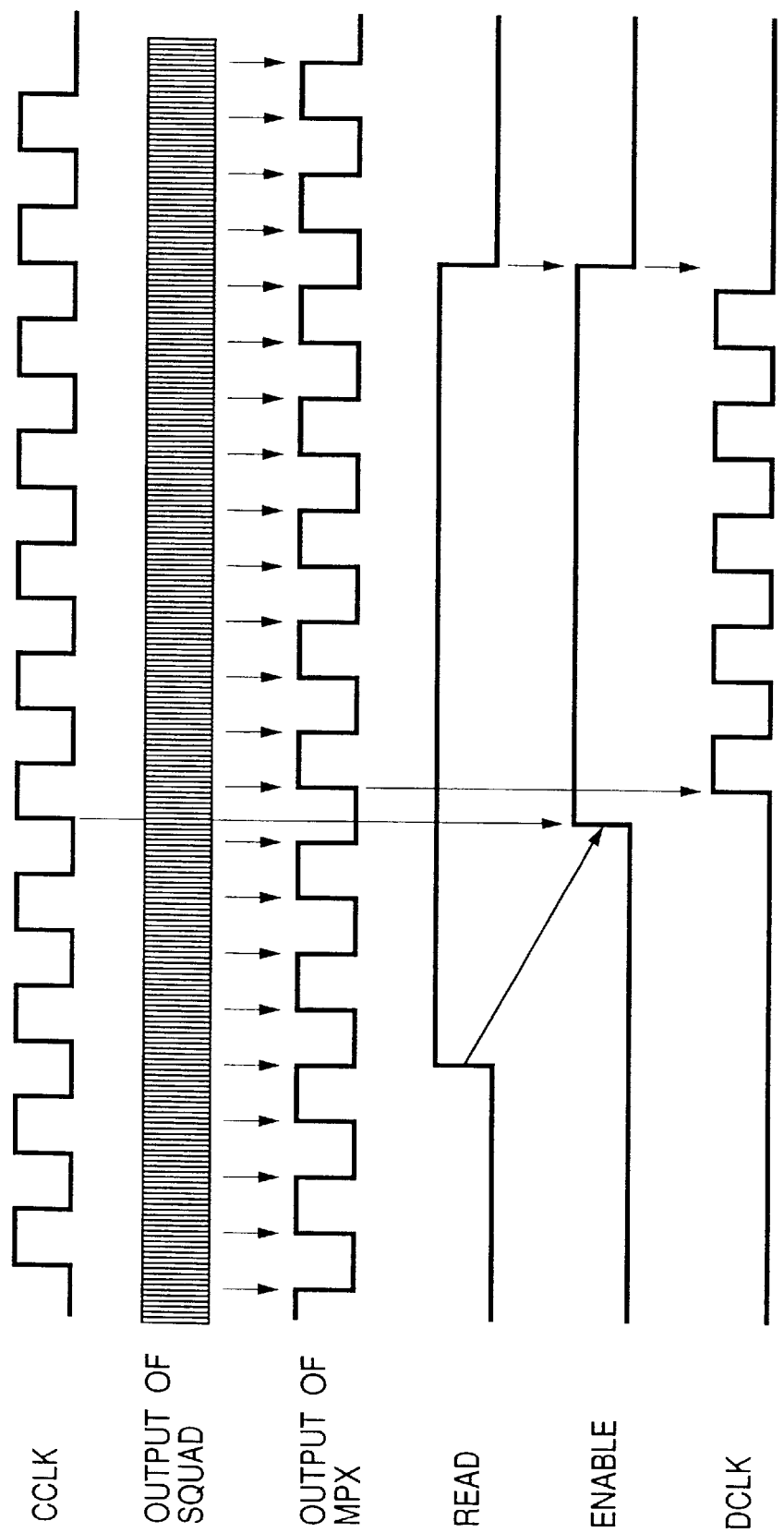
FIG. 16 is a timing chart for describing the operation of a clock generator provided on the DRAM side in the semiconductor memory system shown in FIG. 15.

FIG. 16 is a timing chart for describing the operation of each clock generator provided on the DRAM side in the semiconductor memory system. In synchronism with an external clock CCLK, each lattice-like delay circuit SQUAD generates a plurality of clock signals obtained by delaying it by small amounts. Each multiplexer MPX forms and outputs one delay signal specified by the above-described counter controller.

A read signal READ is received by the counter controller so that an enable signal Enable is generated with being delayed by the number of specified clock signals CCLK. Further, an output signal produced from the above-described multiplexer is outputted as an internal clock signal DCLK. In an effective period in which the read signal READ is of an high level, a plurality of the clock signals DCLK are outputted. Since the internal clock signal DCLK is generated to compensate for the delay time produced upon transfer of a signal between each DRAM and the memory controller in the present embodiment, a memory access using a clock signal CCLK having a high frequency of 200 MHz, for example is made possible.

Figure 17:
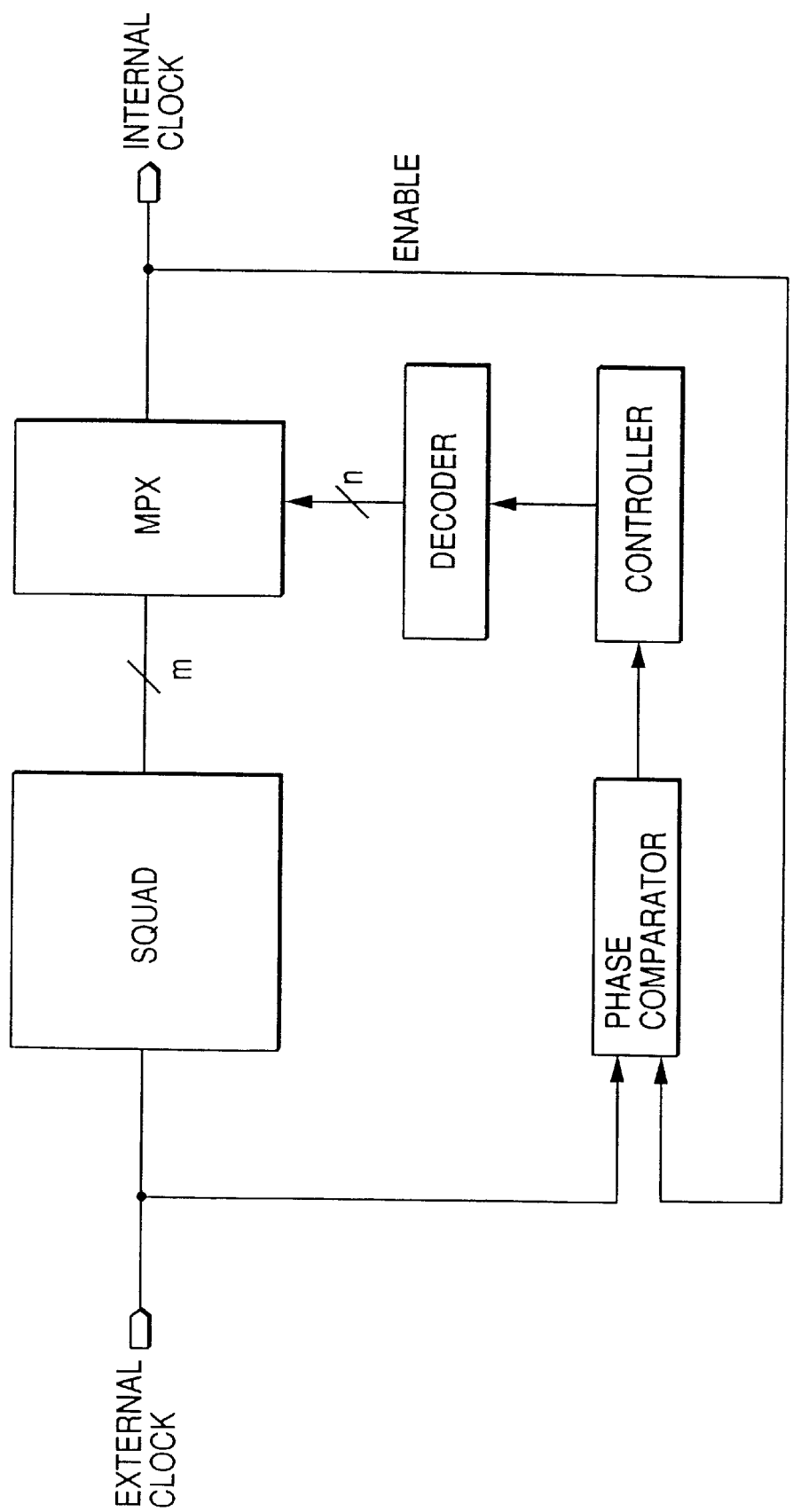
FIG. 17 is a block diagram showing one embodiment of a DLL circuit using a lattice-like delay circuit according to the present invention.

FIG. 17 is a block diagram showing one embodiment of a DLL circuit using a lattice-like delay circuit according to the present invention. An external clock signal is supplied to the lattice-like delay circuit SQUAD to form or produce a plurality of kinds of delay signals as described above. A multiplexer MPX selects one of the plurality of delay signals to produce an internal clock signal. A phase comparator (PHASE COMPARATOR) compares the internal clock signal with each clock signal supplied from the external terminal and supplies the result of comparison to a controller (CONTROLLER) from which a control signal is formed. A decoder (DECODER) decodes the control signal to form a select signal for the multiplexer MPX, whereby the synchronization of the external clock signal with the internal clock signal can be achieved.

Figure 18:
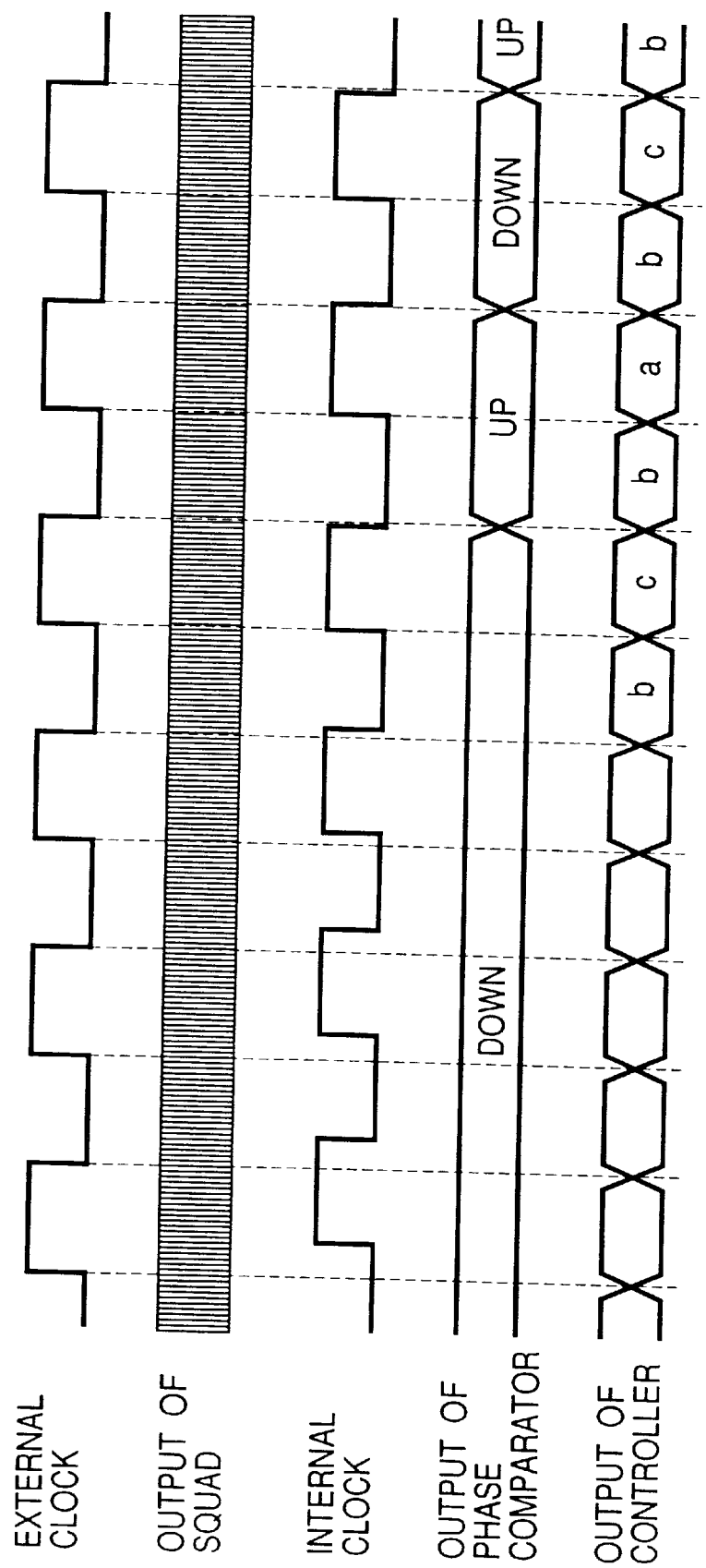
FIG. 18 is a timing chart for describing the operation of the DLL circuit shown in FIG. 17.

Although not limited in particular, the controller comprises a counter and starts counting UP or counting DOWN in response to the output of the phase comparator as indicated by a timing chart shown in FIG. 18. In order to shorten the time required to synchronize the external clock signal with the internal clock signal, the counter, which constitutes the controller, sets the most significant bit to 1 as an initial value and allows the multiplexer MPX to output a delay signal from a middle point of an adjustment or control range at the lattice-like delay circuit SQUAD. If the phase of the internal clock signal leads, then the controller counts up to increase a delay amount. If the phase of the internal clock signal lags, then the controller counts down to reduce a delay amount. Owing to such control, the internal clock signal synchronized in phase with the external clock signal can be formed. Since the delay amount of the lattice-like delay circuit is a few 10 psec as described above in the DLL circuit of the present embodiment, a phase lock operation can be implemented with high accuracy.

Even when the delay element shown in FIG. 14 is inserted into the input side of the lattice-like delay circuit SQUAD and the frequency of the external clock signal is low, the lattice-like delay circuit can achieve high-accuracy phase synchronization. Alternatively, the lattice-like delay circuit and the multiplexer can be reduced in circuit scale.

Figure 19:
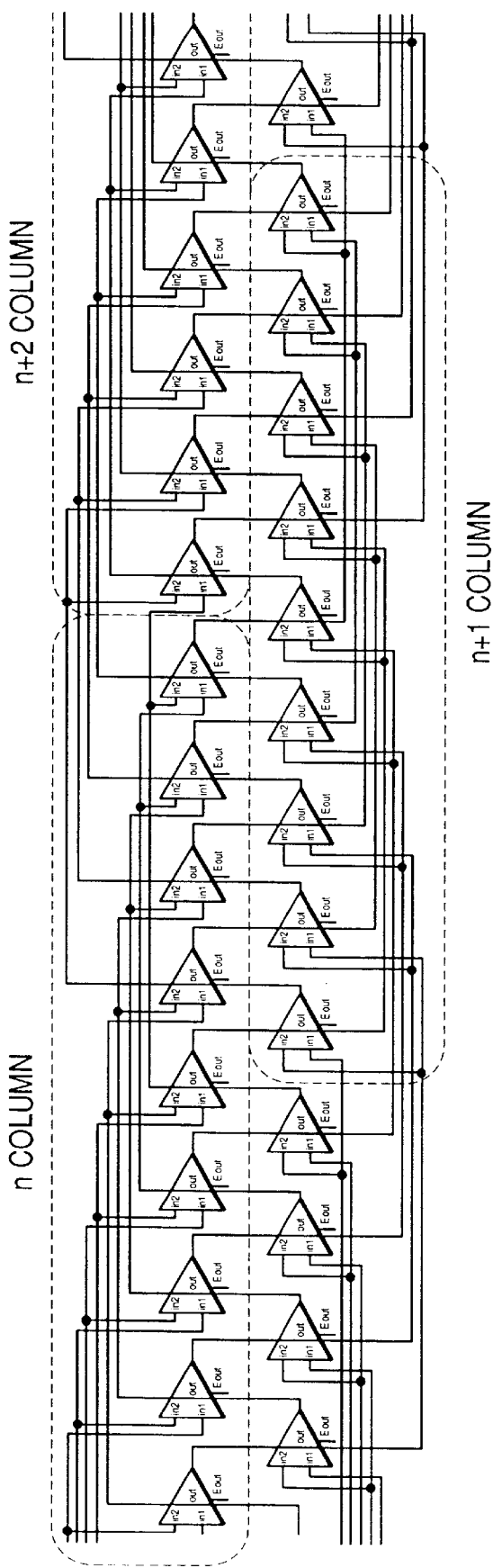
FIG. 19 is a layout diagram illustrating one embodiment of a lattice-like delay circuit according to the present invention.

FIG. 19 shows a layout of one embodiment of a lattice-like delay circuit according to the present invention. Although the lattice-like delay circuit is illustrated in a circuit-diagram form in the present embodiment, logic gate means used as delay circuits are drawn in accordance with a geometric layout of a semiconductor. In the present embodiment, an nth-stage logic gate means column comprised of m arranged in the first signal transfer direction and a logic gate means column corresponding to an n+2th-stage located subsequently by two stages from the nth-stage are provided so as to be arranged in line. A logic gate means column corresponding to an n+1th stage located later by one stage from the nth-stage is disposed so as to be adjacent across the latter half and the former half of these two logic gate means columns. Thus, the halves of the logic gate means columns are alternately disposed so as to be shifted from each other, so that the lattice-like delay circuit can be constructed in the form of the logic gate means arranged in two rows.

In such a layout arrangement, the transfer of signals is performed in lattice form along the first and second signal transfer directions by the respective logic gate means. In this condition, the lengths of wires used for their signal transfer can be made equal to each other in the respective logic gate means and the above small amount delays can be realized with high accuracy. Further, even when it is desired to obtain a large number of output signals, the logic gate means column located on the upper side can obtain output signals from the side above thereof and the logic gate means column located on the lower side can obtain output signals from the side below thereof. Therefore, since signal delays on output signal paths can be also made equal to each other, higher-accuracy small amounts of signal delay can be realized.

Figure 20:
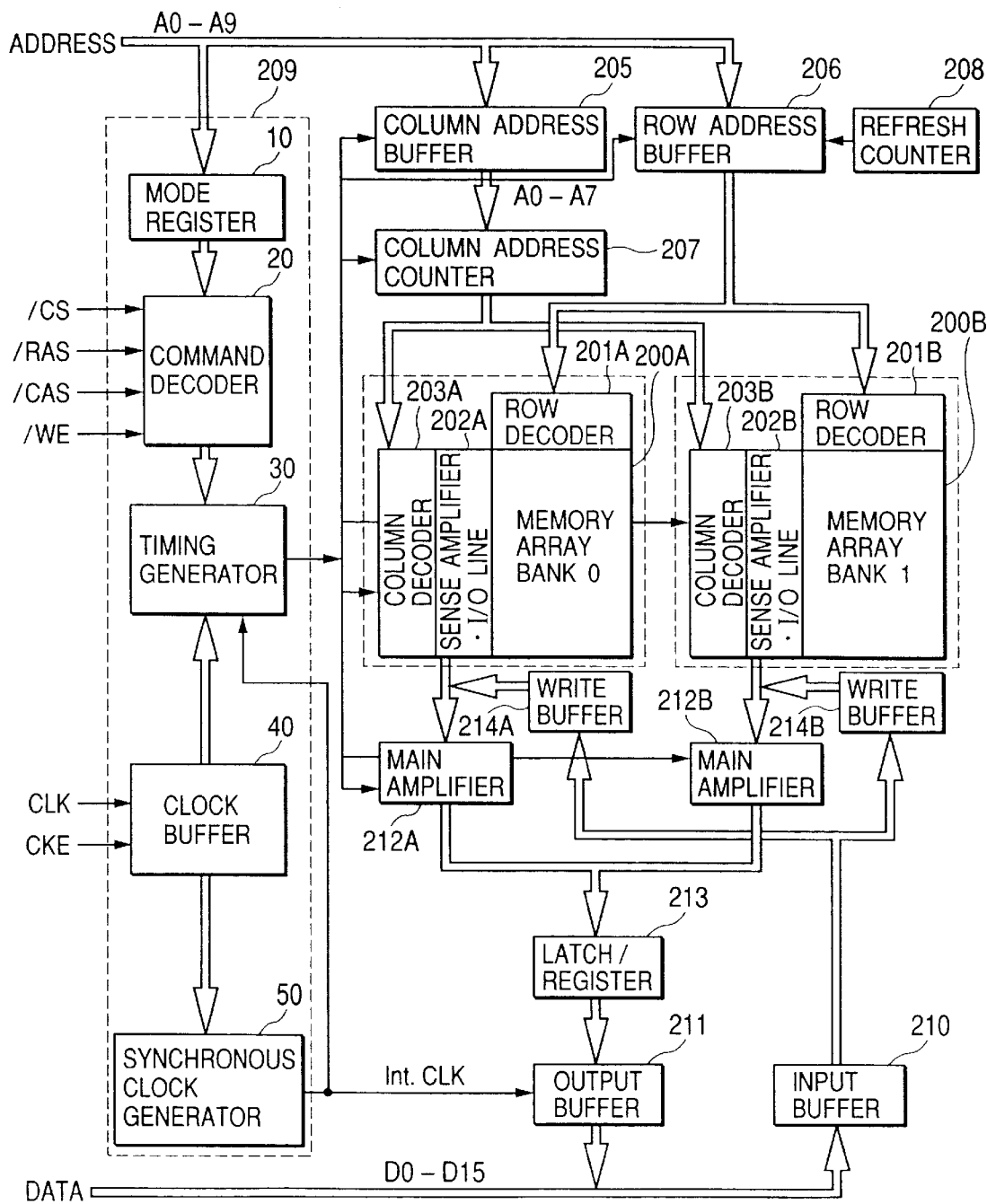
FIG. 20 is an overall block diagram depicting one embodiment of a synchronous DRAM to which the present invention is applied.

FIG. 20 is an overall block diagram showing one embodiment of a synchronous DRAM (hereinafter called simply "SDRAM") to which the present invention is applied. Although not restricted in particular, the SDRAM shown in the same drawing is formed on a single semiconductor substrate like monocrystal silicon by the known semiconductor IC manufacturing technique.

The SDRAM has a memory array 200A which constitutes a memory bank 0, and a memory array 200B which constitutes a memory bank 1. The memory arrays 200A and 200B are respectively provided with dynamic memory cells arranged in matrix form. According to the drawing, select terminals of memory cells placed in the same column are electrically coupled to word lines (not shown) every columns and data input/output terminals of memory cells placed in the same row are electrically coupled to complementary data lines (not shown) every rows.

One of the unillustrated word lines of the memory array 200A is driven to a select level in accordance with the result of decoding of a row address signal by a row decoder 201A. The unillustrated complementary data lines of the memory array 200A are electrically connected to an I/O line 202A including sense amplifiers and column selection circuits. Each of the sense amplifiers in the I/O line 202A including the sense amplifiers and the column selection circuit is an amplifier circuit for detecting the difference between micro potentials which appear on each individual complementary data lines according to the reading of data from the memory cells and amplifying it. Each column switch circuit used therefor is a switch circuit for individually selecting the complementary data lines to make continuity between the complementary data line and the complementary I/O line. The column switch circuit is selectively operated in accordance with the result of decoding of a column address signal by a column decoder 203A.

In a manner similar to the above, a row decoder 201B, an I/O line 202B including sense amplifiers and column selection circuits, and a column decoder 203B are provided even on the memory array 200B side. The above complementary I/O lines are respectively electrically connected to output terminals of write buffers 214A and 214B and input terminals of main amplifiers 212A and 212B. Signals outputted from the main amplifiers 212A and 212B are transmitted to an input terminal of a latch/register 213. A signal outputted from the latch/register 213 is outputted from an external terminal through an output buffer 211. Further, a write signal inputted from the external terminal is transmitted to the input terminals of the write buffers 214A and 214B through an input buffer 210. The above-described external terminal serves as a data input/output terminal for outputting data D0 through D15 comprised of 16 bits.

Address signals A0 through A9 supplied from address input terminals are brought to a column address buffer 205 and a row address buffer 206 in address multiplex form. The supplied address signals are held by their corresponding buffers. In a refresh operation mode, the row address buffer 206 captures a refresh address signal outputted from a refresh counter 208 as a row address signal. The output of the column address buffer 205 is supplied to a column address counter 207 as preset data therefor. The column address counter 207 outputs values obtained by successively incrementing column address signals used as the preset data or the column address signals to the column decoders 203A and 203B.

A controller 209 indicated by a dotted line in the same drawing is supplied with external control signals such as a clock signal CLK, a clock enable signal CKE, a chip select signal /CS, a column address strobe signal /CAS (symbol / means that a signal provided with / is a row enable signal), a row address strobe signal /RAS and a write enable signal /WE, etc., and control data inputted from the address input terminals A0 through A9 and forms or produces internal timing signals for controlling operation modes of the SDRAM and the operations of the circuit blocks, based on changes in the levels of these signals, timing and the like Further, the controller 209 includes a mode register 10, a command decoder 20, a timing generator 30, a clock buffer 40 and a synchronous clock generator 50.

The clock signal CLK is inputted to the synchronous clock generator through the clock buffer 40 where an internal clock is generated. The clock generator using the lattice-like delay circuit is used as for the synchronous clock generator. The internal clock is used as a timing signal int.CLK for activating the output buffer 211. A clock signal, which has passed through the clock buffer, is transmitted to other circuits as it is. If a delay between the internal clock and the external clock presents a problem, then the synchronized clock signal may be formed, followed by supply even to the timing generator 30.

Other external input signals are rendered significant in synchronism with the leading edge of the internal clock signal. The chip select signal /CS provides instructions for starting a command input cycle, based on its low level. The transition of the chip select signal /CS to a high level (chip non-selected state) and other inputs do not make sense. However, the state of selection of each memory bank and the internal operations such as a burst operation, etc. to be described later are not affected by the transition of the signal to the chip non-selected state. The respective signals of /RAS, /CAS and /WE differ in function from corresponding signals employed in the normal DRAM but serve as significant signals when a command cycle to be described later is defined.

The clock enable signal CKE is a signal for providing instructions for validity of the following clock signal. If the clock enable signal CKE is of a high level, then the leading edge of the next clock signal is made effective. If the clock enable signal CKE is low in level, then the leading edge thereof is made ineffective. When an external control signal /OE for performing the control of output enable on the output buffer 211 in an read mode is provided although not shown in the drawing, such a signal /OE is also supplied to the controller 209. When the external control signal /OE is high in level, for example, the output buffer 211 is brought to a high output impedance state.

The row address signals are respectively defined by A0 to A8 levels in a row address strobe/bank active command cycle to be described later synchronized with the leading edge of the clock signal CLK (internal clock signal).

The address signal A9 is regarded as a bank select signal in the row address strobe/bank active command cycle. Namely, when the input of A9 is low in level, the memory bank 0 is selected, whereas when it is high in level, the memory bank 1 is selected. Although not restricted in particular, the control on the selection of the memory bank can be performed by processes such as the activation of only the row decoder on the selected memory bank side, all the non-selection of the column switch circuits on the non-selected memory bank side, connections to the input buffer 210 and the output buffer 211 on the selected memory bank side alone, etc.

The address signal A8 in a precharge command cycle to be described later indicates the aspect of a precharge operation made to complementary data lines or the like. A high level thereof indicates that objects to be precharged are both memory banks. A low level thereof indicates that one memory bank specified by the address signal A9 is an object to be precharged.

The above-described column address signals are defined by A0 through A7 levels in a read or write command (corresponding to a column address/read command or a column address/write command) cycle synchronized with the leading edge of the clock signal CLK (internal clock). Each column address defined in this way is set as a start address for burst access.

Principal operation modes of the SDRAM, which are to be instructed by commands, will now be described.

(1) Mode Register Set Command (Mo)

This is a command for setting the mode register 10, which is specified by /CS, /RAS, /CAS and /WE=low level. Data (register set data) to be set is given through each of A0 through A9. Although not restricted in particular, the register set data may be defined as a burst length, a CAS latency, a write mode, etc. Although not restricted in particular, the settable burst length may be defined as 1, 2, 4, 8 and a full page, the settable CAS latency may be defined as 1, 2 and 3, and the settable write mode may be defined as burst write and single write.

The CAS latency indicates what cycles of internal clock signal are wasted from the falling edge of the /CAS to the output operation of the output buffer 211 upon a read operation specified by a column address/read command to be described later. An internal operation time for the reading of data is required until the read data is established or determined. Therefore, the CAS latency is used to set the internal operation time according to the use frequency of the internal clock signal. In other words, when an internal clock signal having a high frequency is used, the CAS latency is set to a relatively large value. On the other hand, when an internal clock signal having a low frequency is used, the CAS latency is set to a relatively small value. When there is provided such a CAS latency function, the function of the clock counter in the clock generator shown in FIG. 8 or 13 is omitted.

(2) Row Address Strobe/bank Active Command (Ac)

This is a command for providing instructions for a row address strobe and making the selection of each memory bank effective. This command is specified by /CS and /RAS low level and /CAS and /WE high level. At this time, addresses supplied to A0 through A8 are captured as row address signals, and a signal supplied to A9 is captured as a select signal for each memory bank. Their capturing operations are performed in synchronism with the leading edge of the internal clock signal as mentioned above. When the corresponding command is specified, for example, a word line in a memory bank specified by the command is selected. Thus, memory cells connected to the corresponding word line and their corresponding complementary data lines are brought into conduction.

(3) Column Address/read Command (Re)

This is a command required to start a burst read operation. Further, it is also a command for providing instructions for a column address strobe. This command is specified according to /CS and /CAS=low level and /RAS and /WE=high level. At this time, column addresses supplied to A0 through A7 are captured as column address signals respectively. Thus, the captured column address signals are supplied to the column address counter 207 as burst start addresses. Prior to the burst read operation specified thereby, a memory bank and a word line lying therein have been selected in the row address strobe/bank active command cycle. Upon the burst read operation in this condition, the memory cells connected to the selected word line are successively selected in accordance with each address signal outputted from the column address counter 207 in synchronism with the internal clock signal and their items of data are sequentially read therefrom. The number of the sequentially-read data is set as a number specified by the above-described burst length. The output buffer 211 starts reading data while waiting for the number of cycles in the internal clock signal defined by the CAS latency.

(4) Column Address/write Command (Wr)

When the burst write is set to the mode register 10 as a write operation mode, this command is defined as a command required to start the corresponding burst write operation. When the single write is set to the mode register 10 as a write operation mode, this command is defined as a command required to start the corresponding signal write operation. Further, the corresponding command provides instructions for column address strobes at the signal write and the burst write. The command is specified by /CS, /CAS and /WE=low level and /RAS=high level. At this time, the addresses supplied to A0 through A7 are captured as column address signals respectively. Thus, the captured column address signals are supplied to the column address counter 207 as burst start addresses upon the burst write. A procedure for the burst write operation specified thereby is also performed in a manner similar to the burst read operation. However, no CAS latency is provided for the write operation and the capturing of the write data is started from the column address/write command cycle.

(5) Precharge Command (Pr)

This is defined as a command for starting a precharge operation to be effected on a memory bank selected by A8 and A9. This command is specified by /CS, /RAS and /WE=low level and /CAS=high level.

(6) Autorefresh Command

This is a command required to start aurorefresh and specified by /CS, /RAS and /CAS=low level and /WE and CKE=high level.

(7) Burst Stop/in/full Page Command

This is a command required to stop all the memory banks from a burst operation for a full page. This command is ignored in burst operations other than that for the full page. This command is specified by /CS and /WE=low level and /RAS and /CAS=high level.

(8) No-operation Command (Nop)

This is a command for indicating the non-execution of a substantial operation, which is specified by /CS=low level and /RAS, /CAS and /WE=high level.

When another memory bank is specified in the course of a burst operation and the row address strobe/bank active command is supplied while the burst operation is being performed in one memory bank in the SDPAM, no influence is imposed on the operation at one memory bank under the corresponding execution and the operation of a row address system in another memory bank is enabled. For example, the SDRAM has means for holding therein data, addresses and control signals supplied from the outside. Although not restricted in particular, the held contents thereof, particularly, the addresses and control signals are held every memory banks. Alternatively, data corresponding to one word line in the memory block selected according to the row address strobe/bank active command cycle is to be held in the latch/register 213 for purposes of the read operation in advance before the column-system operation.

Thus, while a non-processed command is being executed, the precharge command and the row address strobe/bank active command for a memory bank different from the memory banks to be processed by the command being under execution are issued unless data D0 through D15 comprised of 16 bits collide with each other at a data input/output terminal to thereby make it possible to start an internal operation in advance.

Since the SDRAM is capable of inputting and outputting data, addresses and control signals in synchronism with the clock signal CLK (internal clock signal), a large-capacity memory similar to a DRAM can be activated at high speed equivalent to that for a SRAM. It can be understood that how many data should be accessed to the selected one word line, is specified by a burst length, whereby a plurality of pieces of data can be read or written continuously while selected states in a column system are being successively switched by the built-in column address counter 207.

When the clock generator is provided as in the present embodiment, the time intervals between issuing a read command from the memory controller and restoring data thereto can be set equal to each other among all the SDRAMs. Thus, the frequency of the clock signal CLK can be made high like 200 MHz. The SDRAM may be set to a system for outputting data in synchronism with the leading edge and trailing edge of the clock signal intCLK.

Figure 21:
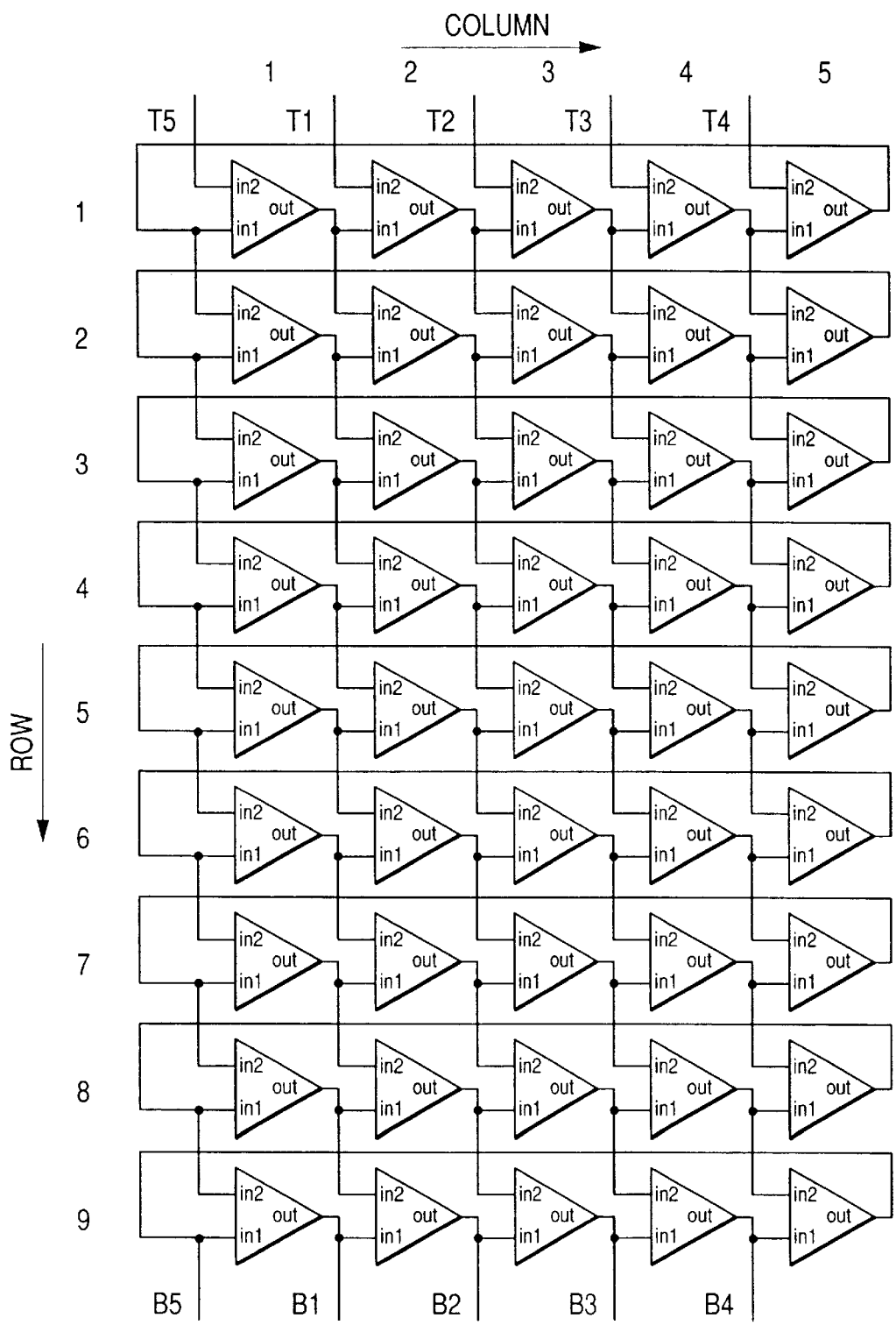
FIG. 21 is a block diagram showing one embodiment of a lattice-like oscillator circuit according to the present invention.

FIG. 21 is a circuit diagram showing one embodiment of a lattice-like oscillation circuit to which the present invention is applied. The present embodiment is partially similar in circuit configuration itself to one disclosed by the above-described reference or literature except for the delay circuits arranged in lattice form. However, the logic gate means used as the delay circuits arranged in lattice form are equivalent to ones in which the coupling means are respectively provided between the two inputs as shown in FIGS. 1, 2 and 4 in order to obtain oscillation signals made different in phase from each other with small amounts of delay equal to each other.

Figure 22:
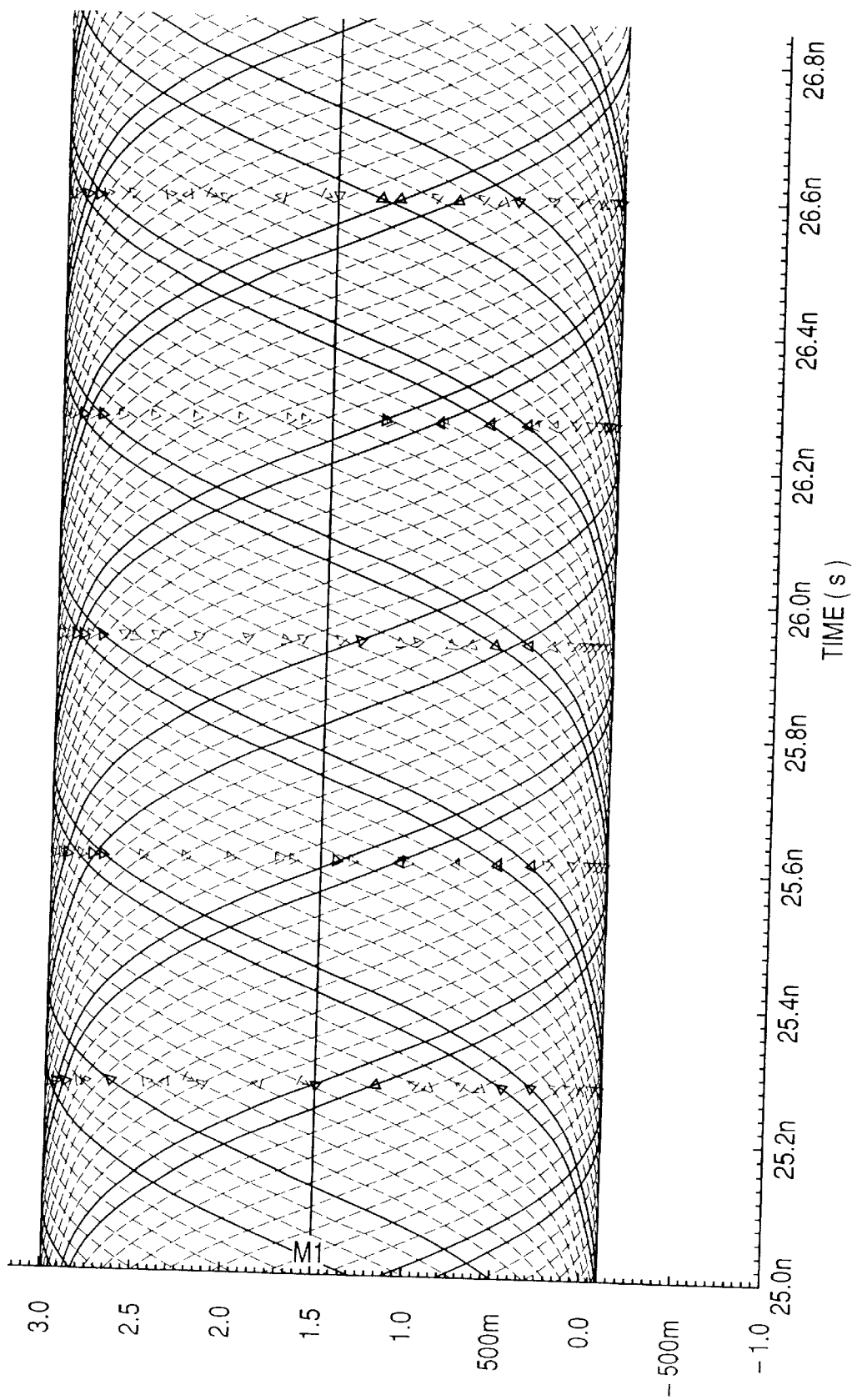
FIG. 22 is a waveform diagram for describing the operation of the lattice-like oscillator circuit according to the present invention.

FIG. 22 illustrates an operational waveform chart at the time that the outputs of the two CMOS inverters used as each individual delay circuits referred to above are used in common and a coupling capacitor similar to the above is added between two inputs thereof. This operational waveform chart is drawn by computer simulations in the same manner as described above. The manner in which oscillating operations are performed with equal small amounts of delay is understood from the drawing. Even in the case of the present lattice-like oscillation circuit, small amounts of delay in mutual oscillation signals can be equalized to each other and the output thereof can be easily taken out by adopting the layout illustrated in the embodiment of FIG. 19 for at least some of the circuit.

Operations and effects obtained from the above-described embodiments are as follows:

(1) An advantageous effect is obtained in that a plurality of logic gate means each of which is provided with impedance means for coupling two input signals inputted between first and second input terminals and each of which forms an output signal obtained by inverting the input signals, are used so as to be disposed in lattice form in first and second signal transfer directions, the first input terminal of a logic gate means KL provided as a Kth other than the first as seen in the first signal transfer direction and disposed in an Lth stage as seen in the second signal transfer direction is supplied with a signal outputted from a logic gate means provided as the same Kth as seen in the first signal transfer direction and defined as an L−1th stage as seen in the second signal transfer direction or with an input clock signal in the case of the first-stage logic gate means, the second input terminal of the logic gate means KL is supplied with an input signal supplied to a first input terminal of a logic gate means provided as the immediately preceding K−1th as seen in the first signal transfer direction and defined as the same Lth stage as seen in the second signal transfer direction, and a second input terminal of a logic gate means provided as the first as seen in the first signal transfer direction and defined as an Lth as seen in the second signal transfer direction is supplied with an input signal supplied to a first input terminal of a logic gate means lying in the final stage as seen in the first signal transfer direction, the input signal being in phase with an input signal supplied to a first input terminal of a logic gate means at a stage preceding the final stage as seen in the second signal transfer direction, the first and second input terminals of the logic gate means defined as the first stage as seen in the second signal transfer direction and provided as the first as seen in the first signal transfer direction are respectively supplied with a clock signal through the corresponding input circuit constituting a buffer, the input clock signals supplied to the first input terminals of the respective logic gate means extending from the second to the last as seen in the first signal transfer direction are delayed in order in the first signal transfer direction by the corresponding buffer, whereby output signals having small amounts of delay can be obtained from output terminals of a plurality of logic gate means placed in at least the final stage or the immediately preceding stage as seen in the second signal transfer direction and arranged in the first signal transfer direction.

(2) Another advantageous effect can be obtained in that satisfactory signal coupling can be carried out with relative ease by providing capacitive elements as the impedance means.

(3) A further advantageous effect can be obtained in that satisfactory signal coupling can be done with relative ease by using resistive elements as the impedance means.

(4) A still further advantageous effect can be obtained in that a lattice-shaped delay circuit can be configured with relative ease by using NANG gates as the logic gate means.

(5) A still further advantageous effect can be obtained in that a lattice-like delay circuit can be configured with relative ease by using NOR gates as the logic gate means.

(6) A still further advantageous effect can be obtained in that a lattice-like delay circuit can be configured easily by using, as the logic gate means, ones in which output terminals of two inverters are commonly connected to each other.

(7) A still further advantageous effect can be obtained in that an input signal supplied to a first input terminal of a logic gate means placed in the final stage as seen in a first signal transfer direction and disposed in a first stage as seen in a second signal transfer direction is supplied to its corresponding second input terminal of a logic gate means placed in the first as seen in the first signal transfer direction and placed in a third stage as seen in the second signal transfer direction, and first and second input terminals of a logic gate means placed in the first as seen in the first signal transfer direction and placed in a second stage as seen in the second signal transfer direction are commonly supplied with a signal outputted from the first logic gate means extending in the first and second signal transfer directions, so that the shortest time as seen in the second signal transfer direction can be equally delayed by the number of stages extending in the first signal transfer direction, thereby making it possible to achieve small amounts of delay with efficiency.

(8) A still further advantageous effect can be obtained in that the lattice-like delay circuit is formed on a semiconductor substrate by laying out Nth logic gate means and N+2th logic gate means placed in the first signal transfer direction side by side so as to extend in the same direction and laying out N+1th logic gate means across the latter half of the Nth and the former half of the N+2th so as to be adjacent thereto, whereby the lengths of wires for interconnecting the logic gate means with each other can be made equal to each other and small amounts of signal delay can be achieved with high accuracy, and output signals can be easily taken out from the logic gate means.

(9) A still further advantageous effect can be obtained in that since a lattice-like oscillation circuit comprises a plurality of logic gate means each of which is provided with impedance means for coupling two input signals inputted between first and second input terminals to each other and forms an output signal obtained by inverting the input signals supplied to the input terminals, it can obtain oscillation signals shifted by small amounts of delay equal to each other.

(10) A still further advantageous effect can be obtained in that since the lattice-like oscillation circuit is formed on a semiconductor substrate by laying out Nth logic gate means and N+2th logic gate means placed in the first signal transfer direction so as to extend in the same direction and laying out N+1th logic gate means across the latter half of the Nth and the former half of the N+2th so as to be adjacent thereto, whereby the lengths of wires for interconnecting the logic gate means with each other can be made equal to each other and oscillating operations with small amounts of signal delay with high accuracy can be achieved, and output signals can be easily taken out from the logic gate means.

(11) A still further advantageous effect can be obtained in that each multiplexer selects one of signals outputted from the lattice-like delay circuit, a phase comparator compares a clock signal inputted to the lattice-like delay circuit and a clock signal outputted through the multiplexer, a control circuit supplied with the phase-compared output signal forms a control signal for the multiplexer to thereby allow the clock signal outputted through the multiplexer to be synchronized with the input clock signal with high accuracy.

(12) A still further advantageous effect can be obtained in that an up-down counter is used as the control circuit and allowed to perform a +1 or −1 counting operation in response to the output of the phase comparator, and the result of counting thereof is decoded to form a control signal so as to control the corresponding multiplexer, whereby the high-accuracy DLL circuit can be easily implemented.

(13) A still further advantageous effect can be obtained in that in a semiconductor memory comprising: a memory array in which memory cells are arranged in matrix form at points of intersection of a plurality of word lines and a plurality of bit lines; an address selection circuit-for selecting a corresponding memory cell in such a memory array and a synchronous clock generator for receiving control signals and a clock signal therein and generating an internal clock signal corresponding to the clock signal in accordance with the control signals; and an input/output circuit for outputting a read signal from the memory cell in synchronism with the internal clock signal generated from the synchronous clock generator, the lattice-like delay circuit is used as the synchronous clock generator to thereby allow a data output operation with high accuracy.

(14) A still further advantageous effect can be obtained in that the use of a counter as the control circuit makes it possible to select one of a plurality of output signals of the lattice-like delay circuit after the number of clocks specified with respect to the input clock signal has been counted.

(15) A still further advantageous effect can be brought about in that a semiconductor memory system can be obtained wherein a semiconductor memory device for forming an internal clock signal using the lattice-like delay circuit and outputting the read signal from the memory cell is provided in plural form, one memory control circuit is provided for the plurality of semiconductor memory devices, and supplies read/write control signals and the clock signal to each individual semiconductor memory devices and generates a control signal for mutually equalizing delay times for the transfer of signals to the respective semiconductor memory devices to thereby form control signals for the lattice-like delay circuits provided in the semiconductor memory devices, whereby data can be read out at high speed.

(16) A still further advantageous effect can be brought about in that a semiconductor memory system can be obtained wherein a memory module for forming an internal clock signal using the lattice-like delay circuit and outputting the read signal from the memory cell is provided in plural form, one memory control circuit is provided for the plurality of memory modules, and supplies read/write control signals and the clock signal to each individual semiconductor memory devices and generates a control signal for mutually equalizing delay times for the transfer of signals to the respective semiconductor memory devices to thereby form control signals for the lattice-like delay circuits provided in the respective semiconductor memory devices, whereby data can be read out at high speed.

The invention of the present application is not necessarily limited to the aforementioned embodiments. It is needless to say that various changes can be made thereto within the scope not departing from its substance. For example, a specific configuration of RAM can be widely applied to such a semiconductor memory such as a general-purpose DRAM, a dynamic RAM having an input/output function based on Rambus specifications, a static RAM or the like, that data is inputted and outputted in accordance with a clock signal supplied from the above-described external terminal and to a memory system using the semiconductor memory. It can be also widely applied to various semiconductor integrated circuit devices each of which forms an internal clock signal synchronized with a clock signal supplied from the outside and needs to delay its phase by a small amount with respect to the external clock signal.

A layout of a lattice-like delay circuit or a lattice-like oscillation circuit may be one wherein a circuit is formed on a semiconductor substrate in a lattice state. The lattice-like delay circuit is available similarly even when internally-generated timing signals are outputted while being delayed by small amounts. The lattice-like oscillation circuit can be widely used in a semiconductor integrated circuit device for forming a plurality of kinds of oscillation signals different in phase from each other.

Figure 23:
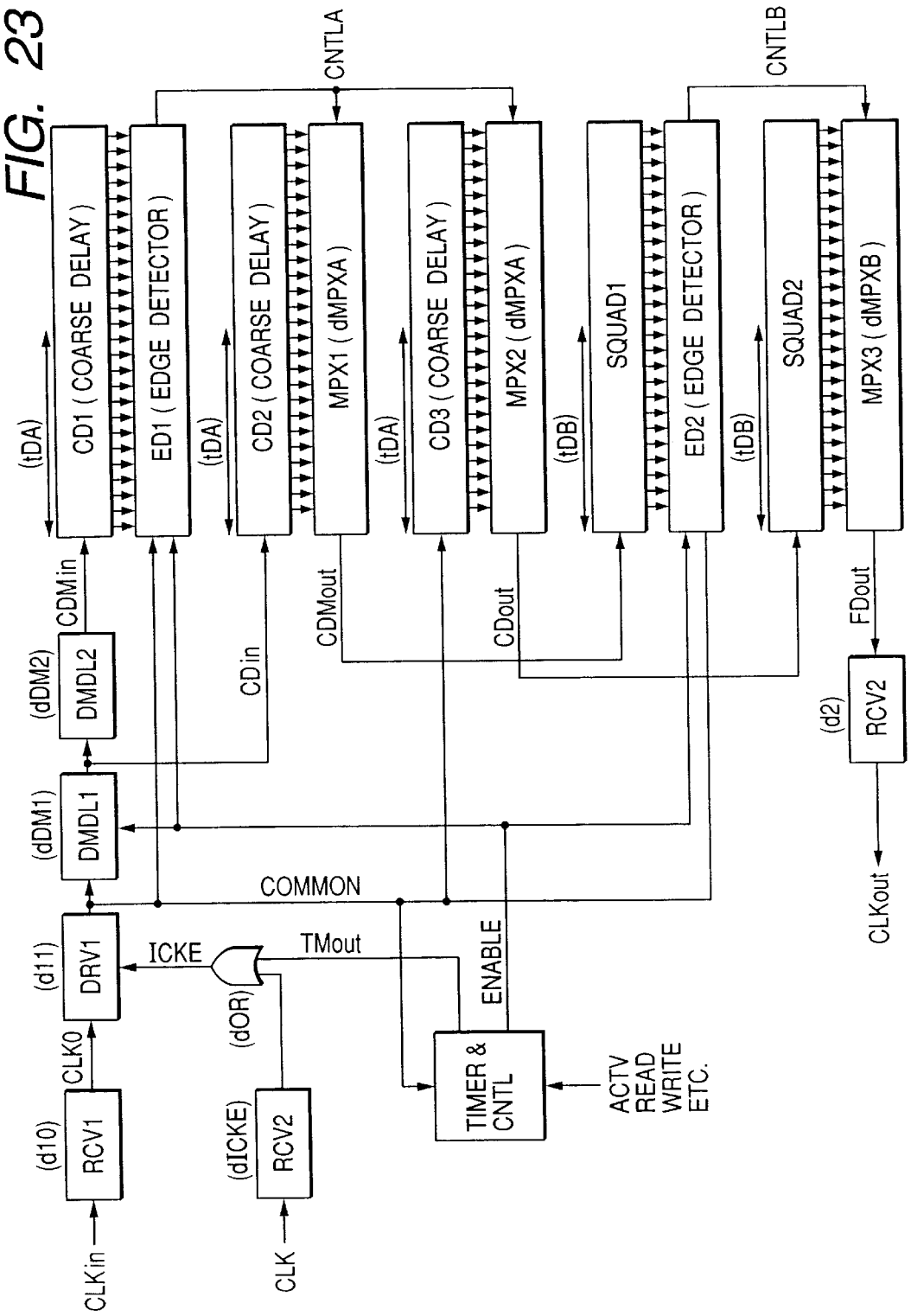
FIG. 23 is a block diagram showing one embodiment of a clock synchronous circuit according to the present invention.

FIG. 23 is a block diagram showing one embodiment of a clock synchronous circuit according to the present invention. Respective circuit blocks shown in the same drawing are formed on a single semiconductor substrate like monocrystal silicon together with unillustrated other circuits by the known semiconductor manufacturing technique.

In the present embodiment, two types of delay circuits are used to ensure a synchronizable frequency band, scale down a circuit size and reduce synchronous errors. One delay circuit comprises such delay circuits (Coarse Delays) CD1 through CD3 that times in respective stages are long like 300 psec or more, i.e., delay circuits low in time resolution's accuracy to ensure the synchronizable frequency band. These coarse delays CD1 through CD3 are constructed by tandem connections of CMOS inverters identical in circuit configuration to each other.

The other delay circuit make use of such lattice-like delay circuits SQUAD1 through SQUAD2 that times in respective stages according to the development by the inventors or the like of the present application are low like 20 to 100 psec. The combination of two kinds of ones large and small in time resolution makes it possible to ensure the synchronizable frequency band, scale down the circuit size and reduce the synchronous errors. Namely, a configuration is adopted wherein rough synchronizing signals are formed or produced by the coarse delays CD1 through CD3 relatively low in time resolution and synchronous errors included therein are corrected by the lattice-like delay circuits SQUAD1 and SQUAD2 low in time resolution.

In the present embodiment, the three CD1 through CD3 are used as the coarse delays low in time resolution to form the synchronized clock signal with high accuracy. One coarse delay CD1 delays an input clock pulse CDMin and supplies it to an edge detector (Edge Detector) ED1. The edge detector ED1 compares each of edges of delay signals in respective stages of the coarse delay CD1 and an edge of a clock pulse inputted with a delay of one clock. If both edges coincide with each other on a time basis, then the edge detector ED1 detects the position (i.e., the number of stages N of passed delay element circuits) of the edge at the coarse delay CD1.

A multiplexer MPX1 and a multiplexer MPX2 are controlled based on a detected signal CNTLA produced from the edge detector ED1 so that output pulses CDMout and CDout are respectively outputted from the coarse delays CD2 and CD3 identical in configuration to the coarse delay CD1. The output pulse CDMout outputted from the multiplexer MPX1 is supplied to the lattice-like delay circuit SQUAD1 which supplies its delay signal to an edge detector ED2. The edge detector ED2 compares each of edges of delay signals in respective stage of the lattice-like delay circuit SQUAD1 with an edge of a clock pulse inputted with a further delay of one clock If both edges coincide with each other, then the edge detector ED2 detects the position (i.e., the number of stages N of passed delay element circuits) of the edge at the lattice-like delay circuit SQUAD1.

A multiplexer MPX3 is controlled by a detected signal CNTLB produced from the edge detector ED2 so that an output pulse Fdout is outputted from the delay circuit SQUAD2 identical in configuration to the lattice-like delay circuit SQUAD1. The FDout is supplied to an unillustrated other circuit as an internal clock signal CLKout synchronized through an output driver DRV2.

The internal clock signal CLKout is one synchronized with an input clock signal CLKin supplied from an external terminal. The input clock signal CLKin is supplied to a common node COMMON of the synchronous circuit through a receiver RCV1 used as an input buffer and a driver DRV1, where it is used as the above-described input clock pulse. Namely, the input pulse captured by the common node COMMON to which the output of the driver DRV1 is electrically connected, is delayed through dummy delay circuits DMDL1 and DMDL2 without being supplied to the input of the coarse delay CD1 as it is, thereby setting it as the signal CDMin to be inputted to the coarse delay CD1. The dummy delay circuit DMDL2 performs timing so that the lattice-like delay circuits SQUAD1 and SQUAD2 high in time resolution can demonstrate their desired performance. The dummy delay circuit DMDL1 forms or produces delay times corresponding to delay times of the receiver RCV1, driver DRV1 and multiplexer MPX3.

Figure 24:
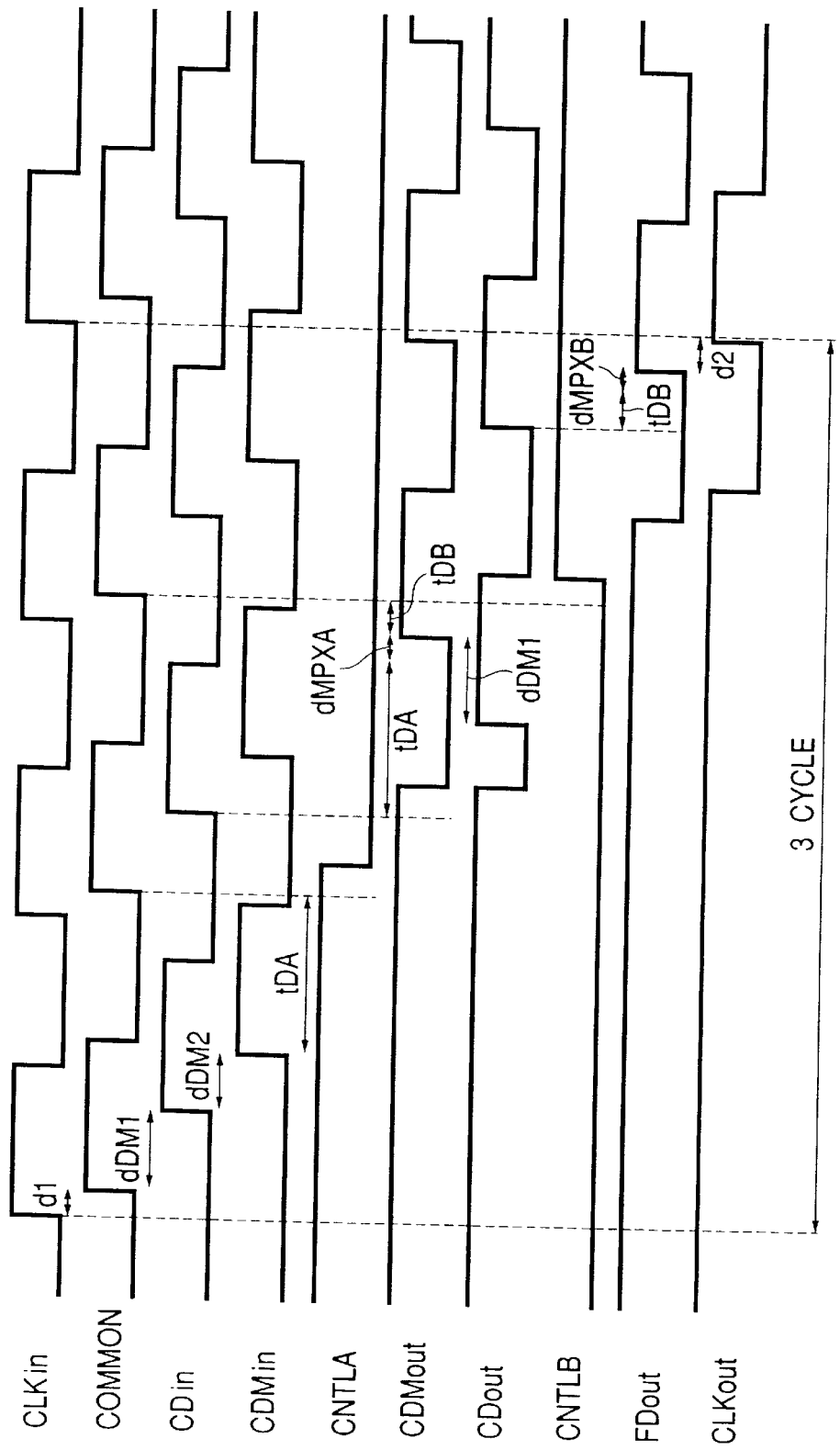
FIG. 24 is a timing chart for describing the operation of the clock synchronous circuit shown in FIG. 23.

FIG. 24 is a timing chart for describing the operation of the clock synchronous circuit. The clock signal CLKin inputted from the external terminal is delayed by a delay time d1 through the receiver RCV1 and the driver DRV1, so that the clock pulse at the common node COMMON varies. The input pulse captured by the common node COMMON is delayed by a delay time dDM1 through the dummy delay circuit DMDL1 and thereafter delayed by a delay time dMD2 through the dummy delay circuit DMDL2. As a result, the so-delayed input pulse is set as the input pulse CDMin for the coarse delay CD1.

The input pulse CDMin propagates through the coarse delay CD1. The leading edge thereof is compared with the leading edge of a pulse inputted to the common node COMMON with a delay of one cycle. An Nth stage corresponding to the position of an edge of a pulse delayed by a delay time tDA in the coarse delay CD1 is detected so that its detected signal CNTLA is formed.

The multiplexers MPX1 and MPX2 are controlled by the detected signal CNTLA so that delay signals CDMout and CDout in the same Nth stage are outputted through the coarse delays CD2 and CD3. They are supplied to their corresponding different lattice-like delay circuits SQUAD1 and SQUAD2. In the same manner as described above, the leading edge of a clock propagated through the lattice-like delay circuit SQUAD1 is compared with that of a pulse inputted to the common node COMMON with a delayed of two cycles. Thus, an Mth stage corresponding to the edge of a pulse delayed by a delay time tDB in the lattice-like delay circuit SQUAD1 is detected so that a detected signal CNTLB thereof is produced. Namely, since the input of the lattice-like delay circuit SQUAD1 is supplied with an output pulse CDin of the dummy delay circuit DMDL1, which is delayed by a delay time tDA in the coarse delay CD2 and further delayed by a delay time dMPXA in the multiplexer MPX1, the edge of a pulse delayed by the delay time tDB corresponding to the difference therebetween is selected.

The multiplexer MPX3 is controlled by the detected signal CNTLB to output an Mth-stage delay signal FDout corresponding to the delay time tDB of the lattice-like delay circuit SQUAD2 having the same circuit configuration as the lattice-like delay circuit SQUAD1. An output clock pulse CLKout delayed by a delay time d2 through the output driver DRV2 is synchronized with the above-described input clock pulse CLKin within a small error range corresponding to high time resolution of the lattice-like delay circuit SQUAD1 in a third cycle.

A quantitative description of the above operation is as follows: Since the difference in time between the edge propagated through the coarse delay CD1 and the edge at the common node COMMON becomes one clock cycle, the following formula (1) is established for the edge comparison at the coarse delay CD1 low in time resolution.

$$dMD1+dMD2+tDA=tCK-\delta A \tag{1}$$

where tDA indicates the time required to propagate a clock edge through each of the coarse delays CD1 through CD3, tCK indicates a clock cycle, and $\delta A$ indicates an error produced or encountered between time resolutions of the coarse delays CD1 through CD3.

The following formula (2) is established similarly even for the edge comparison at the lattice-like delay circuit SQUAD1 high in time resolution.

$$dDM1+tDA+dMPXA+tDB=tCK-\delta B \tag{2}$$

where dDM1 indicates a delay time of the dummy delay circuit DMDL1, dMPXA indicates a delay time of the multiplexer MPX1, and $\delta B$ indicates an error produced between time resolutions of the lattice-like delay circuits SQUAD1 and SQUAD2. $\delta B$ is smaller than $\delta A$ and on the order of 10 psec.

A propagation time $\tau$ between the input clock signal CLKin and the output clock signal CLKout can be represented as the following formula (3) by finding the sum of delay times in order of the propagation path.

$$\tau=d1+tDA+dMPXA+tDB+dMPXB+d2 \tag{3}$$

If the above expression (3) is rewritten using the above formula (2), then it can be represented as the following formula (4):

$$\tau=d1+tCK-\delta B-dDM1+dMPXB+d2 \tag{4}$$

If the delay time dDM1 of the dummy delay circuit DMDL1 is set so as to be equal to the sum (d1+d2+dMPXB) of the time delay d1 of the receiver RVC1 used as the input buffer and the driver DRV1, the time delay d2 of the output buffer DRV2 and the delay time dMPXB of the multiplexer MPX3 from the formula (4), then the following expression (5) is established. CLKin and CLKout are synchronized with each other with the error δB.

$$\tau = tCK - \delta B \tag{5}$$

The dummy delay circuit DMDL2 is a delay circuit for adjusting or correcting errors produced in the lattice-like delay circuits SQUAD1 and SQUAD2. Arranging tDB in accordance with the above expressions (1) and (2) yields the following formula (6):

$$tDB = dDM2 - dMPXA + \delta A - \delta B \tag{6}$$

If the delay time dDM2 of the dummy delay circuit DMDL2 is made long from the formula (6), then the delay time tDB produced in the lattice-like delay circuits SQUAD1 and SQUAD2 can be increased. Since the lattice-like delay circuits SQUAD1 and SQUAD2 are unstable in operation and have damped vibrating variations in delay time at the delay stages on the initial-stage side as will be described later, the delay time dDM2 of the dummy delay circuit DMDL2 is used for time adjustments or timing for using an operating or active region capable of obtaining a high-accuracy small delay time stabler while avoiding the use of the delay output on the initial-stage side referred to above.

The maximum cycle tCKmax of a clock signal synchronizable by the clock synchronous circuit of the present-embodiment is determined according to the maximum delay time of the coarse delays CD1 through CD3, in other words, the length of a CMOS inverter column. If the maximum value of the coarse delays CD1 through CD3, i.e., the entire propagation delay time is regarded as tDAmax, then the following formula (7) is established from the expression (1).

$$tCK < dDM1 + dDM2 + tDAmax = tCKmax \tag{7}$$

On the other hand, restrictions imposed on the minimum cycle of the synchronizable clock can be eliminated. As the clock cycle becomes short, dDM1+dDM2>tCK is established, so that a positive delay time tDA which satisfies the formula (1), does not exist. However, if the following formula (8) is established, then synchronization is made possible as indicated by the following expressions (9) through (12).

$$dDM1 + dDM2 + tDA = ntCK - \delta A (n=1, 2, \ldots) \tag{8}$$

The following formula is obtained from the above expression (8):

$$(dDM1+dDM2)/tCK < n < (tDAmax+dDM1+dDM2)/tCK \tag{9}$$

Therefore, if the following formula is established, $$tDAmax > dDM1 + dDM2 \tag{10}$$

the formula (9) is rewritten as follows:

$$(dDM1+dDM2)/tCK < n < 2(dDM1+dDM2)/tCK \tag{11}$$

Thus, tCK below dDM1+dDM2 is as follows:

$$2(dDM1+dDM2)/tCK - (dDM1+dDM2)/tCK = (dDM1+dDM2)/tCK > 1 \tag{12}$$

Therefore, a natural number n, which satisfies the formula (11), always exists.

Thus, if tDmax is set so as to meet the expression (10), it is then possible to eliminate the restrictions on the minimum cycle of the synchronizable clock. However, the number of clock cycles required to generate the synchronizing clock increases with an increase in n. Namely, although three clock cycles were required for synchronization even at the lowest because of measurements of two clock cycles in total: one cycle in the case of the coarse delay CD1 and one cycle in the case of the lattice-like delay circuit SQUAD1, the number of clock cycles increases to the two clock cycles or more. In order to limit the number of the clock cycles low in reverse, it is necessary that a delay d11 of the internal clock driver DRV1 and a delay d10 of the clock receiver RCV1 are reduced so that the delay times dDM1 and dDM2 of the dummy delay circuits DMDL1 and DMDL2 are diminished.

Figure 25:
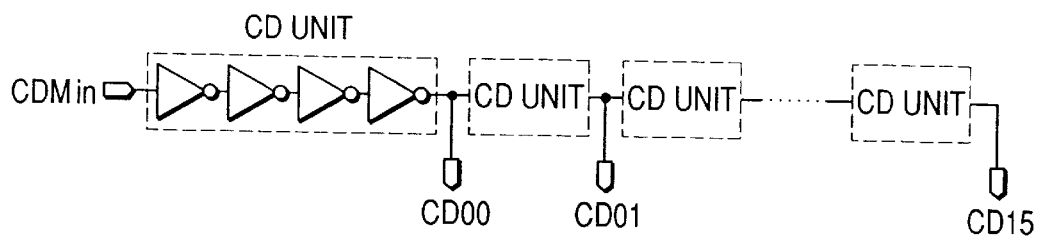
FIG. 25 is a circuit diagram illustrating one embodiment of a coarse delay CD1 shown in FIG. 23.

FIG. 25 is a circuit diagram showing one embodiment of the coarse delay CD1. The coarse delay CD1 is constructed in such a manner that four CMOS inverters are tandem-connected in the form of 16 stages as a single delay element CDunit. The coarse delay CD1 is provided so as to obtain delay signals CD00 through CD15 from the respective stages. Namely, the coarse delay CD1 is made up of 4×16= 64 CMOS inverters. The other coarse delays CD2 and CD3 are also made up of the same inverters respectively. A delay signal having a relatively low time resolution of about 300 psec is formed by making up the delay element CDunit of the four CMOS inverters.

Figure 26:
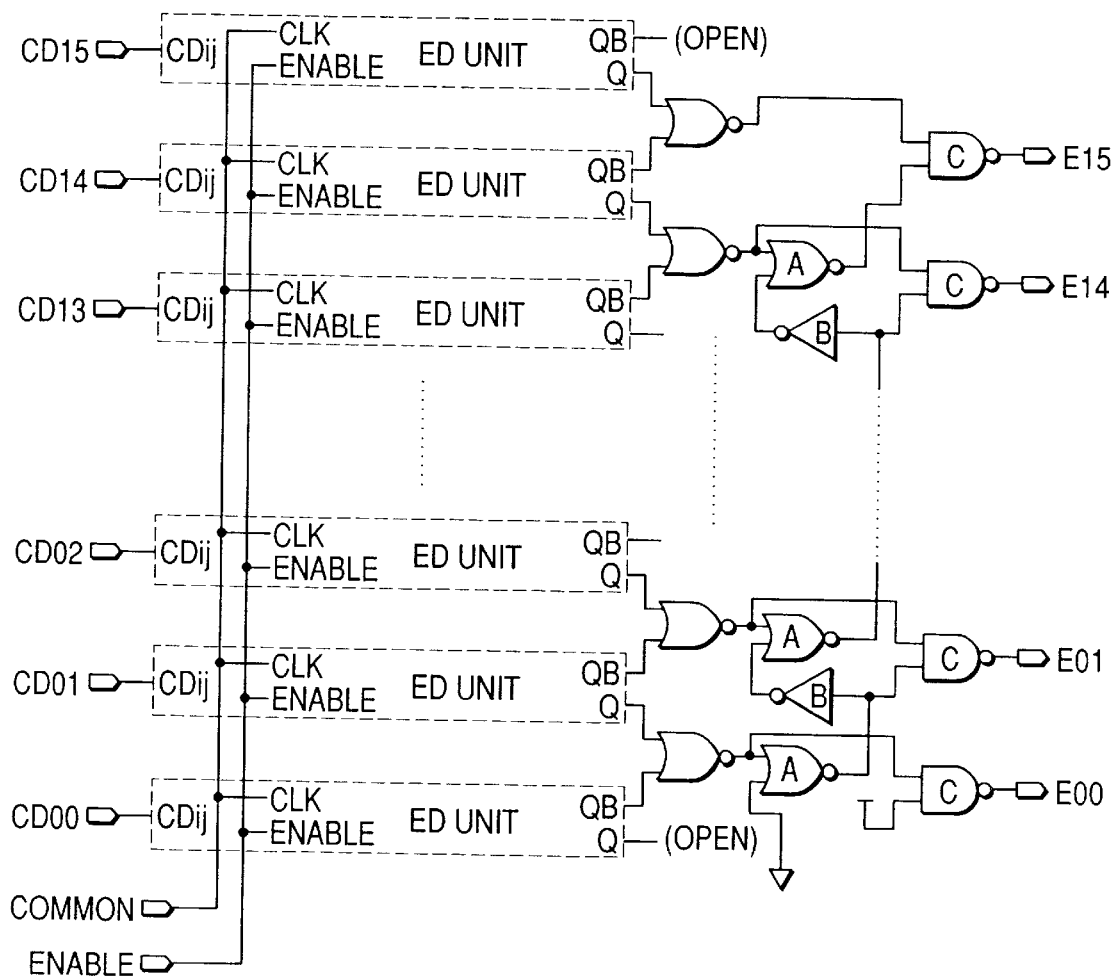
FIG. 26 is a circuit diagram showing one embodiment of an edge detector ED1 corresponding to the coarse delay CD1 shown in FIG. 23.
Figure 27:
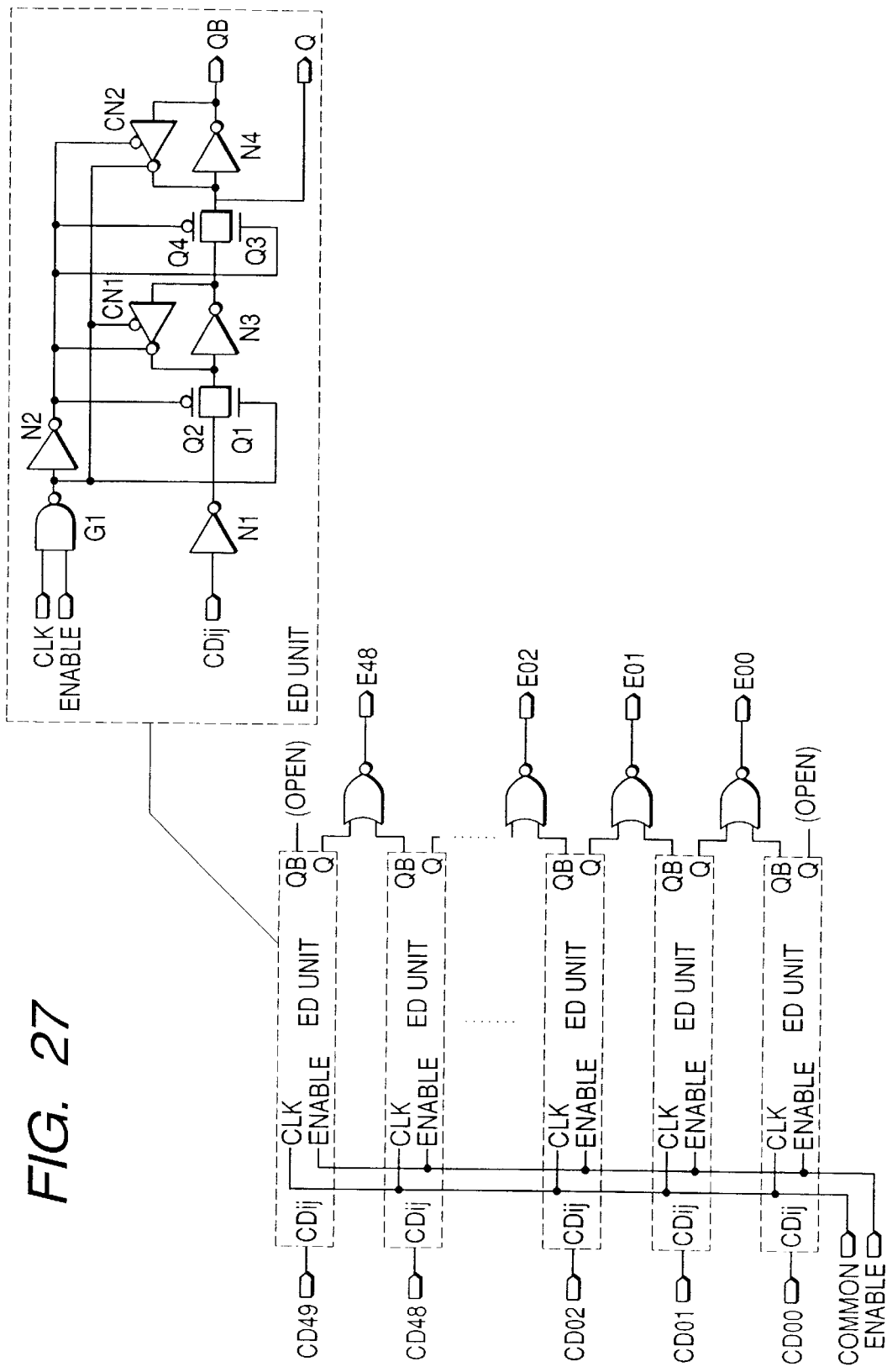
FIG. 27 is a circuit diagram illustrating one embodiment of an edge detector ED2 corresponding to a lattice-like delay circuit SQUAD1 shown in FIG. 23.

FIG. 26 is a circuit diagram showing one embodiment of an edge detection circuit or edge detector ED1. FIG. 27 is a circuit diagram illustrating one embodiment of an edge detector ED2 corresponding to the lattice-like delay circuit SQUAD1. As indicated by a specific circuit of a unit circuit in FIG. 27, it comprises two through latch circuits connected in tandem. Namely, each through latch circuit on the input side comprises a CMOS inverter N1, a CMOS switch comprised of an N channel MOSFETQ1 and a P channel MOSFET Q2, a CMOS inverter N3 that constitutes a latch circuit, and a feedback clocked inverter CN1 Each through latch circuit on the output side comprises a CMOS switch comprised of an N channel MOSFET Q3 and a P channel MOSFET Q4, a CMOS inverter N4 that constitutes a latch circuit, and a feedback clocked inverter CN2. An inverter N2 for complementarily controlling the CMOS switches is provided and supplied with a clock signal through a NAND gate G1.

One input of the edge detector ED2 is supplied with delay signals CDij at respective stages of the lattice-like delay circuit SQUAD1 The other input thereof is supplied with a clock pulse inputted to a common node COMMON through the NAND gate G1. A propagation delay signal of each stage on the leading edge of the clock pulse inputted to the common node COMMON is captured. Thereafter, the captured output QB and an output Q corresponding to a delay stage lying one stage behind are compared by a NOR gate. Levels different from each other between both signals, i.e., a low-leveled output QB of ones each brought to a high level and a low-leveled output Q of ones which have not yet been brought to the high level, are detected and outputted on the leading edge of the clock pulse of the common node COMMON.

Since the synchronizable clock frequency band is widened as described above in the edge detector ED1 corresponding to the coarse delay CD1 shown in FIG. 26, a two-input NOR gate A, an inverter B and a two-input NAND gate C are added to each edge detector. They serve as a circuit for taking out an edge detected signal closest to an input CDMin of the coarse delay CD1 because a plurality of leading edges exist simultaneously in the coarse delay CD1 as the cycle of the clock CLKin becomes short. When an edge is detected, the corresponding NOR gate A forms an output signal low in level to deactivate the two-input NOR gates A and NAND gates C subsequent thereto so that their gates are closed through the inverter B. The NOR gates and inverters are used to propagate this non-operating signal. It is necessary to set a delay time thereat so as to be smaller than delay times of delay elements in respective stages of the coarse delay CD1. Thus, the delay elements of the coarse delay CD1 are made up of four CMOS inverters so as to serve for circuit simplification and are set to the relatively low time resolution as described above.

Each edge detector referred to above is inputted with the clock CLK through the NAND gate G1. When the common node COMMON is set to a fixed level or an enable signal ENABLE is taken low in level, the supply of the input pulse to the common node COMMON can be stopped Thus, the edge detector stops the above-described edge detecting operation and hence the detected signal prior to its stop is outputted through the latch circuit on the output side. Such clock control and output latch function are utilized for a low power consuming operation to be described later.

Figure 28:
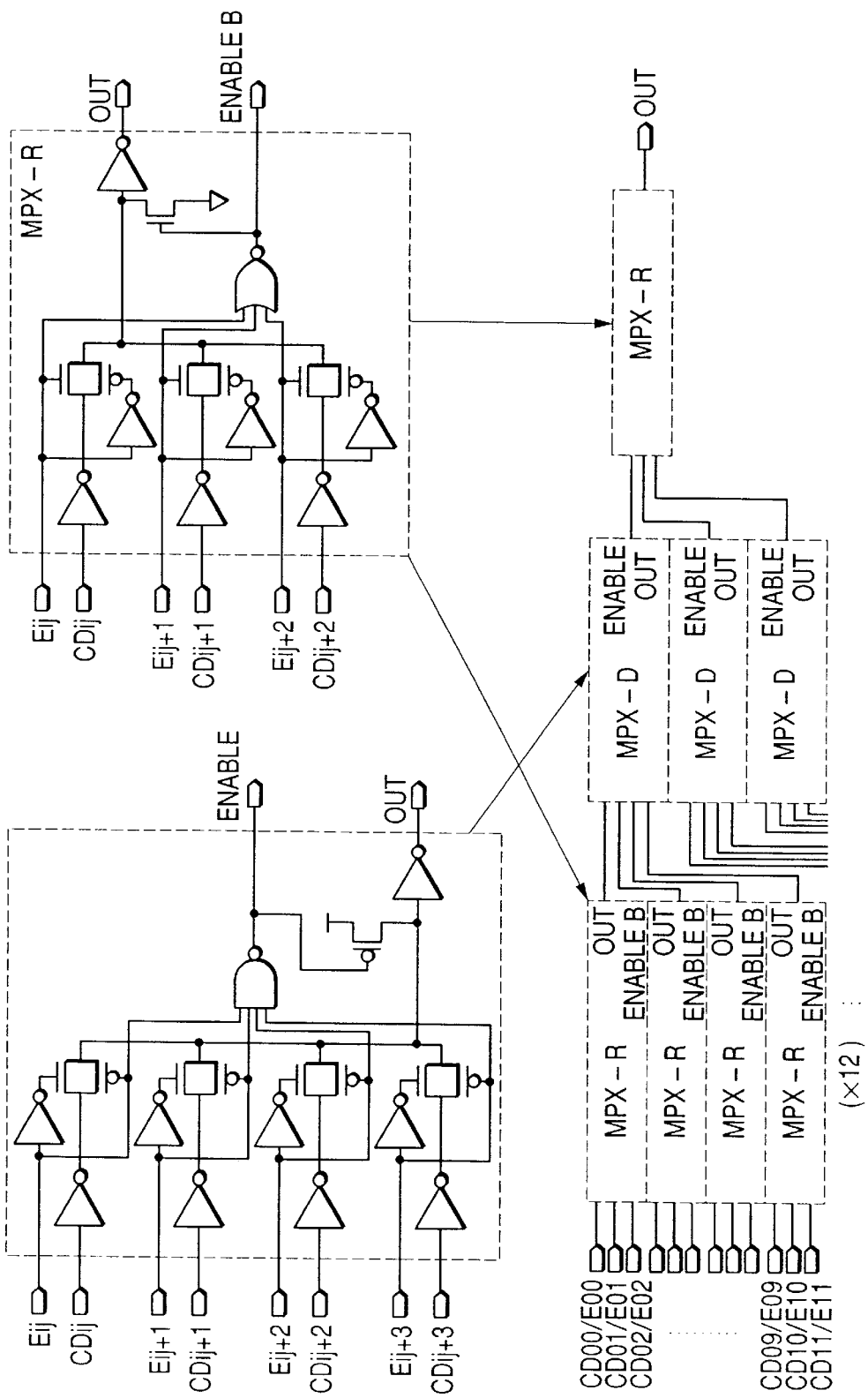
FIG. 28 is a circuit diagram depicting one embodiment of a multiplexer MPX2 shown in FIG. 23.

FIG. 28 is a circuit diagram showing one embodiment of a multiplexer MPX3. In the present embodiment, a lattice-like delay circuit SQUAD2 forms or produces 50 delay signals like CD00 through CD49 but selects 36 delay signals of these without having to use unstable pre-stage circuits. The multiplexers are connected in three stage in tree form so as to select one from delay outputs at 36 stages. Namely, the multiplexers MPX-R corresponding to the first and output stages are respectively configured as three-input circuits and multiplexers MPX-D each corresponding to a second stage are respectively configured as four-input circuits. Thus, the twelve three-input multiplexers MPX-D are provided. Delay signals CDij and edge detected signals Eij comprised of CD00/E00 through CD35/ED35 (not shown) are put into 12 pieces three by three and thereafter inputted to the multiplexers. Further, twelve output signals and enable signals are inputted to three four-input multiplexers MPX-D in parts respectively. Thereafter, three outputs and enable signals are outputted from their corresponding multiplexers MPX-D and one of them is outputted from the multiplexer MPX-R corresponding to the output stage.

Although CD00/E00~are illustrated as the input terminals of the multiplexer MPX3 in the same drawing, it should be noted that the delay stages CD00 through CD49 of the lattice-like delay circuit SQUAD1 and the edge detected outputs E00 through E49 do not coincide with one another.

Figure 29:
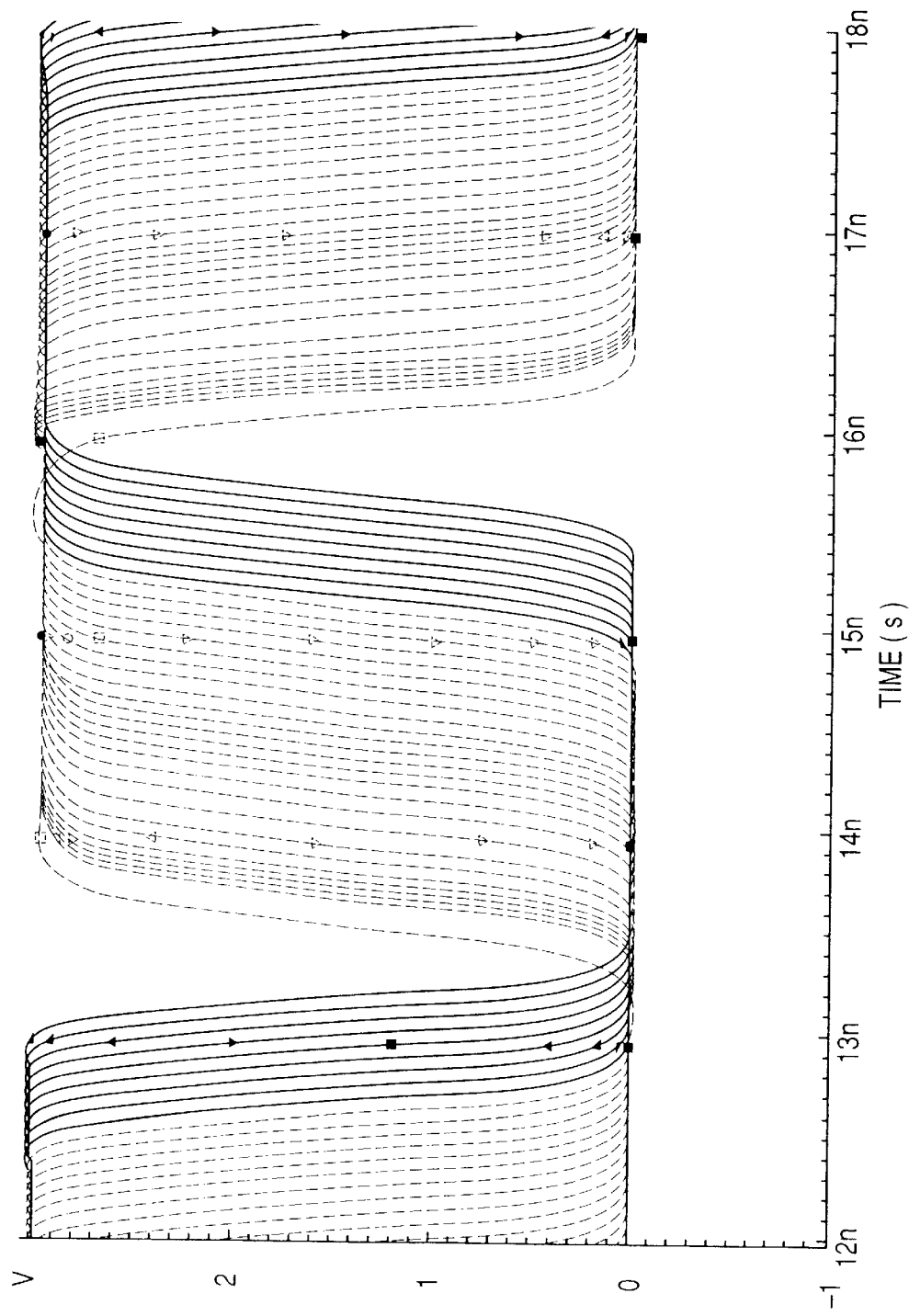
FIG. 29 is a waveform diagram for describing the operation of a lattice-like delay circuit employed in the present invention.

FIG. 29 is a waveform diagram for describing the operation of each lattice-like delay circuit employed in the present invention. It is understood from the drawing that if, for example, the leading edge of an output signal given in the center of a time base is taken as an illustrative example, then the leading edges of clock signals rise at equal intervals of about 50 psec except for the initial several rise lines. It is understood that in regard to the trailing edges of the output signals, the falling edges f the output signals on the rear-stage side exist on the front side of the time base at equal intervals of about 50 psec, whereas on the rear side of the time base, the trailing edges of the initial clock signals varies.

The dummy delay circuit DMDL2 is provided so as not to use delay signals corresponding to the initial several lines on the front side of the time base. A synchronous error δB can be reduced by using the above-described areas varied at equal intervals of about 50 psec.

Since the above-described lattice-like delay circuits SQUAD1 and SQUAD2 can obtain high time resolution by activating the NAND gates as so-called linear circuits as described above, they supply a relative large current to be used up as distinct from the normal CMOS circuit. However, since the clock cycle is measured once every plural cycles of the input clock pulse CLKin, the clock synchronous circuit can greatly reduce an operating current.

Figure 30:
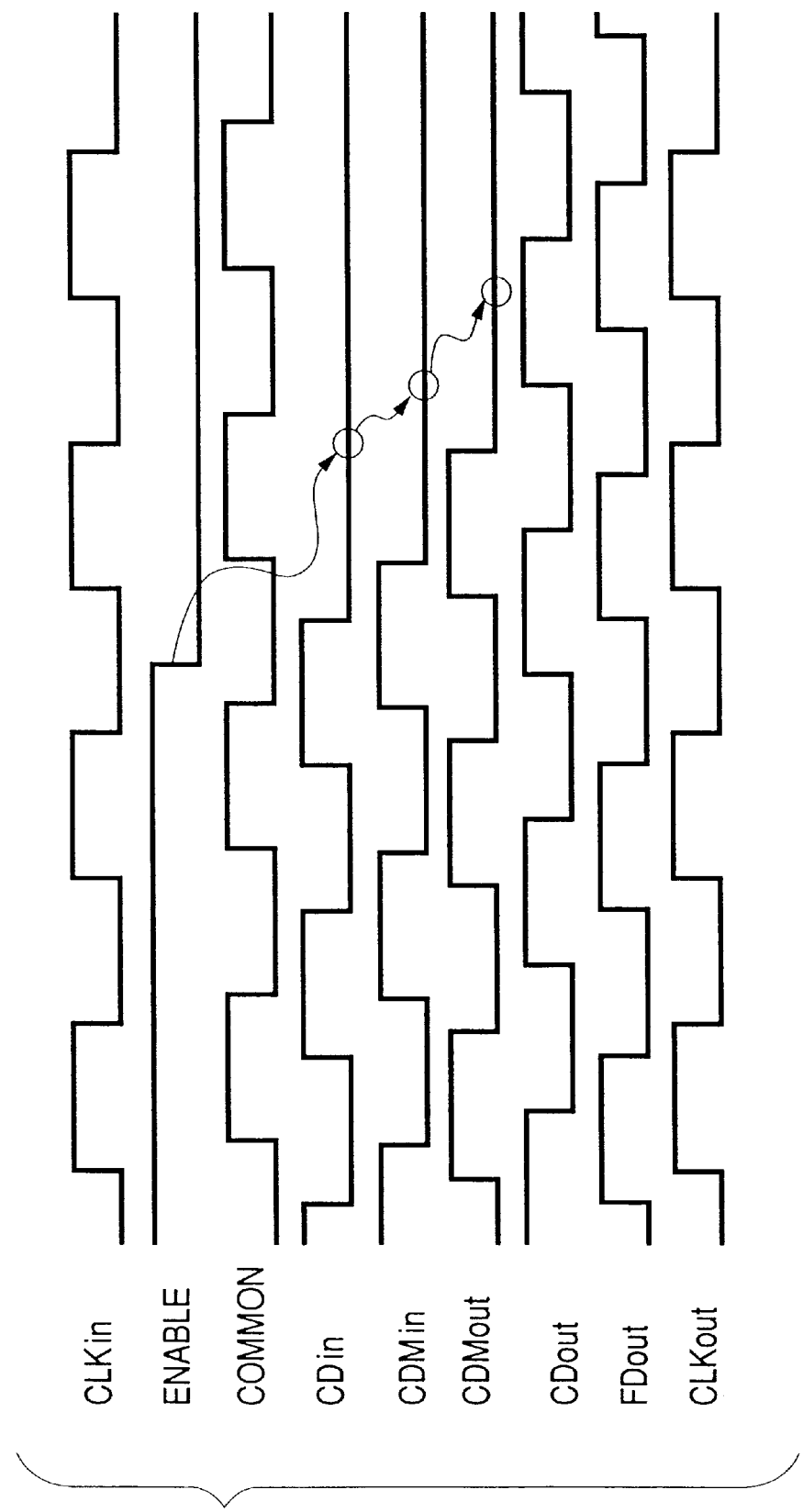
FIG. 30 is a timing chart for describing one example of an operation of a clock synchronous circuit according to the present invention.

The edge detector shown in FIG. 27 holds the immediately preceding edge detected signal therein. Thus, even if a clock cycle measuring block comprised of dummy delay circuits DMDL1 and DMDL2, coarse circuits or delays CD1 and CD2, edge detectors ED1 and ED2, a multiplexer MPX1 and a lattice-like delay circuit SQUAD1 stops operating by taking an enable signal ENABLE low in level as indicated by a timing chart shown in FIG. 30, and an input signal CDin of the coarse delay CD1, an input signal CDMin of the coarse delay CD2 and an output signal CDMout of the multiplexer MPX1 are set to a fixed state indicative of a low level, CDout can be produced by a coarse delay CD3 and a multiplexer MPX2, FDout can be formed by a lattice-like delay circuit SQUAD2 and a multiplexer MPX3 and an internal clock signal CLKout can be created through an output-stage driver DRV2, based on the result of measurements of clock cycles immediately before its stop.

Referring to FIG. 23, the enable signal ENABLE is formed by a timer Timer provided within a chip as in the case of selfrefresh of the known dynamic RAM. The enable signal ENABLE is brought to a high level in the proportions of once to plural cycles of a clock signal CLKin by the timer Timer to thereby activate the clock cycle measuring block comprised of the above-described dummy delay circuits DMDL1 and DMDL2, coarse delays CD1 and CD2, edge detectors ED2 and ED2, multiplexer MPX1 and lattice-like delay circuit SQUAD1 so that an edge detected signal is updated every time it is activated. Since the three clocks are necessary for the clock cycle measurement, it is necessary to bring the enable signal ENABLE to the high level during three cycles of the clock signal CLKin.

The cycle of the timer Timer is set so that a synchronous error δB produced due to a change in temperature of the chip or the like falls within an allowable range (100 psec or less). The cycle thereof can be set to more than or equal to about 100 msec. Owing to the intermittent operation of the clock cycle measuring block, power consumption can be prevented from increasing while the synchronous error δB is being maintained with high accuracy by using the above-described lattice-like delay circuit SQUAD large in power consumption.

As described above, the clock synchronous circuit according to the present embodiment needs three clock cycles even at the minimum for clock synchronization. However, when no synchronous information exist previously as is the case at power-on and synchronous information prior to the stop of the clock cycle measuring block exists and is effective, an internal clock signal CLKout synchronized in each clock cycle can be obtained.

Figure 31:
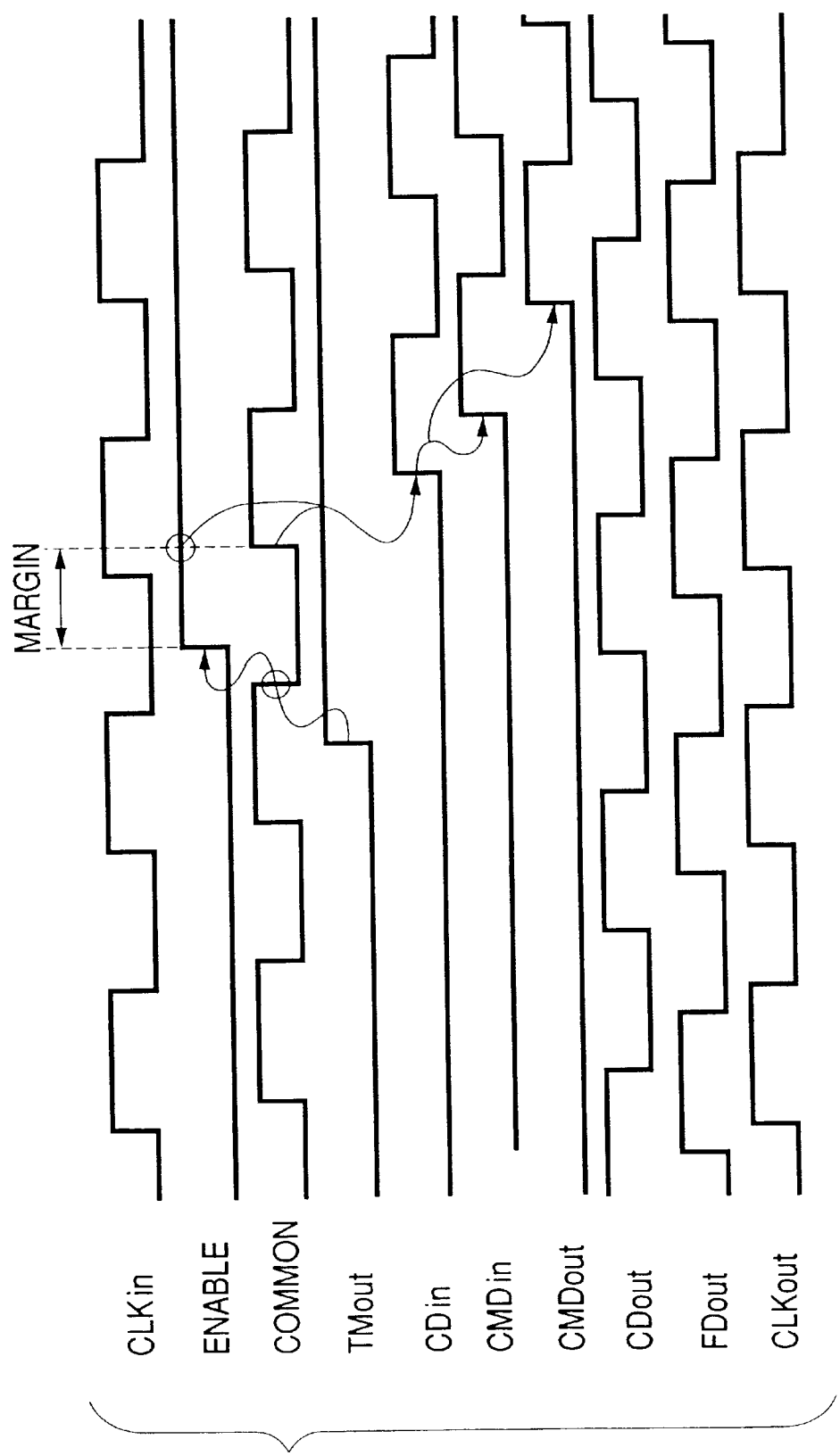
FIG. 31 is a timing chart for describing one example of another operation of the clock synchronous circuit according to the present invention.

FIG. 31 is a timing chart for describing one example of another operation of the clock synchronous circuit according to the present invention. The same drawing shows an example of a restart operation of a clock cycle measuring block by a timer Timer. When a timing signal TMout is outputted from the timer Timer, an enable signal Enable is changed from a low level to a high level according to the trailing edge at a common node COMMON without immediately generating the enable signal Enable. As a result, a constant time margin can be ensured until the common node COMMON changes from the low to high levels.

When the enable signal Enable is taken high in level, the clock cycle measuring block comprised of the above-described dummy delay circuits DMDL1 and DMDL2, coarse delays CD1 and CD2, edge detectors ED1 and ED2, multiplexer MPX1 and lattice-like delay circuit SQUAD1 is activated to delay the leading edges transitioned to the high level of the common node COMMON respectively. As a result, signals CDin, CDMin and CDMout are brought to high levels respectively so that a synchronous operation is performed by the edge detectors ED1 and ED2.

Figure 32:
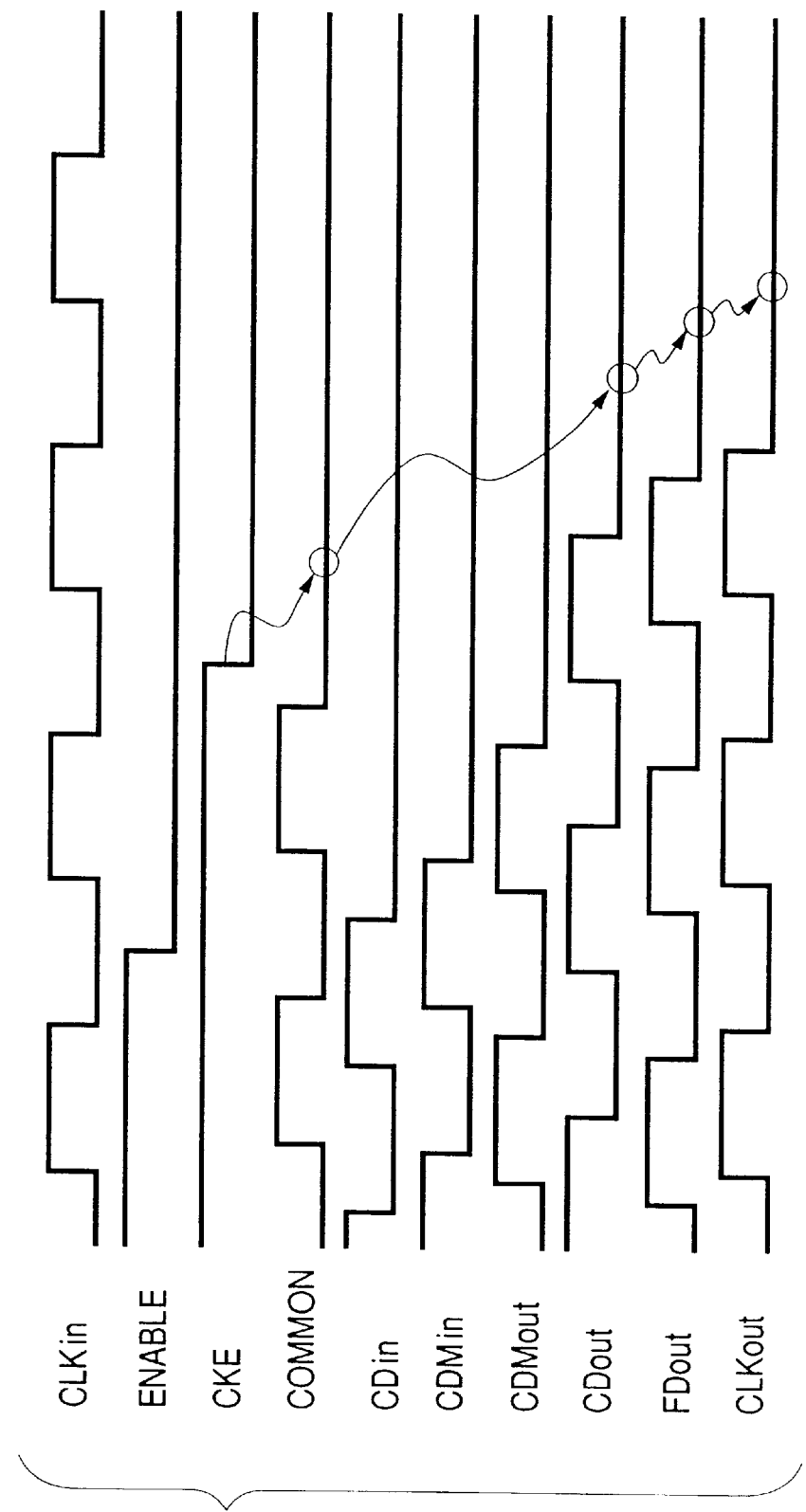
FIG. 32 is a timing chart for describing one example of a further operation of the clock synchronous circuit according to the present invention.

FIG. 32 is a timing chart for describing one example of a further operation of the clock synchronous circuit according to the present invention. The same drawing shows an example of the operation of transition to a power-down mode. When a clock enable signal CKE is taken low in level in the power-down mode, a driver DRV1 stops operating to thereby fix a common node COMMON corresponding to the output to a low level. Thus, a clock cycle measuring block comprised of the above-described dummy delay circuits DMDL1 and DMDL2, coarse delays CD1 and CD2, edge detectors ED1 and ED2, multiplexer MPX1 and lattice-like delay circuit SQUAD1, the output of the coarse delay CD3 and the output of the lattice-like delay circuit SQUAD2 for forming an internal clock signal CLKout are also fixed to a low level in association with the low level at the common node COMMON, respectively, whereby no substantial operation is performed. Namely, since the coarse delay CD3 and the lattice-like delay circuit SQUAD2 are made up of CMOS circuits respectively, they can stop the supply of an operating current according to the fixing of the common node COMMON corresponding to the input to the low level.

Figure 33:
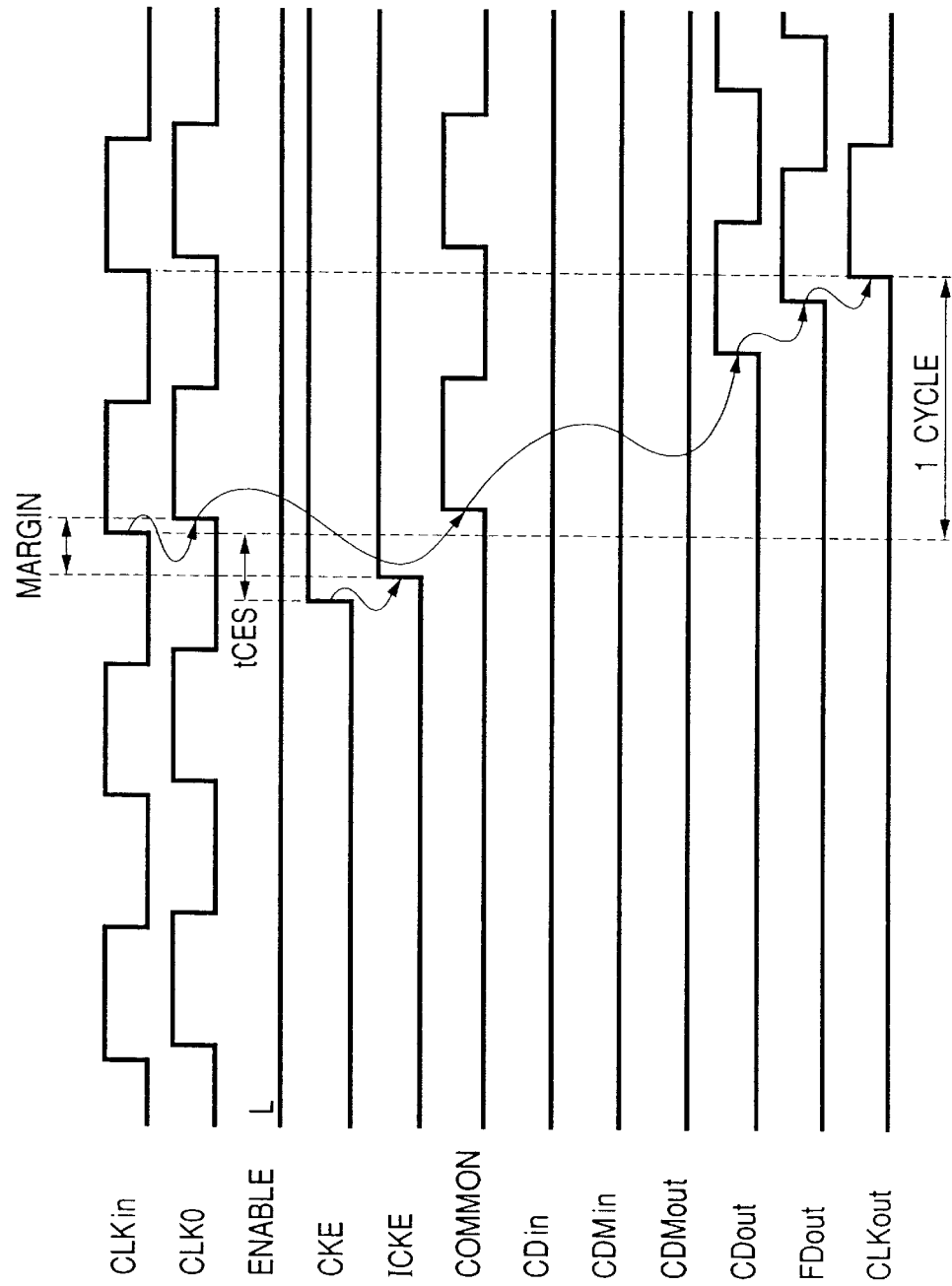
FIG. 33 is a timing chart for describing one example of a still further operation of the clock synchronous circuit according to the present invention.

FIG. 33 is a timing chart for describing one example of a still further operation of the clock synchronous circuit according to the present invention. The same drawing shows an example of a reset operation thereof from the power-down mode. Resetting of the clock synchronous circuit from the power-down mode is instructed by a high level of the clock enable signal CKE. Owing to the high level of the signal CKE, an internal signal ICKE is taken high in level to start the operation of a driver DRV1 An input clock signal CLKin supplied from an external terminal is inputted through the receiver RCV1. With the start of the operation of the driver DRV1, an output CLK0 produced from the receiver RCV1 is transmitted to the common node COMMON.

Since a multiplexer MPX2 selects one delay stage of a coarse delay CD3 according to a pre-stop detected signal held in a latch circuit of the edge detector ED1 supplied with the signal transmitted to the common node COMMON, an output signal CDout of the multiplexer MPX2 is delivered to the input of a lattice-like delay circuit SQUAD2 and the output of the lattice-like delay circuit SQUAD2 is outputted through a multiplexer MPX3 according to a pre-stop detected signal held in a latch circuit of the edge detector ED2. Thus, an internal clock signal CLKout can be formed with a delay of one cycle.

Figure 34:
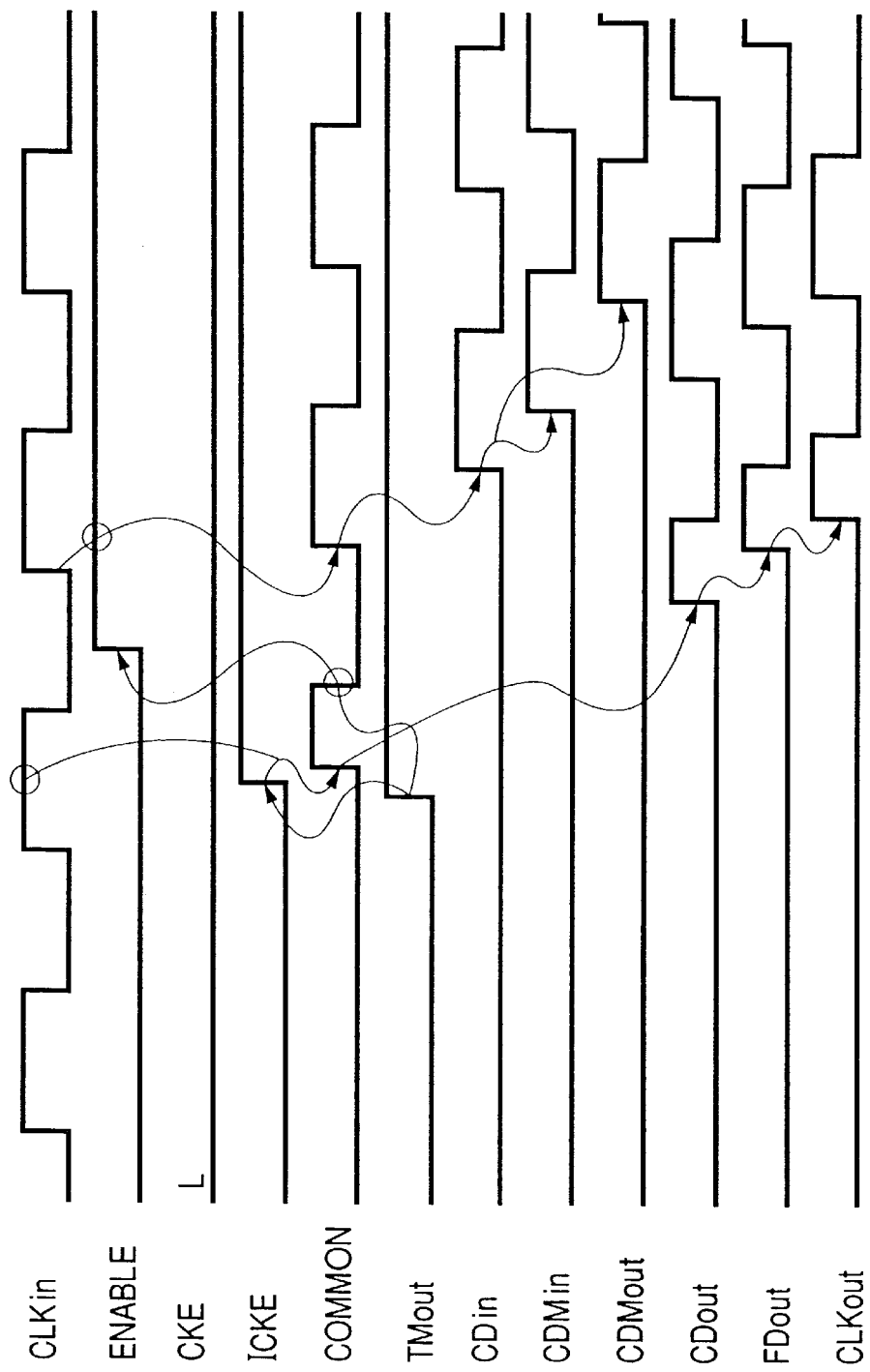
FIG. 34 is a timing chart for describing one example of a still further operation of the clock synchronous circuit according to the present invention.

FIG. 34 is a timing chart for describing one example of a still further operation of the clock synchronous circuit according to the present invention. The same drawing shows an example of a clock synchronizing operation thereof in the power-down mode. When a timer Timer forms an output signal TMout in the power-down mode in which the clock enable signal CKE is brought to a low level, the above-described internal signal ICKE is raised to a high level correspondingly. Thus, a driver DRV1 starts operating to change the common node COMMON in the same manner as described above in response to a clock signal CLKin supplied from an external terminal.

Along with this, the timer Timer changes an enable signal Enable to a high level in response to a change of the common node COMMON to a low level. Accordingly, an internal clock signal CLKout is generated with a delay of one cycle in the same manner as described above. Further, a clock cycle measuring block comprised of the above-described dummy delay circuits DMDL1 and DMDL2, coarse delays CD1 and CD2, edge detectors ED1 and ED2, multiplexer MPX1 and lattice-like delay circuit SQUAD1 starts operating in response to the high level of the enable signal Enable so as to spend or expend three cycles, followed by replacement of the edge detected signals held in the edge detectors ED1 and ED2 with new signals.

Thus, since synchronization between the clock signal CLKin periodically supplied from the external terminal and the internal clock signal CLKout is effected by the timer Timer even if the power-down mode in which the clock enable signal CKE is brought to the low level, is kept on over a relatively long time, an internal clock signal CLKout synchronized with a clock signal CLKin supplied from the external terminal after one cycle can be obtained upon resetting of the clock synchronous circuit from the power-down mode as shown in FIG. 33.

Figure 35:
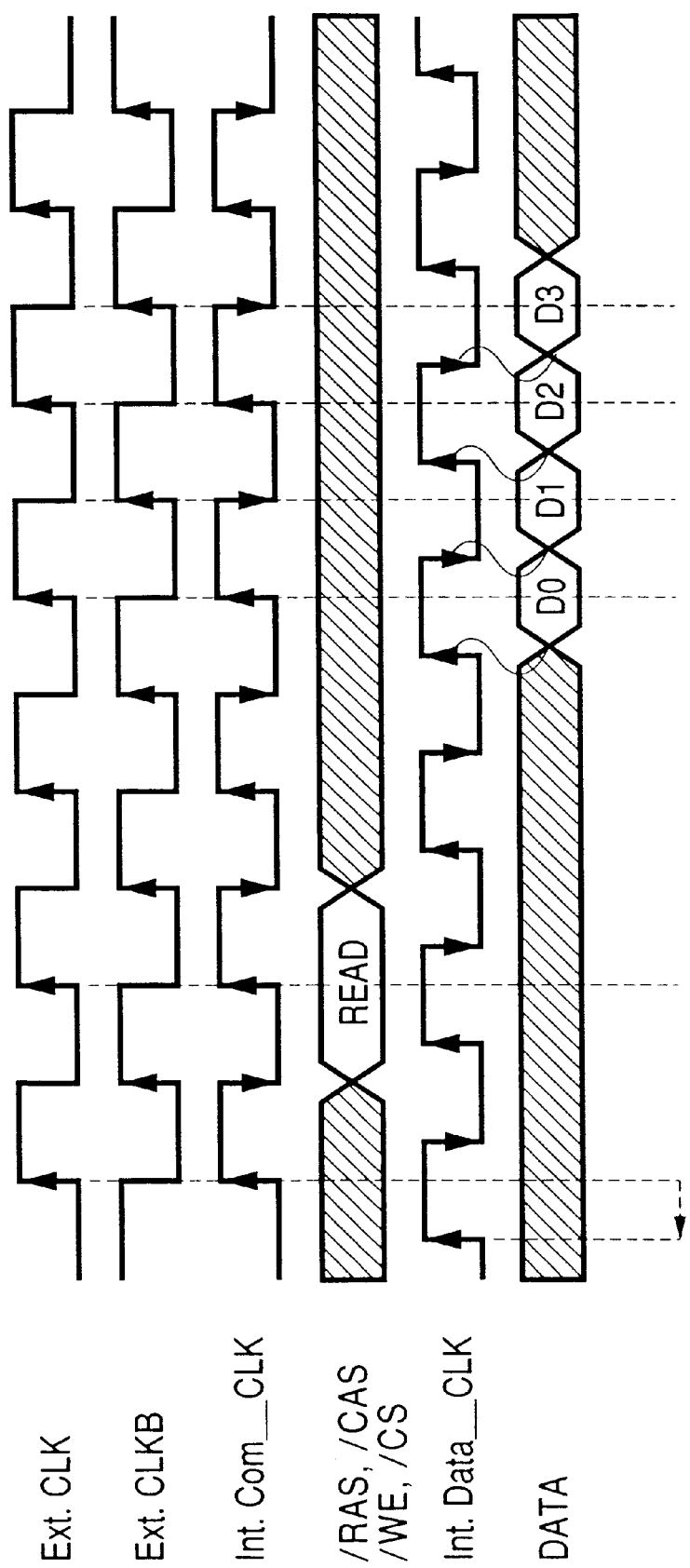
FIG. 35 is a timing chart for describing one example of the operation of the synchronous SDRAM shown in FIG. 20.

FIG. 35 is a waveform chart for describing a DDR of an SDRAM. In the same drawing, a waveform chart corresponding to double data rate (DDR) specifications is illustrated In the DDR specifications, an internal timing signal int.Com-CLK synchronized with a clock signal Ext.CLK supplied from an external terminal is formed or produced and thereafter delayed to thereby form or create an internal timing signal int.Data-CLK advanced by a predetermined time from the next clock. In this condition, data D0 through D3 or the like are outputted in timing at which the internal timing signal int.Data-CLK. rises and falls. Namely, the output signals D0 through D3 or the like are outputted in accordance with the rising and falling of the clock signal int.Data-CLK. Since the data can be outputted twice during one cycle of the clock signal in this configuration, a high-speed output operation can be implemented. Since read data are outputted in accordance with the internal timing signal int.Data-CLK preceding the external clock Ext.CLK, an unillustrated microprocessor or the like can capture the data D0 through D3 read from the SDRAM using the leading edges of the external clock Ext.CLK and its inverted external clock Ext.CLKB.

In the DDR specifications, a time margin is reduced with an increase in the frequency of the clock signal CLK since the data are outputted every half cycles of the clock signal CLK. Thus, high-accuracy synchronization is enabled by using the clock synchronous circuit according to the present embodiment. Using the above-described clock synchronous circuit low in time resolution becomes an essential condition for the SDRAM using a high-frequency clock signal CLK and set to the DDR specifications.

The application of the clock synchronous circuit according to the present invention to the dynamic RAM, i.e., a memory for transferring data on a protocol base, such as a Rambus or a sync Link for inputting and outputting data in synchronism with a clock signal similarly in addition to ones set to synchronous specifications, is advantageous in high accuracy and fast response or the like. Further, a reduction in power consumption can be also allowed by providing a command used to make a shift to the intermittent measurement of clock cycles by the timer Timer and activating the clock cycle measuring block until the above command is inputted upon power-on.

Figure 36:
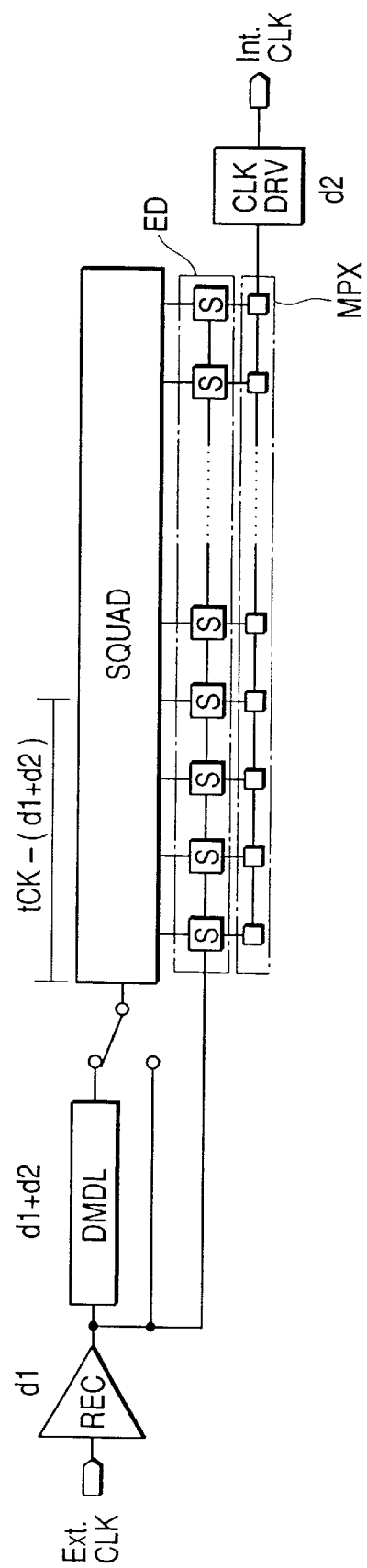
FIG. 36 is a block diagram showing another embodiment of a clock synchronous circuit according to the present invention.

FIG. 36 is a block diagram showing another embodiment of a clock synchronous circuit according to the present invention. In the present embodiment, a switch is provided on the input side of a lattice-like delay circuit SQUAD so as to perform switching between a signal transmitted through a dummy delay circuit DMDL and a signal transmitted through an input buffer (receiver) Rec, thereby inputting either one of the signals to the lattice-like delay circuit SQUAD. A plurality of switches S provided at delay outputs of respective stages of the lattice-like delay circuits SQUAD correspond to each edge detector referred to above. Further, circuits provided at their lower parts correspond to the multiplexer referred to above.

A delay time of the dummy delay circuit DMDL is set to a delay time d1 +d2 corresponding to a delay time d1 at the input buffer Rec and a delay time d2 at an output buffer CLKDRV. Thus, upon clock cycle measurements, the switch is flipped to the dummy delay circuit DMDL so that a delay time like tCK−(d1+d2) is set by the lattice-like delay circuit SQUAD. After such a delay time has been set, the switch is changed to another so that the output signal of the input buffer Rec is outputted through the lattice-like delay circuit SQUAD. As a result, the above-described delay time tCK−(d1+d2) is set by the lattice-like delay circuit SQUAD. Since the delay time of d1+d2 is produced by the input buffer Rec and the output driver CLKDRV, an internal clock signal int.CLK delayed just by one clock cycle tCK with respect to a clock signal ext.CLK supplied from an external terminal can be formed.

Since the internal clock signal int.CLK results in a signal delayed by the delay time of the dummy delay circuit DMDL upon the clock cycle measurements in the present embodiment although the circuit can be simplified, it is necessary to add the function of invalidating its output. When it is desired to expand or increase a clock frequency capable of synchronization, the coarse delay CD1, the edge detector ED1 and the multiplexer MPX1 employed in the embodiment shown in FIG. 23 may be added.

Figure 37:
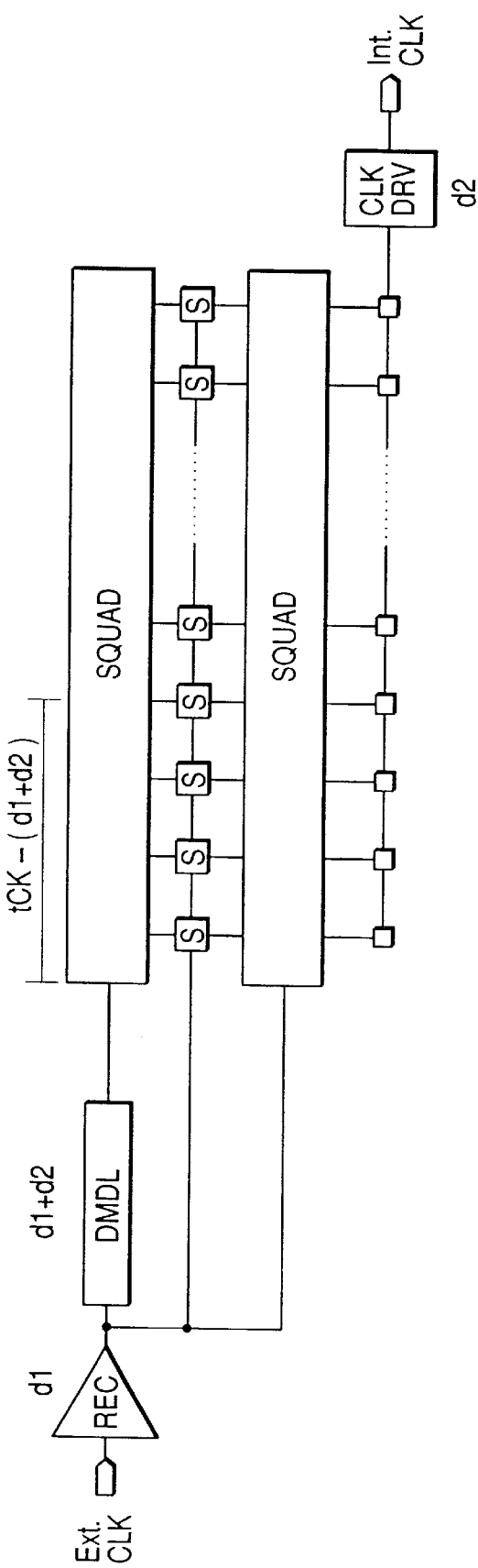
FIG. 37 is a block diagram illustrating a further embodiment of a clock synchronous circuit according to the present invention.

FIG. 37 is a block diagram showing a further embodiment of a clock synchronous circuit according to the present invention. In the present embodiment, two lattice-like delay circuits SQUAD for both the measurement and output are used. Namely, the present embodiment is equivalent to one in which the coarse delays CD1 through CD3 and the like employed in the embodiment shown in FIG. 23 are omitted. When it is desired to achieve a reduction in power consumption by the measuring lattice-like delay circuit SQUAD under such a configuration, the above-described dummy delay circuit DMDL may be intermittently activated as in the embodiment referred to above.

Operations and effects of the embodiments shown in FIG. 23 and the like are as follows:

(1) An advantageous effect can be obtained in that a lattice-like delay circuit is configured wherein a first coarse delay for propagating a clock pulse with relatively low time resolution, a first edge detector and a first multiplexer are used to form or create a clock signal delayed by one clock in association with the relatively low time resolution, a second coarse delay having relatively high time resolution, a second edge detector and a second multiplexer are used to correct an error of the first coarse delay, included in the above signal, and a plurality of logic gate means each of which is provided with impedance means for making coupling between two input signals inputted between first and second input terminals, said impedance means being provided as a second delay circuit having high time resolution as the above second coarse delay, and each of which forms or produces an output signal obtained by inverting an input signal, are used so as to be placed in lattice form in first and second signal transfer directions, whereby a high-accuracy and quick-response clock synchronous circuit can be obtained by using the lattice-like delay circuit wherein the respective logic gate means extending from the first to the last as seen in the first signal transfer direction are respectively successively supplied with input clock signals with delays as seen in the first signal transfer direction, and output signals are obtained from output terminals of the plurality of logic gate means placed in at least the final stage or the immediately preceding stage as seen in the second signal transfer direction and arranged in the first signal transfer direction (2) Another advantageous effect can be obtained in that the first coarse delay comprises three delay circuits corresponding to first Nos. 1, 2 and 3, the first multiplexer comprises two multiplexers corresponding to first Nos. 1 and 2, and the second coarse delay comprises two delay circuits corresponding to first Nos. 1 and 2 and they are used for the measurement of clocks and the formation of output clocks, whereby a clock cycle measuring operation for synchronization can be executed while output clock signals are being formed.

(3) A further advantageous effect can be obtained in that in the lattice-like delay circuit that constitutes the second coarse delay, an input signal supplied to a first input terminal of a logic gate means placed in the final stage as seen in the first signal transfer direction and placed in a first stage as seen in the second signal transfer direction is supplied to a second input terminal of a logic gate means placed in the first as seen in the first signal transfer direction and placed in a third stage as seen in the second signal transfer direction, and an output signal of a logic gate means placed in the first as seen in the first and second signal transfer directions is commonly supplied to first and second input terminals of a logic gate means placed in the first as seen in the first signal transfer direction and placed in a second stage as seen in the second signal transfer direction, whereby the shortest time as seen in the second signal transfer direction can be equally delayed by the number of stages extending in the first signal transfer direction, thereby making it possible to achieve small amounts of delay with efficiency (4) A still further advantageous effect can be obtained in that the first Nos. 1 to 3 delay circuits can obtain a desired delay time in a simple configuration by connecting CMOS inverters in tandem and can be set to a low power consumption mode by bringing an input signal to a fixed level.

(5) A still further advantageous effect can be obtained in that the input of the first No. 2 delay circuit is supplied with an input signal through a first dummy delay circuit, and an output signal of the first dummy delay circuit is supplied to the input of the first No. 1 delay circuit through a second dummy delay circuit for performing timing so that a delay signal outputted from the second coarse delay is set to reach a predetermined number of stages or later, whereby the lattice-like delay circuit can be activated in a stable operating or active region.

(6) A still further advantageous effect can be obtained in that the first and second edge detectors are provided with latch circuits at their outputs respectively and are intermittently brought to an operating state and a non-operating state according to a predetermined control signal, and they are caused to output detected signals held in the latch circuits upon the non-operating state, whereby power to be used up by a clock cycle measuring unit can be greatly reduced.

(7) A still further advantageous effect can be obtained in that a clock signal supplied from an external terminal is inputted through an input buffer and a delay circuit having a coarse delay corresponding to an output-stage driver and an output signal transmitted through the second multiplexer is outputted through the output-stage driver, whereby an internal clock signal synchronized inclusive of delays of the input circuit and driver can be formed.

(8) A still further advantageous effect can be obtained in that owing to the generation of the above-described predetermined control signal in a predetermined cycle by a timer, power consumption can be greatly reduced while clock cycles are being automatically measured with necessary time intervals.

(9) A still further advantageous effect can be obtained in that a delay signal formed through a dummy delay circuit for delaying a clock signal supplied from an external terminal with a delay time corresponding to delay times of an input buffer and the input buffer and output-stage driver is supplied to a lattice-like delay circuit, delay signals at respective stages of the lattice-like delay circuit and a one-clock delayed clock edge of a clock pulse inputted through an input buffer are compared to detect time coincidence between both edges, after which the result of detection is held in a latch, and the input of the lattice-like delay circuit is supplied with the output of the input buffer to output a clock signal through the output-stage driver, whereby a high-accuracy synchronizing operation corresponding to time resolution of the lattice-like delay circuit can be performed in a simple configuration.

(10) A still further advantageous effect can be obtained in that a delay signal formed through a dummy delay circuit for delaying a clock signal supplied from an external terminal with a delay time corresponding to delay times of an input buffer and the input buffer and output-stage driver is supplied to a lattice-like delay circuit, delay signals at respective stages of the lattice-like delay circuit and a one-clock delayed clock edge of a clock pulse signal inputted through an input buffer are compared to detect time coincidence between both edges, the input of another lattice-like delay circuit identical in configuration to the above is supplied with the output of the input buffer, and a multiplexer is controlled based on the result of detection to take out a delay signal from another lattice-like delay circuit and output a clock signal through the output-stage driver, whereby a high-accuracy output clock signal corresponding to the time resolution of the lattice-like delay circuit can be obtained while a clock cycle measurement and an output operation are being performed simultaneously.

(11) A still further advantageous effect can be obtained in that a clock synchronous circuit using the lattice-like delay circuit described in the paragraphs (1) through (8) is used in a semiconductor integrated circuit device provided with a memory array having memory cells matrix-placed at points of intersection of a plurality of word lines and a plurality of bit lines and its selection circuit; a clock synchronous circuit for receiving control and clock signals supplied from external terminals and generating an internal clock signal corresponding to the clock signal in accordance with each control signal referred to above; and an input/output circuit for outputting a read signal of the corresponding memory cell in accordance with the synchronized internal clock signal, thereby making it possible to implement on-standby less power consumption and high-speed reset while permitting a memory operation at a high frequency.

Although the invention, which has been made above by the present inventors, has been described specifically based on the illustrated embodiments, the invention of the present application is not necessarily limited to the aforementioned embodiments. It is needless to say that many changes can be made to the invention within the scope not departing from the substance thereof. Since, for example, a large-scale integrated circuit provided with clock synchronous circuits every circuit blocks provides mutual synchronization between internal clock signals every circuit blocks, an input buffer for receiving therein clock signals supplied from an external terminal can be omitted. In the embodiment shown in FIG. 1, the same delay circuit may be configured so as to be separately used in a clock cycle measurement and a clock signal output operation on a time basis as in the embodiment shown in FIG. 18. The clock synchronous circuit according to the present invention can be used in a microprocessor or various semiconductor integrated circuit devices which constitute peripheral circuits, as well as in a memory such as an SDRAM or the like.

Effects obtained by a typical one of the inventions disclosed in the present application will be described in brief as follows: A lattice-like delay circuit is configured wherein a first delay circuit or coarse delay for propagating a clock pulse with relatively low time resolution, a first edge detector and a first multiplexer are used to form or create a clock signal delayed by one clock in association with the relatively low time resolution, a second coarse delay having relatively high time resolution, a second edge detector and a second multiplexer are used to correct an error of the first coarse delay, included in the above signal, and a plurality of logic gate means each of which is provided with impedance means for making coupling between two input signals inputted between first and second input terminals as a second delay circuit having high time resolution as the above second coarse delay, and each of which produces an output signal obtained by inverting the input signals, are used so as to be placed in lattice form in first and second signal transfer directions. The lattice-like delay circuit is used wherein the respective logic gate means extending from the first to the last as seen in the first signal transfer direction are respectively successively supplied with input clock signals with their delays as seen in the first signal transfer direction, and output signals are obtained from output terminals of the plurality of logic gate means placed in at least the final stage or the immediately preceding stage as seen in the second signal transfer direction and arranged in the first signal transfer direction. Thus, a high-accuracy and quick-response clock synchronous circuit can be obtained.

We claim:

1. A clock synchronous circuit comprising:

a first delay circuit which receives therein a first clock signal delayed from a reference clock signal and propagates the first clock signal with a first time resolution;

a first edge detector which compares an edge of a delay signal of each stage corresponding to the time resolution of said first delay circuit with a first clock edge of the reference clock signal to thereby detect time coincidence between both edges;

a first multiplexer controlled by a signal detected by said first edge detector so as to output a delay signal which has a timing of a corresponding delay stage of said first delay circuit;

a second delay circuit which receives therein a second clock signal obtained through said first multiplexer and propagates the second clock signal with a second time resolution higher in accuracy than the first time resolution;

a second edge detector which compares an edge of a delay signal of each stage corresponding to the time resolution of said second delay circuit with a second clock edge of the reference clock signal to thereby detect time coincidence between both edges; and a second multiplexer controlled by a signal detected by said second edge detector so as to output a delay signal which has a timing of a corresponding delay stage of said second delay circuit;

whereby an internal clock signal synchronized with the reference clock signal or a signal corresponding to the reference clock signal is formed based on a third clock signal obtained through said second multiplexer, said second delay circuit including, a plurality of logic gate circuits which are respectively provided with impedance elements for respectively coupling two input signals inputted to first and second input terminals, said each impedance element being provided between the first and second input terminals, and respectively form output signals according to the input signals supplied to the first and second terminals, said plurality of logic gate circuits being capable of being disposed in lattice form in a first signal transfer direction and a second signal transfer direction, and wherein the first input terminal of a logic gate circuit KL provided as a Kth other than the first as seen in the first signal transfer direction and disposed in an Lth stage as seen in the second signal transfer direction is supplied with a signal outputted from a logic gate circuit provided as the same Kth as seen in the first signal transfer direction and defined as an L−1th stage as seen in the second signal transfer direction or an input clock signal in the case of the first-stage logic gate circuit, the second input terminal of the logic gate circuit KL is supplied with an input signal supplied to a first input terminal of a logic gate circuit provided as the immediately preceding K−1th as seen in the first signal transfer direction and defined as the same Lth stage as seen in the second signal transfer direction;

a second input terminal of a logic gate circuit provided as the first as seen in the first signal transfer direction and defined as an Lth as seen in the second signal transfer direction is supplied with an input signal supplied to a first input terminal of a logic gate circuit defined as the final stage as seen in the first signal transfer direction, said input signal being in phase with an input signal supplied to a first input terminal of a logic gate circuit at a stage preceding the final stage as seen in the second signal transfer direction;

the first and second input terminals of the logic gate circuits defined as the first stage as seen in the second signal transfer direction and provided as the first as seen in the first signal transfer direction are respectively supplied with a clock signal corresponding to the second clock signal, and the input clock signals supplied to the first input terminals of the respective logic gate circuits extending from the second to the last as seen in the first signal transfer are delayed in order in the first signal transfer direction; and output signals are respectively obtained from output terminals of a plurality of logic gate circuits placed in at least a plural-numbered stage as seen in the second signal transfer direction and arranged in the first signal transfer direction.

2. A clock synchronous circuit according to claim 1, further comprising, third and fourth delay circuits similar in circuit configuration to said first delay circuit;

a third multiplexer provided in association with said fourth delay circuit; and a fifth delay circuit similar in circuit configuration to said second delay circuit, and wherein said first multiplexer selects a delay signal of each stage of said third delay circuit in accordance with the detected signal of said first edge detector, said third multiplexer selects a delay signal of each stage of said fourth delay circuit in accordance with the detected signal of said first edge detector, said second delay circuit has an input which is supplied with the output signal of said first multiplexer to form a delay signal supplied to said second edge detector, and said second multiplexer selects a delay signal of each stage of said fifth delay circuit in accordance with the detected signal of said second edge detector.

3. A clock synchronous circuit according to claim 1 or 2, wherein a delay circuit, which constitutes said second delay circuit, is constructed so that an input signal supplied to a first input terminal of a logic gate circuit placed in the final stage as seen in the first signal transfer direction and placed in a first stage as seen in the second signal transfer direction is supplied to a second input terminal of a logic gate circuit placed in the first as seen in the first signal transfer direction and placed in a third stage as seen in the second signal transfer direction, and an output signal of a logic gate circuit placed in the first as seen in the first and second signal transfer directions is commonly supplied to first and second input terminals of a logic gate circuit placed in the first as seen in the first signal transfer direction and placed in a second stage as seen in the second signal transfer direction.

4. A clock synchronous circuit according to claim 2, wherein said third and fourth delay circuits comprise CMOS inverter circuits connected in tandem respectively.

5. A clock synchronous circuit according to claim 2, wherein the input of said third delay circuit is supplied with an input signal through a first dummy delay circuit, and an output signal of the first dummy delay circuit is supplied to the input of said first delay circuit through a second dummy delay circuit for performing timing so that a delay signal outputted from said second delay circuit is set to reach a predetermined number of stages or later.

6. A clock synchronous circuit according to claim 2, wherein said first and second edge detectors include latch circuits provided at their outputs respectively and are intermittently brought to an operating state according to a predetermined control signal, and said first and second edge detectors respectively output detected signals held in the latch circuits upon a non-operating state.

7. A clock synchronous circuit according to claim 1 or 2 wherein the reference clock signal is inputted through an input buffer for receiving an external clock signal supplied from an external terminal, and an output signal transmitted through said second multiplexer is outputted through an output-stage driver, and the external clock signal and the output signal of the output-stage driver are synchronized with each other.

8. A clock synchronous circuit according to claim 7, wherein said predetermined control signal is generated in a predetermined cycle by a timer.

9. A clock synchronous circuit comprising:

an input buffer which receives a clock signal supplied from an external terminal;

a first delay circuit which delays the clock signal transmitted through said input buffer with a delay time corresponding to delay time intervals of said input buffer and an output-stage driver;

a switch circuit which selectively transfers an output signal of said first delay circuit or an output signal of said input buffer;

a second delay circuit which delays a signal inputted through said switch circuit; and a selection circuit having a latch function of comparing delay signals at respective stages of said second delay circuit with a one-clock delayed clock edge of a clock signal inputted through said input buffer to thereby detect time coincidence between both edges and holding the result of detection and for outputting the delay signals at the respective stages according to the result of detection, and wherein said switch circuit is connected to said first delay circuit side so that a detected signal is formed by said selection circuit, said switch circuit is switched to said input buffer side to output each delay signal of said second delay circuit through said output-stage driver according to the result of detection held in said latch function, and said second delay circuit including, a plurality of logic gate circuits which are respectively provided with impedance elements for respectively coupling two input signals inputted to first and second input terminals, said each impedance element being provided between the first and second input terminals, and respectively form output signals according to the input signals supplied to the first and second terminals, said plurality of logic gate circuits being capable of being disposed in lattice form in a first signal transfer direction and a second signal transfer direction, and wherein the first input terminal of a logic gate circuit KL provided as a Kth other than the first as seen in the first signal transfer direction and disposed in an Lth stage as seen in the second signal transfer direction is supplied with a signal outputted from a logic gate circuit provided as the same Kth as seen in the first signal transfer direction and defined as an L−1th stage as seen in the second signal transfer direction or an input clock signal in the case of the first-stage logic gate circuit, the second input terminal of the logic gate circuit KL is supplied with an input signal supplied to a first input terminal of a logic gate circuit provided as the immediately preceding K−1th as seen in the first signal transfer direction and defined as the same Lth stage as seen in the second signal transfer direction;

a second input terminal of a logic gate circuit provided as the first as seen in the first signal transfer direction and defined as an Lth as seen in the second signal transfer direction is supplied with an input signal supplied to a first input terminal of a logic gate circuit defined as the final stage as seen in the first signal transfer direction, said input signal being in phase with an input signal supplied to a first input terminal of a logic gate circuit at a stage preceding the final stage as seen in the second signal transfer direction;

the first and second input terminals of the logic gate circuits defined as the first stage as seen in the second signal transfer direction and provided as the first as seen in the first signal transfer direction are respectively supplied with a clock signal corresponding to the input signal outputted through said switch circuit, and the input clock signals supplied to the first input terminals of the respective logic gate circuits extending from the second to the last as seen in the first signal transfer direction are delayed in order in the first signal transfer direction; and output signals are respectively obtained from output terminals of a plurality of logic gate circuits placed in at least a plural-numbered stage as seen in the second signal transfer direction and arranged in the first signal transfer direction.

10. A clock synchronous circuit comprising:

an input buffer which receives a clock signal supplied from an external terminal;

a first delay circuit which delays the clock signal transmitted through said input buffer with a delay time corresponding to delay time intervals of said input buffer and an output-stage driver;

a second delay circuit which receives an output signal of said first delay circuit therein and delaying the output signal;

an edge detector which compares delay signals at respective stages of said second delay circuit with a one-clock delayed clock edge of a clock signal inputted through said input buffer to thereby detect time coincidence between both edges; and a third delay circuit which receives therein the clock signal inputted through said input buffer and delay the clock signal, whereby the delay signal of said third delay circuit is outputted through said output-stage driver according to the result of detection by said edge detector, said second and third delay circuits each including, a plurality of logic gate circuits which are respectively provided with impedance elements for respectively coupling two input signals inputted to first and second input terminals, said each impedance element being provided between the first and second input terminals, and respectively form output signals according to the input signals supplied to the first and second terminals, said plurality of logic gate circuits being capable of being disposed in lattice form in a first signal transfer direction and a second signal transfer direction, and wherein the first input terminal of a logic gate circuit KL provided as a Kth other than the first as seen in the first signal transfer direction and disposed in an Lth stage as seen in the second signal transfer direction is supplied with a signal outputted from a logic gate circuit provided as the same Kth as seen in the first signal transfer direction and defined as an L−1th stage as seen in the second signal transfer direction or an input clock signal in the case of the first-stage logic gate circuit, the second input terminal of the logic gate circuit KL is supplied with an input signal supplied to a first input terminal of a logic gate circuit provided as the immediately preceding K−1th as seen in the first signal transfer direction and defined as the same Lth stage as seen in the second signal transfer direction;

a second input terminal of a logic gate circuit provided as the first as seen in the first signal transfer direction and defined as an Lth as seen in the second signal transfer direction is supplied with an input signal supplied to a first input terminal of a logic gate circuit defined as the final stage as seen in the first signal transfer direction, said input signal being in phase with an input signal supplied to a first input terminal of a logic gate circuit at a stage preceding the final stage as seen in the second signal transfer direction;

clock signals supplied to first input terminals of respective logic gate circuits defined as a first stage as seen in the second signal transfer direction and extending from the first to the last as seen in the first signal transfer direction are delayed in order in the first signal transfer direction; and output signals are respectively obtained from output terminals of a plurality of logic gate circuits placed in at least a plural-numbered stage as seen in the second signal transfer direction and arranged in the first signal transfer direction.

11. A semiconductor integrated circuit device comprising:

a memory array in which memory cells are placed in matrix form at points of intersection of a plurality of word lines and a plurality of bit lines;

an address selection circuit which selects a corresponding memory cell in said memory array;

a clock synchronous circuit which generates an internal clock signal corresponding to an external clock signal supplied from an external terminal; and an output circuit which outputs a read signal of said memory cell in accordance with the internal clock signal generated by said clock synchronous circuit, said clock synchronous circuit including a first delay circuit which receives therein a first clock signal delayed from a reference clock signal corresponding to the external clock signal and propagates the first clock signal with a first time resolution;

a first edge detector which compares an edge of a delay signal of each stage corresponding to the time resolution of said first delay circuit with a first clock edge of the reference clock signal to thereby detect time coincidence between both edges;

a first multiplexer controlled by a signal detected by said first edge detector so as to output a delay signal which has a timing of a corresponding delay stage of said first delay circuit;

a second delay circuit which receives therein a second clock signal obtained through said first multiplexer and propagates the second clock signal with a second time resolution higher in accuracy than the first time resolution;

a second edge detector which compares an edge of a delay signal of each stage corresponding to the time resolution of said second delay circuit with a second clock edge of the reference clock signal to thereby detect time coincidence between both edges; and a second multiplexer controlled by a signal detected by said second edge detector so as to output a delay signal which has a timing of a corresponding delay stage of said second delay circuit;

whereby the internal clock signal synchronized with the external clock signal is formed based on a third clock signal obtained through said second multiplexer, said second delay circuit including, a plurality of logic gate circuits which are respectively provided with impedance elements for respectively coupling two input signals inputted to first and second input terminals, said each impedance element being provided between the first and second input terminals, and respectively form output signals according to the input signals supplied to the first and second terminals, said plurality of logic gate circuits being capable of being disposed in lattice form in a first signal transfer direction and a second signal transfer direction, and wherein the first input terminal of a logic gate circuit KL provided as a Kth other than the first as seen in the first signal transfer direction and disposed in an Lth stage as seen in the second signal transfer direction is supplied with a signal outputted from a logic gate circuit provided as the same Kth as seen in the first signal transfer direction and defined as an L−1th stage as seen in the second signal transfer direction or an input clock signal in the case of the first-stage logic gate circuit, the second input terminal of the logic gate circuit KL is supplied with an input signal supplied to a first input terminal of a logic gate circuit provided as the immediately preceding K−1th as seen in the first signal transfer direction and defined as the same Lth stage as seen in the second signal transfer direction;

a second input terminal of a logic gate circuit provided as the first as seen in the first signal transfer direction and defined as an Lth as seen in the second signal transfer direction is supplied with an input signal supplied to a first input terminal of a logic gate circuit defined as the final stage as seen in the first signal transfer direction, said input signal being in phase with an input signal supplied to a first input terminal of a logic gate circuit at a stage preceding the final stage as seen in the second signal transfer direction;

the input clock signals supplied to the first input terminals of the respective logic gate circuits placed in a first stage as seen in the second signal transfer direction and extending from the first to the last as seen in the first signal transfer direction are delayed in order in the first signal transfer direction; and output signals are respectively obtained from output terminals of a plurality of logic gate circuits placed in at least a plural-numbered stage as seen in the second signal transfer direction and arranged in the first signal transfer direction.

12. A semiconductor integrated circuit device according to claim 11, further comprising, third and fourth delay circuits similar in circuit configuration to said first delay circuit;

a third multiplexer provided so as to correspond to said third delay circuit; and a fifth delay circuit similar in circuit configuration to said second delay circuit, and wherein said first multiplexer selects a delay signal of each stage of said third delay circuit in accordance with the detected signal of said first edge detector, said third multiplexer selects a delay signal of each stage of said fourth delay circuit in accordance with the detected signal of said first edge detector, said second delay circuit has an input which is supplied with the output signal of said first multiplexer to form a delay signal supplied to said second edge detector, and said second multiplexer selects a delay signal of each stage of said fifth delay circuit in accordance with the detected signal of said second edge detector.

13. A semiconductor integrated circuit device according to claim 12, wherein the input of said third delay circuit is supplied with an input signal through a first dummy delay circuit, and an output signal of said first dummy delay circuit is supplied to the input of said first delay circuit through a second dummy delay circuit which performs timing so that a delay signal outputted from said second delay circuit is set to reach a predetermined number of stages or later.

14. A semiconductor integrated circuit device according to claim 13, wherein the reference clock signal is inputted through an input buffer for receiving an external clock signal supplied from an external terminal, said first dummy delay circuit is brought to an operating state or a non-operating state according to a clock enable signal and fixes an output signal to either one of levels upon the non-operating state, and said first and second edge detectors are provided with latch circuits at their outputs and hold detected results therein, respectively.

15. A semiconductor integrated circuit device according to claim 13 or 14, wherein said first dummy delay circuit and said first and second edge detectors are respectively intermittently brought to an operating state according to a control signal generated in a predetermined cycle by a timer incorporated in said semiconductor integrated circuit device.

16. A semiconductor integrated circuit device according to claim 10 or 11, wherein the input of data from or output data to the outside is performed according to both the leading and trailing edges of the internal clock signal produced by said clock synchronous circuit.

* * * * *